United States Patent
Nagasaka et al.

(10) Patent No.: US 7,907,253 B2
(45) Date of Patent: Mar. 15, 2011

(54) EXPOSURE APPARATUS, EXPOSURE METHOD, AND METHOD FOR PRODUCING DEVICE

(75) Inventors: Hiroyuki Nagasaka, Kumagaya (JP); Soichi Owa, Kumagaya (JP); Yasugumi Nishii, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/826,465

(22) Filed: Jul. 16, 2007

(65) Prior Publication Data

US 2007/0258065 A1    Nov. 8, 2007

Related U.S. Application Data

(60) Division of application No. 11/211,749, filed on Aug. 26, 2005, now Pat. No. 7,268,854, which is a continuation of application No. PCT/JP2004/002295, filed on Feb. 26, 2004.

(30) Foreign Application Priority Data

Feb. 26, 2003  (JP) .................... 2003-049365
Apr. 15, 2003  (JP) .................... 2003-110748
Sep. 11, 2003  (JP) .................... 2003-320100

(51) Int. Cl.
*G03B 27/54* (2006.01)
*G03B 27/52* (2006.01)
(52) U.S. Cl. ......................... 355/53; 355/30
(58) Field of Classification Search .......... 355/30, 355/53, 67; 250/548
See application file for complete search history.

(56) References Cited

U.S. PATENT DOCUMENTS

| | | | |
|---|---|---|---|
| 3,573,975 | A | 4/1971 | Dhaka et al. |
| 3,648,587 | A | 3/1972 | Stevens |
| 4,346,164 | A | 8/1982 | Tabarelli et al. |
| 4,390,273 | A | 6/1983 | Loebach et al. |
| 4,396,705 | A | 8/1983 | Akeyama et al. |
| 4,480,910 | A | 11/1984 | Takanashi et al. |
| 4,509,852 | A | 4/1985 | Tabarelli et al. |
| 5,040,020 | A | 8/1991 | Rauschenbach et al. |
| 5,078,832 | A | 1/1992 | Tanaka |
| 5,121,256 | A | 6/1992 | Corle et al. |

(Continued)

FOREIGN PATENT DOCUMENTS

DE           206 607        2/1984

(Continued)

OTHER PUBLICATIONS

Emerging Lithographic Technologies VI, Proceedings of SPIE, vol. 4688 (2002), "Semiconductor Foundry, Lithography, and Partners", B.J. Lin, pp. 11-24.

(Continued)

*Primary Examiner* — Hung Henry Nguyen
(74) *Attorney, Agent, or Firm* — Oliff & Berridge, PLC

(57) ABSTRACT

An exposure apparatus exposes a substrate by projecting an image of a predetermined pattern through a liquid onto the substrate. The exposure apparatus includes a projection optical system which projects the image of the pattern onto the substrate, a liquid supply mechanism which supplies the liquid onto the substrate to form a liquid immersion area on a part of the substrate including a projection area of the projection optical system, and a liquid recovery mechanism which recovers the liquid on the substrate simultaneously at a plurality of positions. The liquid recovery mechanism recovers the liquid with a recovery force which differs depending on the position for recovering the liquid.

59 Claims, 19 Drawing Sheets

U.S. PATENT DOCUMENTS

| | | | |
|---|---|---|---|
| 5,528,118 | A | 6/1996 | Lee |
| 5,610,683 | A | 3/1997 | Takahashi |
| 5,623,853 | A | 4/1997 | Novak et al. |
| 5,715,039 | A | 2/1998 | Fukuda et al. |
| 5,744,924 | A | 4/1998 | Lee |
| 5,815,246 | A | 9/1998 | Sperling et al. |
| 5,825,043 | A | 10/1998 | Suwa |
| 5,874,820 | A | 2/1999 | Lee |
| 5,900,354 | A | 5/1999 | Batchelder |
| 5,942,871 | A | 8/1999 | Lee |
| 5,962,079 | A | 10/1999 | Koberstein et al. |
| 5,969,441 | A | 10/1999 | Loopstra et al. |
| 5,982,128 | A | 11/1999 | Lee |
| 6,008,500 | A | 12/1999 | Lee |
| 6,020,710 | A | 2/2000 | Lee |
| 6,049,186 | A | 4/2000 | Lee |
| 6,087,797 | A | 7/2000 | Lee |
| 6,150,787 | A | 11/2000 | Lee |
| 6,151,105 | A | 11/2000 | Lee |
| 6,175,404 | B1 | 1/2001 | Lee |
| 6,188,195 | B1 | 2/2001 | Lee |
| 6,191,429 | B1 | 2/2001 | Suwa |
| 6,208,407 | B1 | 3/2001 | Loopstra |
| 6,236,634 | B1 | 5/2001 | Lee et al. |
| 6,246,202 | B1 | 6/2001 | Lee |
| 6,262,796 | B1 | 7/2001 | Loopstra et al. |
| 6,271,640 | B1 | 8/2001 | Lee |
| 6,281,654 | B1 | 8/2001 | Lee |
| 6,310,680 | B1 | 10/2001 | Taniguchi |
| 6,316,901 | B2 | 11/2001 | Lee |
| 6,341,007 | B1 | 1/2002 | Nishi et al. |
| 6,396,562 | B1 | 5/2002 | Iwanaga |
| 6,400,441 | B1 | 6/2002 | Nishi et al. |
| 6,488,040 | B1 | 12/2002 | de Larios et al. |
| 6,549,269 | B1 | 4/2003 | Nishi et al. |
| 6,560,032 | B2 | 5/2003 | Hatano |
| 6,590,634 | B1 | 7/2003 | Nishi et al. |
| 6,600,547 | B2 | 7/2003 | Watson et al. |
| 6,603,130 | B1 | 8/2003 | Bisschops et al. |
| 6,633,365 | B2 | 10/2003 | Suenaga |
| 6,638,439 | B2 | 10/2003 | Shimomura |
| 6,683,433 | B2 | 1/2004 | Lee |
| 6,707,529 | B1 | 3/2004 | Aoki et al. |
| 6,747,732 | B1 | 6/2004 | Lee |
| 6,781,670 | B2 | 8/2004 | Krautschik |
| 6,788,377 | B1 | 9/2004 | Ogawa et al. |
| 6,788,477 | B2 | 9/2004 | Lin |
| 6,798,491 | B2 | 9/2004 | Nishi et al. |
| 6,841,965 | B2 | 1/2005 | Lee |
| 6,867,844 | B2 | 3/2005 | Vogel et al. |
| 6,927,840 | B2 | 8/2005 | Lee |
| 6,988,327 | B2 | 1/2006 | Garcia et al. |
| 6,989,647 | B1 | 1/2006 | Lee |
| 7,119,874 | B2 | 10/2006 | Cox et al. |
| 7,177,008 | B2 | 2/2007 | Nishi et al. |
| 7,256,869 | B2 | 8/2007 | Nishi |
| 7,268,854 | B2 | 9/2007 | Nagasaka |
| 7,365,513 | B1 | 4/2008 | Lee |
| 7,394,521 | B2 | 7/2008 | Van Santen et al. |
| 7,453,550 | B2 | 11/2008 | Nagasaka et al. |
| 7,535,550 | B2 | 5/2009 | Nagasaka |
| 7,542,128 | B2 | 6/2009 | Nagasaka et al. |
| 2001/0019250 | A1 | 9/2001 | Lee |
| 2001/0030522 | A1 | 10/2001 | Lee |
| 2002/0014403 | A1 | 2/2002 | Hoshino |
| 2002/0017889 | A1 | 2/2002 | Lee |
| 2002/0020821 | A1 | 2/2002 | Van Santen et al. |
| 2002/0041377 | A1 | 4/2002 | Hagiwara et al. |
| 2002/0163629 | A1 | 11/2002 | Switkes et al. |
| 2003/0008224 | A1 | 1/2003 | Fujita et al. |
| 2003/0030916 | A1 | 2/2003 | Suenaga |
| 2003/0091767 | A1 | 5/2003 | Podhajny |
| 2003/0123040 | A1 | 7/2003 | Almogy |
| 2003/0174408 | A1 | 9/2003 | Rostalski et al. |
| 2004/0000627 | A1 | 1/2004 | Schuster |
| 2004/0021844 | A1 | 2/2004 | Suenaga |
| 2004/0032575 | A1 | 2/2004 | Nishi et al. |
| 2004/0075895 | A1 | 4/2004 | Lin |
| 2004/0095085 | A1 | 5/2004 | Lee |
| 2004/0109237 | A1 | 6/2004 | Epple et al. |
| 2004/0114117 | A1 | 6/2004 | Bleeker |
| 2004/0118184 | A1 | 6/2004 | Violette |
| 2004/0119954 | A1 | 6/2004 | Kawashima et al. |
| 2004/0125351 | A1 | 7/2004 | Krautschik |
| 2004/0136494 | A1 | 7/2004 | Lof et al. |
| 2004/0160582 | A1 | 8/2004 | Lof et al. |
| 2004/0165159 | A1 | 8/2004 | Lof et al. |
| 2004/0169834 | A1 | 9/2004 | Richter et al. |
| 2004/0169924 | A1 | 9/2004 | Flagello et al. |
| 2004/0180294 | A1 | 9/2004 | Baba-Ali et al. |
| 2004/0180299 | A1 | 9/2004 | Rolland et al. |
| 2004/0207824 | A1 | 10/2004 | Lof et al. |
| 2004/0211920 | A1 | 10/2004 | Maria Derksen et al. |
| 2004/0224265 | A1 | 11/2004 | Endo et al. |
| 2004/0224525 | A1 | 11/2004 | Endo et al. |
| 2004/0227923 | A1 | 11/2004 | Flagello et al. |
| 2004/0233405 | A1 | 11/2004 | Kato et al. |
| 2004/0233407 | A1 | 11/2004 | Nishi et al. |
| 2004/0253547 | A1 | 12/2004 | Endo et al. |
| 2004/0253548 | A1 | 12/2004 | Endo et al. |
| 2004/0257544 | A1 | 12/2004 | Vogel et al. |
| 2004/0259008 | A1 | 12/2004 | Endo et al. |
| 2004/0259040 | A1 | 12/2004 | Endo et al. |
| 2004/0263808 | A1 | 12/2004 | Sewell |
| 2004/0263809 | A1 | 12/2004 | Nakano |
| 2005/0002004 | A1 | 1/2005 | Kolesnychenko et al. |
| 2005/0002009 | A1 | 1/2005 | Lee |
| 2005/0007569 | A1 | 1/2005 | Streefkerk et al. |
| 2005/0007570 | A1 | 1/2005 | Streefkerk et al. |
| 2005/0018155 | A1 | 1/2005 | Cox et al. |
| 2005/0018156 | A1 | 1/2005 | Mulkens et al. |
| 2005/0024609 | A1 | 2/2005 | De Smit et al. |
| 2005/0030497 | A1 | 2/2005 | Nakamura |
| 2005/0030498 | A1 | 2/2005 | Mulkens |
| 2005/0030506 | A1 | 2/2005 | Schuster |
| 2005/0036121 | A1 | 2/2005 | Hoogendam et al. |
| 2005/0036183 | A1 | 2/2005 | Yeo et al. |
| 2005/0036184 | A1 | 2/2005 | Yeo et al. |
| 2005/0036213 | A1 | 2/2005 | Mann et al. |
| 2005/0037269 | A1 | 2/2005 | Levinson |
| 2005/0042554 | A1 | 2/2005 | Dierichs et al. |
| 2005/0046934 | A1 | 3/2005 | Ho et al. |
| 2005/0048223 | A1 | 3/2005 | Pawloski et al. |
| 2005/0068639 | A1 | 3/2005 | Pierrat et al. |
| 2005/0073670 | A1 | 4/2005 | Carroll |
| 2005/0084794 | A1 | 4/2005 | Meagley et al. |
| 2005/0094116 | A1 | 5/2005 | Flagello et al. |
| 2005/0100745 | A1 | 5/2005 | Lin et al. |
| 2005/0110973 | A1 | 5/2005 | Streefkerk et al. |
| 2005/0117224 | A1 | 6/2005 | Shafer et al. |
| 2005/0122497 | A1 | 6/2005 | Lyons et al. |
| 2005/0132914 | A1 | 6/2005 | Mulkens et al. |
| 2005/0134815 | A1 | 6/2005 | Van Santen et al. |
| 2005/0134817 | A1 | 6/2005 | Nakamura |
| 2005/0141098 | A1 | 6/2005 | Schuster |
| 2005/0145265 | A1 | 7/2005 | Ravkin et al. |
| 2005/0145803 | A1 | 7/2005 | Hakey et al. |
| 2005/0146694 | A1 | 7/2005 | Tokita |
| 2005/0146695 | A1 | 7/2005 | Kawakami |
| 2005/0147920 | A1 | 7/2005 | Lin et al. |
| 2005/0153424 | A1 | 7/2005 | Coon |
| 2005/0158673 | A1 | 7/2005 | Hakey et al. |
| 2005/0164502 | A1 | 7/2005 | Deng et al. |
| 2005/0174549 | A1 | 8/2005 | Duineveld et al. |
| 2005/0175776 | A1 | 8/2005 | Streefkerk et al. |
| 2005/0175940 | A1 | 8/2005 | Dierichs |
| 2005/0185269 | A1 | 8/2005 | Epple et al. |
| 2005/0190435 | A1 | 9/2005 | Shafer et al. |
| 2005/0190455 | A1 | 9/2005 | Rostalski et al. |
| 2005/0205108 | A1 | 9/2005 | Chang et al. |
| 2005/0213061 | A1 | 9/2005 | Hakey et al. |
| 2005/0213072 | A1 | 9/2005 | Schenker et al. |
| 2005/0217135 | A1 | 10/2005 | O'Donnell et al. |
| 2005/0217137 | A1 | 10/2005 | Smith et al. |
| 2005/0217703 | A1 | 10/2005 | O'Donnell |
| 2005/0219481 | A1 | 10/2005 | Cox et al. |
| 2005/0219482 | A1 | 10/2005 | Baselmans et al. |

| | | | |
|---|---|---|---|
| 2005/0219499 A1 | 10/2005 | Zaal et al. | |
| 2005/0225737 A1 | 10/2005 | Weissenrieder et al. | |
| 2005/0231694 A1 | 10/2005 | Kolesnychenko et al. | |
| 2005/0237501 A1 | 10/2005 | Furukawa et al. | |
| 2005/0237504 A1 | 10/2005 | Nagasaka et al. | |
| 2005/0243292 A1 | 11/2005 | Baselmans et al. | |
| 2005/0245005 A1 | 11/2005 | Benson | |
| 2005/0253090 A1 | 11/2005 | Gau et al. | |
| 2005/0259232 A1 | 11/2005 | Streefkerk et al. | |
| 2005/0259233 A1 | 11/2005 | Streefkerk et al. | |
| 2005/0259234 A1 | 11/2005 | Hirukawa et al. | |
| 2005/0263068 A1 | 12/2005 | Hoogendam et al. | |
| 2005/0264778 A1 | 12/2005 | Lof et al. | |
| 2005/0270505 A1 | 12/2005 | Smith | |
| 2006/0038968 A1 | 2/2006 | Kemper et al. | |
| 2006/0114435 A1 | 6/2006 | Hazelton et al. | |
| 2006/0146306 A1 | 7/2006 | Nagasaka et al. | |
| 2006/0209286 A1 | 9/2006 | Nakano | |
| 2007/0109515 A1 | 5/2007 | Nishi | |
| 2008/0180053 A1 | 7/2008 | Lee | |

FOREIGN PATENT DOCUMENTS

| | | |
|---|---|---|
| DE | 221 563 A1 | 4/1985 |
| DE | 224 448 A1 | 7/1985 |
| DE | 242 880 A1 | 2/1987 |
| EP | 0 023 231 | 2/1981 |
| EP | 0 060 729 A2 | 9/1982 |
| EP | 0 418 427 A2 | 3/1991 |
| EP | 1 039 551 A2 | 9/2000 |
| FR | 2 474 708 | 7/1981 |
| JP | A 57-153433 | 9/1982 |
| JP | A-57-153433 | 9/1982 |
| JP | A-58-202448 | 11/1983 |
| JP | A-59-19912 | 2/1984 |
| JP | U-61-094342 | 6/1986 |
| JP | A 62-65326 | 3/1987 |
| JP | A-62-121417 | 6/1987 |
| JP | A-63-157419 | 6/1988 |
| JP | A-4-305915 | 10/1992 |
| JP | A-4-305917 | 10/1992 |
| JP | A-5-62877 | 3/1993 |
| JP | A-6-124873 | 5/1994 |
| JP | A 6-124873 | 5/1994 |
| JP | A-6-188169 | 7/1994 |
| JP | A-7-132262 | 5/1995 |
| JP | A 07-220990 | 8/1995 |
| JP | A-8-166475 | 6/1996 |
| JP | A-8-316125 | 11/1996 |
| JP | A-8-330224 | 12/1996 |
| JP | A-10-163099 | 6/1998 |
| JP | A-10-22866 I | 8/1998 |
| JP | A-10-214783 | 8/1998 |
| JP | A 10-255319 | 9/1998 |
| JP | A-10-255319 | 9/1998 |
| JP | A 10-303114 | 11/1998 |
| JP | A 10-340846 | 12/1998 |
| JP | A 11-176727 | 7/1999 |
| JP | WO9/49504 * | 9/1999 |
| JP | A 2000-58436 | 2/2000 |
| JP | A-2000-505958 | 5/2000 |
| JP | A-2002-014005 | 1/2002 |
| WO | WO 98/28665 | 7/1998 |
| WO | WO 99/49504 A1 | 9/1999 |
| WO | WO 01/27978 A1 | 4/2001 |
| WO | WO 01/84241 A1 | 11/2001 |
| WO | WO 02/13194 A1 | 2/2002 |
| WO | WO 02/63664 | 8/2002 |
| WO | WO 02/091078 | 11/2002 |
| WO | WO 02/091078 A1 | 11/2002 |
| WO | WO 03/039766 A1 | 5/2003 |
| WO | WO 03/040830 A2 | 5/2003 |
| WO | WO 03/77036 A1 | 9/2003 |
| WO | WO 03/077037 A1 | 9/2003 |
| WO | WO 2004/019128 A2 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2005/001432 A2 | 1/2005 |
| WO | WO 2005/001572 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/050324 A2 | 6/2005 |
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A2 | 6/2005 |
| WO | WO 2005/059654 A1 | 6/2005 |
| WO | WO 2005/062128 A2 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/081030 A1 | 9/2005 |
| WO | WO 2005/081067 A1 | 9/2005 |
| WO | WO 2005/098504 A1 | 10/2005 |
| WO | WO 2005/098505 A1 | 10/2005 |
| WO | WO 2005/098506 A1 | 10/2005 |
| WO | WO 2005/106589 A1 | 11/2005 |
| WO | WO 2005/111689 A2 | 11/2005 |
| WO | WO 2005/111722 A2 | 11/2005 |
| WO | WO 2005/119325 A2 | 12/2005 |
| WO | WO 2005/119369 A1 | 12/2005 |

OTHER PUBLICATIONS

Optical Microlithography XV, Proceedings of SPIE, vol. 4691 (2002), "Resolution Enhancement of 157 nm Lithography by Liquid Immersion", M. Switkes et al., pp. 459-465.

J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.

Nikon Corporation, 3$^{rd}$ 157 nm symposium, Sep. 4, 2002, "Nikon F2 Exposure Tool", Soichi Owa et al., 25 pages (slides 1-25).

Nikon Corporation, Immersion Lithography Workshop, Dec. 11, 2002, 24 pages (slides 1-24).

Optical Microlithography XVI, Proceedings of SPIE vol. 5040 (2003), "Immersion lithography; its potential performance and issues", Soichi OWA et al., pp. 724-733.

Nikon Corporation, Immersion Workshop, Jan. 27, 2004, "Update on 193 nm immersion exposure tool", S. Owa et al., 38 pages (slides 1-38).

Nikon Corporation, Litho Forum, Jan. 28, 2004, "Update on 193 nm immersion exposure tool", S. Owa et al., 51 pages (slides 1-51).

Nikon Corporation, NGL Workshop, Jul. 10, 2003, :Potential performance and feasibility of immersion lithography, Soichi Owa et al., 33 pages, slides 1-33.

Mar. 28, 2007 Written Opinion for corresponding Singapore Patent Application No. 200505591-8.

Jul. 25, 2007 Supplemental European Search Report for corresponding European Patent Application No. 04714910.9.

Mar. 27, 2006 Office Action in U.S. Appl. No. 11/211,749.

Nov. 20, 2006 Office Action in U.S. Appl. No. 11/366,746.

Aug. 8, 2007 Office Action in U.S. Appl. No. 11/366,746.

Apr. 23, 2008 Office Action in U.S. Appl. No. 11/366,746.

Dec. 30, 2008 Office Action in U.S. Appl. No. 11/366,746.

Sep. 4, 2009 Office Action in U.S. Appl. No. 11/366,746.

May 22, 2009 Office Action in U.S. Appl. No. 11/502,393.

Jan. 3, 2008 Office Action in U.S. Appl. No. 11/826,622.

Dec. 17, 2007 Office Action in U.S. Appl. No. 11/826,624.

Sep. 24, 2008 Office Action in U.S. Appl. No. 11/826,943.

Jun. 16, 2009 Office Action in U.S. Appl. No. 11/826,943.

Oct. 7, 2009 Notice of Allowance in U.S. Appl. No. 11/826,943.

Sep. 29, 2008 Office Action in U.S. Appl. No. 11/879,510.

Jun. 26, 2009 Office Action in U.S. Appl. No. 11/879,510.

Nov. 2, 2007 Chinese Office Action in Corresponding Chinese Application No. 200480005148.9 and its English Translation.

Oct. 9, 2009 Chinese Office Action in Corresponding Chinese Application No. 2008101609539 and its English Translation.

Oct. 30, 2009 Chinese Office Action in Corresponding Chinese Application No. 200810160954.3 and its English Translation.

Mar. 2, 2007 Chinese Office Action in Corresponding Chinese Application No. 200480005148.9 and its English Translation.

Emerging Lithographic Technologies VI, Proceedings of SPIE, vol. 4688 (2002), "Semiconductor Foundry, Lithography, and Partners", B.J. Lin, pp. 11-24.

Optical Microlithography XV, Proceedings of SPIE, vol. 4691 (2002), "Resolution Enhancement of 157 nm Lithography by Liquid Immersion", M. Switkes et al., pp. 459-465.

J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.

Nikon Corporation, 3$^{rd}$ 157 nm symposium, Sep. 4, 2002, "Nikon F2 Exposure Tool", Soichi Owa et al., 25 pages (slides 1-25).

Nikon Corporation, Immersion Lithography Workshop, Dec. 11, 2002, 24 pages (slides 1-24).

Optical Microlithography XVI, Proceedings of SPIE vol. 5040 (2003), "Immersion lithography; its potential performance and issues", Soichi OWA et al., pp. 724-733.

Nikon Corporation, Immersion Workshop, Jan. 27, 2004, "Update on 193 nm immersion exposure tool", S. Owa et al., 38 pages (slides 1-38).

Nikon Corporation, Litho Forum, Jan. 28, 2004, "Update on 193 nm immersion exposure tool", S. Owa et al., 51 pages (slides 1-51).

Nikon Corporation, NGL Workshop, Jul. 10, 2003, :Potential performance and feasibility of immersion lithography, Soichi Owa et al., 33 pages, slides 1-33.

"Depth-of-Focus Enhancement Using High Refractive Index Lauer on the Imaging Layer", IBM Technical Disclosure Bulletin, vol, 27, No. 11, Apr. 1985, p. 6521.

A. Suzuki, "Lithography Advances on Multiple Fronts", Eedesign, EE Times, Jan. 5, 2004.

B. Lin, "The k3 coefficient in nonparaxial 1/NA scaling equations for resolution, depth of focus, and immersion lithography," J. Microlith., Microfab., Microsyst. 1(1):7-12 (2002).

B. W. Smith et al., "Immersion Optical Lithography at 193nm", Future Fab International, vol. 15, Jul. 11, 2003.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths to Subhalf-Micrometer Optical Lithography", SPIE vol. 922, Optical/Laser Microlithography (1988), pp. 256-269.

G. Owen et al., "1/8 mm Optical Lithography", J. Vac. Sci. Technol. B., vol. 10, No. 6, Nov./Dec. 1992, pp. 3032-3036.

G.W.W. Stevens, "Reduction of Waste Resulting from Mask Defects", Solid State Technology, Aug. 1978, vol. 21 008, pp. 68-72.

H. Hata, "The Development of Immersion Exposure Tools", Litho Forum, International SEMATECH, Los Angeles, Jan. 27-29, 2004, Slide Nos. 1-24.

H. Hogan, "New Semiconductor Lithography Makes a Splash", Photonics Spectra, Photonics TechnologyWorld, Oct. 2003 Edition, pp. 1-3.

H. Kawata et al., "Fabrication of 0.2 mm Fine Patterns Using Optical Projection lithography with an Oil Immersion Lens", Jpn. J. App. Phys. Col. 31 (1992), pp. 4174-4177.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography at 157 nm", MIT Lincoln Lab, Orlando 2001-1, Dec. 17, 2001.

M. Switkes et al., "Immersion Lithography: Optics for the 50 nm Node", 157 Anvers-1, Sep. 4, 2002.

Nikon Precision Europe GmbH, "Investor Relations-Nikon's Real Solutions", May 15, 2003.

S. Owa et al., "Advantage and Feasibility of Immersion Lithography", Proc. SPIE 5040 (2003).

T. Matsuyama et al., "Nikon Projection Lens Update", SPIE Microlithography 2004, 5377-65, Mar. 2004.

Jan. 27, 2009 Office Action in Japanese Application No. 2004-051576, with translation.

Jul. 7, 2009 Notice of Allowance in Japanese Application No. 2004-051576, with translation.

Jul. 13, 2004 International Search Report and Written Opinion in Application No. PCT/JP2004/002295, with translation.

Mar. 4, 2010 Office Action in European Application No. 04714910.9.

Jul. 4, 2008 Notice of Allowance in Chinese Application No. 200480005148.9, with translation.

Feb. 28, 2008 Austrian Notice of Allowance in Singapore Application No. 200505591-8.

Jun. 4, 2004 Search Report in European Application No. 03254078.3.

Nov. 23, 2004 Search Report in European Application No. 04253817.3.

Feb. 22, 2010 Office Action in U.S. Appl. No. 11/502,393.

Feb. 1, 2010 Notice of Allowance in U.S. Appl. No. 11/826,943.

Apr. 25, 2007 Supplemental Notice of Allowability in U.S. Appl. No. 11/211,749.

Oct. 17, 2008 Office Action in U.S. Appl. No. 11/819,446.

Jul. 9, 2009 Office Action in U.S. Appl. No. 11/819,446.

Oct. 5, 2005 Office Action in U.S. Appl. No. 10/873,647.

Mar. 31, 2005 Office Action in U.S. Appl. No. 10/873,647.

Jan. 17, 2006 Notice of Allowance in U.S. Appl. No. 10/873,647.

Jun. 30, 2006 Notice of Allowance in U.S. Appl. No. 10/873,647.

U.S. Appl. No. 11/882,206 Filed Jul. 31, 2007.

Jun. 1, 2009 Notice of Allowance in U.S. Appl. No. 11/882,206.

Oct. 6, 2008 Office Action in U.S. Appl. No. 11/826,945.

May 20, 2009 Office Action in U.S. Appl. No. 11/826,945.

Jan. 13, 2010 Notice of Allowance in U.S. Appl. No. 11/879,510.

Dec. 13, 2006 Notice of Allowance in U.S. Appl. No. 11/211,749.

Apr. 10, 2007 Notice of Allowance in U.S. Appl. No. 11/211,749.

Jul. 16, 2008 Notice of Allowance in U.S. Appl. No. 11/826,624.

Oct. 8, 2008 Notice of Allowance in U.S. Appl. No. 11/826,622.

Sep. 29, 2008 Notice of Allowance in U.S. Appl. No. 11/879,514.

Jan. 30, 2009 Notice of Allowance in U.S. Appl. No. 11/879,514.

May 24, 2010 Notice of Allowance in U.S. Appl. No. 11/366,746.

May 25, 2010 Notice of Allowance in U.S. Appl. No. 11/879,510.

May 21, 2010 Notice of Allowance in U.S. Appl. No. 11/826,943.
Sep. 24, 2010 Notice of Allowance in U.S. Appl. No. 11/366,746.
Nov. 1, 2010 Notice of Allowance in U.S. Appl. No. 11/879,510.
Nov. 4, 2010 Notice of Allowance in U.S. Appl. No. 11/826,943.

Oct. 25, 2010 Korean Office Action in Korean Application No. 2005-7015716, with translation.

* cited by examiner

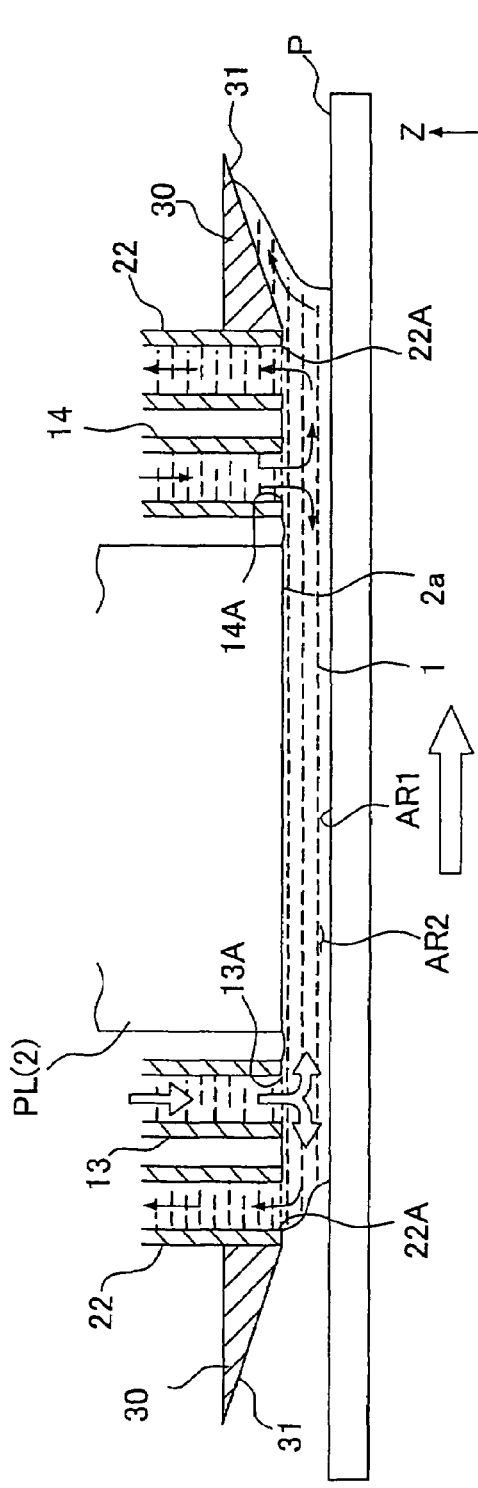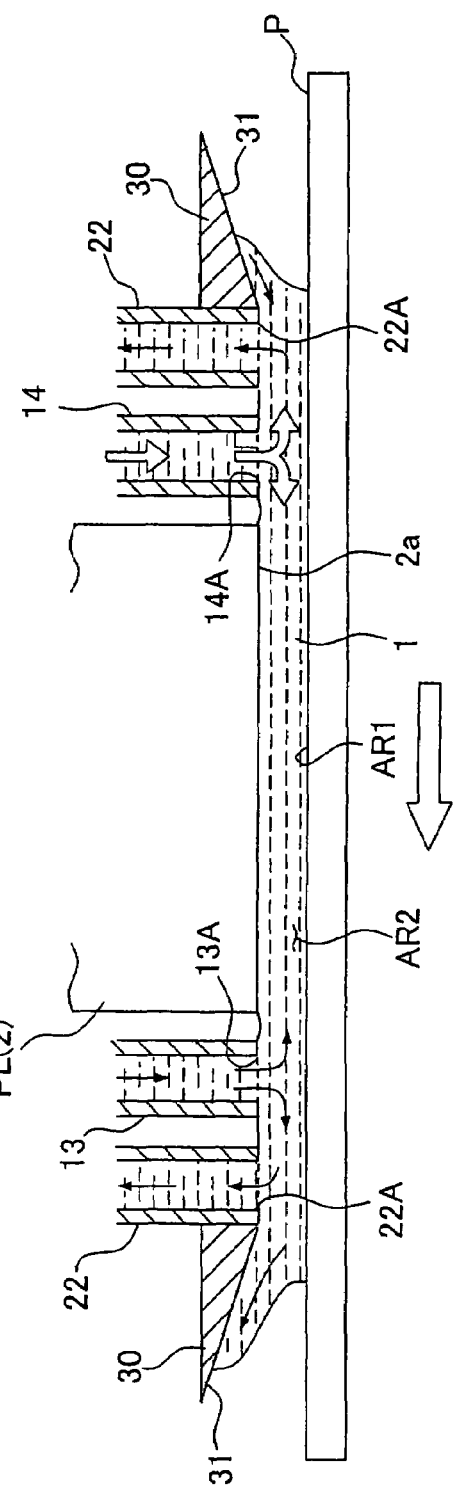

Fig. 8
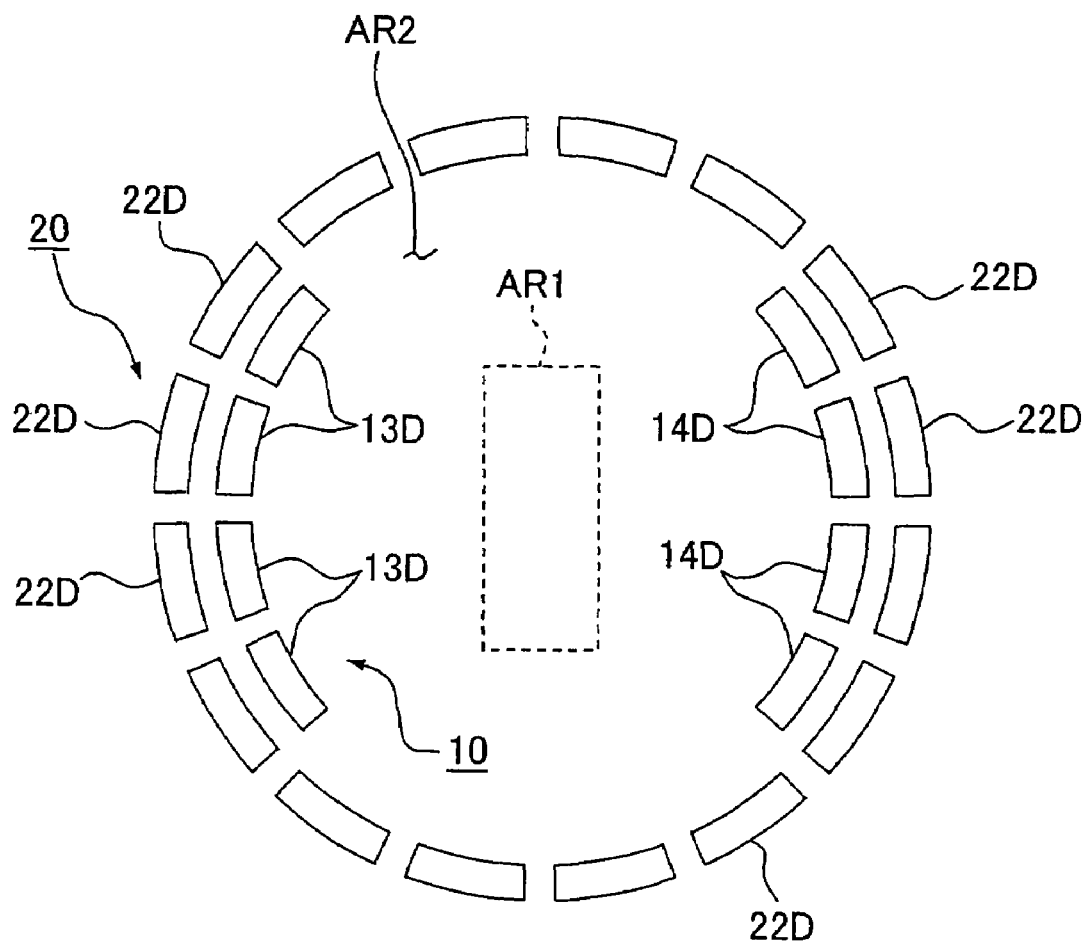
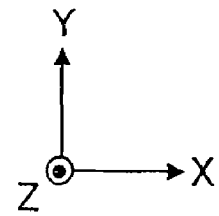

Fig. 9
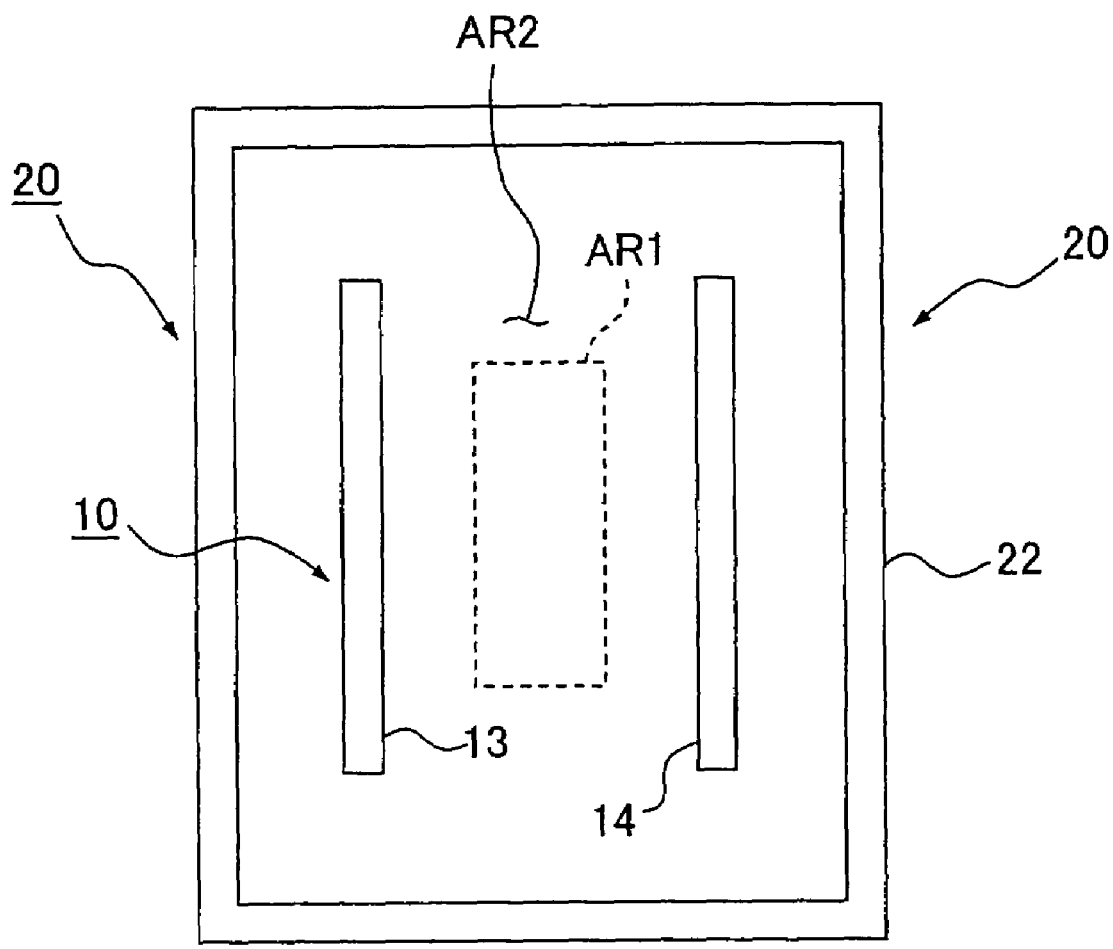
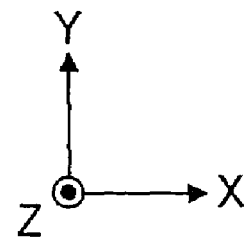

EXPOSURE APPARATUS, EXPOSURE METHOD, AND METHOD FOR PRODUCING DEVICE

CROSS-REFERENCE

This is a Division of U.S. patent application Ser. No. 11/211,749 filed Aug. 26, 2005 which is now U.S. Pat. No. 7,268,854, which in turn is a Continuation of International Application No. PCT/JP2004/002295 filed Feb. 26, 2004 claiming the conventional priority of Japanese patent Application Nos. 2003-049365 filed on Feb. 26, 2003; 2003-110748 filed on Apr. 15, 2003; and 2003-320100 filed on Sep. 11, 2003. The disclosures of these applications are incorporated by reference herein in their entireties.

BACKGROUND OF THE INVENTION

1. Field of the Invention

The present invention relates to an exposure apparatus, an exposure method, and a method for producing a device in which a substrate is exposed with a pattern in a state that a liquid immersion area is formed between a projection optical system and the substrate.

2. Description of the Related Art

Semiconductor devices and liquid crystal display devices are produced by the so-called photolithography technique in which a pattern formed on a mask is transferred onto a photosensitive substrate. The exposure apparatus, which is used in the photolithography step, includes a mask stage for supporting the mask and a substrate stage for supporting the substrate. The pattern on the mask is transferred onto the substrate via a projection optical system while successively moving the mask stage and the substrate stage. In recent years, it is demanded to realize the higher resolution of the projection optical system in order to respond to the further advance of the higher integration of the device pattern. As the exposure wavelength to be used is shorter, the resolution of the projection optical system becomes higher. As the numerical aperture of the projection optical system is larger, the resolution of the projection optical system becomes higher. Therefore, the exposure wavelength, which is used for the exposure apparatus, is shortened year by year, and the numerical aperture of the projection optical system is increased as well. The exposure wavelength, which is dominantly used at present, is 248 nm of the KrF excimer laser. However, the exposure wavelength of 193 nm of the ArF excimer laser, which is shorter than the above, is also practically used in some situations. When the exposure is performed, the depth of focus (DOF) is also important in the same manner as the resolution. The resolution R and the depth of focus δ are represented by the following expressions respectively.

$$R = k_1 \cdot \lambda / NA \quad (1)$$

$$\delta = \pm k_2 \cdot \lambda / NA^2 \quad (2)$$

In the expressions, $\lambda$ represents the exposure wavelength, NA represents the numerical aperture of the projection optical system, and $k_1$ and $k_2$ represent the process coefficients. According to the expressions (1) and (2), the following fact is appreciated. That is, when the exposure wavelength $\lambda$ is shortened and the numerical aperture NA is increased in order to enhance the resolution R, then the depth of focus δ is narrowed.

If the depth of focus δ is too narrowed, it is difficult to match the substrate surface with respect to the image plane of the projection optical system. It is feared that the margin is insufficient during the exposure operation. Accordingly, the liquid immersion method has been suggested, which is disclosed, for example, in International Publication No. 99/49504 as a method for substantially shortening the exposure wavelength and widening the depth of focus. In this liquid immersion method, the space between the lower surface of the projection optical system and the substrate surface is filled with a liquid such as water or any organic solvent to form a liquid immersion area so that the resolution is improved and the depth of focus is magnified about n times by utilizing the fact that the wavelength of the exposure light beam in the liquid is 1/n as compared with that in the air (n represents the refractive index of the liquid, which is about 1.2 to 1.6 in ordinary cases).

The conventional technique as described above involves the following problems. The conventional technique is effective because the liquid immersion area can be formed between the projection optical system and the substrate when the scanning exposure is performed while moving the substrate in a predetermined direction. However, the conventional technique is constructed such that the liquid is supplied at a position in front of the projection area onto which the image of the pattern of the mask is to be projected. The conventional technique is constructed such that the liquid is allowed to flow in one direction along with the movement direction of the substrate from the position in front of the projection area. Further, the conventional technique is constructed such that the position (nozzle), from which the liquid is supplied, is also switched when the movement direction of the substrate is switched from the predetermined direction to the opposite direction. However, when the switching operation is performed, then the supply of the liquid in one direction is suddenly-stopped with respect to the projection area, and the supply of the liquid in another direction is started. Therefore, the following fact has been progressively elucidated. That is, a problem arises in some cases such that the vibration of the liquid (so-called the water hammer phenomenon) is generated between the projection optical system and the substrate, and the vibration is generated in the liquid supply unit itself (for example, the supply tube and the nozzle). As a result, the deterioration of the pattern image is caused. Further, a problem also arises in other cases such that the liquid immersion area is not formed sufficiently between the projection optical system and the substrate because of the construction in which the liquid is allowed to flow in one direction with respect to the projection area.

The conventional technique as described above also involves the following problem. That is, the liquid cannot be recovered sufficiently in some cases because the recovery unit for recovering the liquid is constructed such that the liquid is recovered on only the downstream side of the liquid allowed to flow in the movement direction of the substrate. If the liquid cannot be recovered sufficiently, it is feared that the liquid may remain on the substrate, and any exposure unevenness may be caused by the remaining liquid. If the liquid cannot be recovered sufficiently, an inconvenience also arises, for example, such that the remaining liquid is scattered to surrounding mechanical parts, and any rust appears. Further, if the liquid remains and/or the liquid is scattered, then the environment (for example, the humidity), in which the substrate is placed, is varied or fluctuated. It is also feared that any desired pattern transfer accuracy cannot be obtained, for example, due to the occurrence of the change of the refractive index on the optical path for the detecting light beam of the optical interferometer to be used to measure the stage position.

When the liquid is recovered from the substrate by using a liquid recovery nozzle, there is such a possibility that the vibration is generated in the liquid recovery unit itself (for example, the recovery tube and the nozzle). If the vibration is transmitted, for example, to the projection optical system, the substrate stage, and/or the optical member of the interferometer for measuring the position of the substrate stage, it is feared that the circuit pattern cannot be formed accurately on the substrate.

SUMMARY OF THE INVENTION

The present invention has been made taking the foregoing circumstances into consideration, an object of which is to provide an exposure apparatus, an exposure method, and a method for producing a device, in which a liquid immersion area can be stably formed, the liquid can be satisfactorily recovered, and the exposure process can be performed accurately while avoiding, for example, the outflow and the scattering of the liquid to the surroundings when the exposure process is performed in a state in which the liquid immersion area is formed between a projection optical system and a substrate. Another object of the present invention is to provide an exposure apparatus and a method for producing a device, in which the exposure process can be performed accurately without being affected by the variation generated during the supply or the recovery of the liquid when the exposure process is performed in a state in which a liquid immersion area is formed between a projection optical system and a substrate.

In order to achieve the objects as described above, the present invention adopts the following constructions.

According to a first aspect of the present invention, there is provided an exposure apparatus which exposes a substrate by projecting an image of a predetermined pattern through a liquid onto the substrate, the exposure apparatus comprising:
  a projection optical system which projects the image of the pattern onto the substrate; and
  a liquid supply mechanism which supplies the liquid onto the substrate simultaneously from a plurality of positions which are apart, in a plurality of different directions, from a projection area of the projection optical system to form a liquid immersion area on a part of the substrate including the projection area.

According to the present invention, the liquid supply mechanism, which is provided to form the liquid immersion area, simultaneously supplies the liquid at the plurality of positions which are apart, in the plurality of different directions, from the projection area (i.e., from a plurality of different sides of the projection area, for example, from at least two sides of the X side, the −X side, the +Y side, and the −Y side in the case of a rectangular projection area). Therefore, the desired liquid immersion area can be formed between the projection optical system and the substrate. Further, when the exposure process is performed while moving the substrate, the liquid immersion area can be always formed satisfactorily even when the movement direction of the substrate is changed, because the liquid is supplied simultaneously from the plurality of positions which are apart in the plurality of directions. When the liquid is simultaneously supplied on the both sides of the projection area, it is unnecessary to switch the supply position of the liquid. Therefore, it is possible to avoid the occurrence of the vibration of the liquid (water hammer phenomenon), and it is possible to accurately project the pattern image onto the substrate.

According to a second aspect of the present invention, there is provided an exposure apparatus which exposes a substrate by projecting an image of a predetermined pattern through a liquid onto the substrate, the exposure apparatus comprising:
  a projection optical system which projects the image of the pattern onto the substrate;
  a liquid supply mechanism which supplies the liquid onto the substrate to form a liquid immersion area on a part of the substrate including a projection area of the projection optical system; and
  a liquid recovery mechanism which recovers the liquid from the substrate simultaneously at a plurality of positions apart from the projection area in a plurality of different directions.

According to the present invention, the liquid recovery mechanism, which is provided to recover the liquid, simultaneously recovers the liquid at the plurality of positions apart from the projection area in the plurality of different directions (i.e., from a plurality of different sides of the projection area, for example, from at least two sides of the X side, the −X side, the +Y side, and the −Y side in the case of a rectangular projection area). Accordingly, the liquid can be recovered reliably. Therefore, it is possible to avoid the occurrence of a state in which the liquid remains on the substrate, it is possible to avoid the occurrence of any uneven exposure and the variation of the environment in which the substrate is placed, and it is possible to accurately project the pattern image onto the substrate.

According to a third aspect of the present invention, there is provided an exposure apparatus which exposes a substrate by projecting an image of a predetermined pattern through a liquid onto the substrate, the exposure apparatus comprising:
  a projection optical system which projects the image of the pattern onto the substrate;
  a liquid supply mechanism which supplies the liquid onto the substrate to form a liquid immersion area on a part of the substrate including a projection area of the projection optical system; and
  a liquid recovery mechanism which recovers the liquid from the substrate simultaneously at a plurality of positions, wherein:
  the liquid recovery mechanism recovers the liquid with a recovery force which differs depending on the position for recovering the liquid.

According to the present invention, the liquid recovery mechanism, which recovers the liquid simultaneously at the plurality of positions on the substrate, recovers the liquid with the recovery force that differs depending on the position for recovering the liquid. Accordingly, it is possible to smoothly perform the operation for recovering the liquid. Therefore, the space between the projection optical system and the substrate can be filled with an appropriate amount of the liquid, and it is possible to form the liquid immersion area in the desired area on the substrate. For example, when the recovery force for the liquid, which is used on the front side (downstream side) in relation to the movement (scanning) direction of the substrate, is set to be larger than the recovery force on the back side (upstream side), it is possible to smoothly perform the operation for recovering the liquid. Alternatively, it is possible to smoothly perform the operation for recovering the liquid as well, when the liquid recovery mechanism, which is arranged at a position disposed in the movement (scanning) direction of the substrate, has the recovery force for the liquid which is larger than the recovery force for the liquid of the liquid recovery mechanism arranged at a position disposed in a direction intersecting the movement direction.

According to a fourth aspect of the present invention, there is provided an exposure apparatus which exposes a substrate by projecting an image of a predetermined pattern through a liquid onto the substrate, the exposure apparatus comprising:
- a projection optical system which projects the image of the pattern onto the substrate;
- a liquid supply mechanism which supplies the liquid onto the substrate to form a liquid immersion area on a part of the substrate including a projection area of the projection optical system;
- a liquid recovery mechanism which recovers the liquid on the substrate at a liquid recovery position apart from the projection area; and
- a trap member which is arranged outside the liquid recovery position of the liquid by the liquid recovery mechanism with respect to the projection area and which is formed with a liquid trap surface for capturing the liquid.

According to the present invention, the trap member, which is formed with the liquid trap surface having a predetermined length to capture the liquid, is provided outside the liquid recovery position of the liquid recovery mechanism. Accordingly, even if the liquid is unsuccessfully recovered by the liquid recovery mechanism, then the liquid is trapped by the trap member, and thus it is possible to avoid the occurrence of the inconvenience such as the scattering and the outflow of the liquid to the surroundings. Therefore, it is possible to avoid the occurrence of the variation of the environment in which the substrate is placed. It is possible to project the pattern image onto the substrate at a desired pattern accuracy.

According to a fifth aspect of the present invention, there is provided an exposure apparatus which exposes a substrate by projecting an image of a predetermined pattern through a liquid onto the substrate, the exposure apparatus comprising:
- a projection optical system which projects the image of the pattern onto the substrate;
- a liquid supply mechanism which supplies the liquid onto the substrate to form a liquid immersion area on a part of the substrate including a projection area of the projection optical system; and
- a liquid recovery mechanism which recovers the liquid from the substrate at a liquid recovery position apart from the projection area, wherein:
- the liquid supply mechanism supplies the liquid between the projection area and the liquid recovery position of the liquid recovery mechanism.

According to the present invention, the liquid is supplied by the liquid supply mechanism between the projection area and the liquid recovery position of the liquid recovery mechanism. Therefore, the liquid is smoothly supplied to the projection area. Further, the supplied liquid can be smoothly recovered from the substrate.

According to a sixth aspect of the present invention, there is provided an exposure method for exposing a substrate by projecting an image of a predetermined pattern through a liquid onto the substrate by using a projection optical system, the exposure method comprising:
- supplying the liquid onto a part of the substrate including a projection area of the projection optical system to form a liquid immersion area, the liquid having an affinity for a liquid contact surface disposed at an end of the projection optical system, and the affinity being higher than an affinity for a surface of the substrate; and
- projecting the image of the predetermined pattern onto the substrate through the liquid supplied to the liquid immersion area.

According to the present invention, the liquid can be allowed to make tight contact with the liquid contact surface disposed at the forward end of the projection optical system. It is possible to provide a stable liquid immersion state for the optical path between the projection optical system and the substrate. Further, it is possible to smoothly recover the liquid on the substrate.

A method for producing a device according to the present invention comprises using the exposure apparatus or the exposure method according to the aspect as described above. According to the present invention, it is possible to provide the device which has a pattern formed at a satisfactory pattern accuracy and which is capable of exhibiting desired performance.

According to a seventh aspect of the present invention, there is provided an exposure apparatus which exposes a substrate by projecting an image of a predetermined pattern through a liquid onto the substrate, the exposure apparatus comprising:
- a projection optical system which projects the image of the pattern onto the substrate;
- a liquid supply mechanism which has a supply flow passage through which the liquid is supplied onto the substrate; and
- a liquid recovery mechanism which has a recovery flow passage through which the supplied liquid is recovered, wherein:
- at least one of the supply flow passage and the recovery flow passage is formed in a stacked member in which a plurality of plate members are stacked.

It is necessary for the liquid immersion exposure that the uniform liquid flow is supplied to the liquid immersion area, and the liquid is recovered therefrom. The stacked member, which is provided for the exposure apparatus of the present invention, can be formed by stacking a plurality of plate members formed with the flow passages respectively so that the flow passages are communicated with each other to form at least one of the supply flow passage and the recovery flow passage respectively. Therefore, even when the flow passage structure is complicated, the flow passages can be formed extremely compactly and easily at low cost.

According to an eighth aspect of the present invention, there is provided an exposure apparatus which exposes a substrate by projecting an image of a predetermined pattern through a liquid onto the substrate, the exposure apparatus comprising:
- a projection optical system which projects the image of the pattern onto the sustrate; and
- a liquid supply mechanism which supplies the liquid onto the substrate to form a liquid immersion area on a part of the substrate including a projection area of the projection optical systems, wherein:
- the liquid supply mechanism is isolated from the projection optical system in terms of vibration.

According to the exposure apparatus concerning the eighth aspect, the projection optical system and the liquid supply mechanism are isolated from each other in terms of the vibration. That is, even when any vibration is generated in the liquid supply mechanism, the vibration is not transmitted to the projection optical system. Therefore, it is possible to avoid the occurrence of an inconvenience which would be otherwise caused such that the pattern image is deteriorated by the vibration of the projection optical system. It is possible to accurately project the pattern image onto the substrate.

The exposure apparatus may further comprise a first support member which supports the projection optical system, and a second support member which is isolated from the first support member in terms of vibration and which supports the liquid supply mechanism. According to this structure, the first support member for supporting the projection optical system and the second support member for supporting the liquid supply mechanism are isolated from each other in terms of the vibration. Therefore, the vibration, which is generated in the liquid supply mechanism, is not transmitted to the projection optical system. Further, for example, when the exposure apparatus is constructed such that an interferometer for measuring the position information about the substrate stage is attached to the first support member, and/or a reference mirror (fixed mirror) is attached to the barrel of the projection optical system, then the vibration is not transmitted to the interferometer and the reference mirror. Therefore, it is possible to accurately perform the measurement of the position information about the substrate stage and the position control based on the result of the measurement.

According to a ninth aspect of the present invention, there is provided an exposure apparatus which exposes a substrate by projecting an image of a predetermined pattern through a liquid onto the substrate, the exposure apparatus comprising:
 a projection optical system which projects the image of the pattern onto the substrate; and
 a liquid recovery mechanism which recovers the liquid supplied onto a part of the substrate including a projection area of the projection optical systems wherein:
 the liquid recovery mechanism is isolated from the projection optical system in terms of vibration.

According to the exposure apparatus concerning the ninth aspect, the projection optical system and the liquid recovery mechanism are isolated from each other in terms of the vibration. Accordingly, even when any vibration is generated in the liquid recovery mechanism, the vibration is not transmitted to the projection optical system. Therefore, it is possible to avoid the occurrence of an inconvenience which would be otherwise caused such that the pattern image is deteriorated by the vibration of the projection optical system. It is possible to accurately project the pattern image onto the substrate.

The exposure apparatus concerning the ninth aspect may further comprise a first support member which supports the projection optical system, and a second support member which is isolated from the first support member in terms of vibration and which supports the liquid recovery mechanism. According to this structure, the first support member for supporting the projection optical system and the second support member for supporting the liquid recovery mechanism are isolated from each other in terms of the vibration. Therefore, the vibration, which is generated in the liquid recovery mechanism, is not transmitted to the projection optical system. Further, for example, when the exposure apparatus is constructed such that an interferometer for measuring the position information about the substrate stage is attached to the first support member, and/or a reference mirror (fixed mirror) is attached to the barrel of the projection optical system, then the vibration is not transmitted to the interferometer and the reference mirror. Therefore, it is possible to accurately perform the measurement of the position information about the substrate stage and the position control based on the result of the measurement.

According to a tenth aspect of the present invention, there is provided an exposure apparatus which successively exposes a plurality of shot areas on a substrate by projecting an image of a predetermined pattern through a liquid onto the substrates, the exposure apparatus comprising:
 a projection optical system which projects the image of the pattern onto the substrate; and
 a liquid supply mechanism which supplies the liquid from a supply port arranged opposite to the substrate to form a liquid immersion area on a part of the substrate including a projection area of the projection optical system, wherein:
 the liquid supply mechanism continuously supplies the liquid from the supply port during a period in which an exposure process is performed for the plurality of shot areas on the substrate.

According to the exposure apparatus concerning the tenth aspect of the present invention, the liquid is continuously supplied from the supply port arranged at the predetermined position irrelevant to the movement direction of the substrate during the period in which the exposure process is performed for the plurality of shot areas on the substrate. Therefore, it is possible to avoid the vibration of the liquid supply mechanism itself and the vibration of the liquid (water hammer phenomenon). It is possible to accurately project the pattern image onto the substrate.

According to an eleventh aspect of the present invention, there is provided an exposure apparatus which successively exposes a plurality of shot areas on a substrate by projecting an image of a predetermined pattern through a liquid onto the substrate, the exposure apparatus comprising:
 a projection optical system which projects the image of the pattern onto the substrate;
 a liquid supply mechanism which supplies the liquid from a supply port arranged at a predetermined position to form a liquid immersion area on a part of the substrate including a projection area of the projection optical system; and
 a liquid recovery mechanism which has a recovery port arranged to be opposed to the substrate and which recovers the liquid supplied from the liquid supply mechanism, wherein:
 the liquid recovery mechanism continuously recovers the liquid through the recovery port during a period in which an exposure process is performed for the plurality of shot areas on the substrate.

According to the exposure apparatus concerning the eleventh aspect of the present invention, the liquid is continuously recovered through the recovery port irrelevant to the movement direction of the substrate during the period in which the exposure process is performed for the plurality of shot areas on the substrate. Accordingly, it is possible to recover the liquid more reliably. It is possible to suppress the vibration of the liquid recovery mechanism itself caused upon the start and the stop of the recovery. It is possible to accurately project the pattern image onto the substrate.

A method for producing a device according to the present invention comprises using the exposure apparatus according to the aspect as described above. According to the present invention, it is possible to provide the device which has a pattern formed at a satisfactory pattern accuracy and which is capable of exhibiting desired performance.

According to the present invention, the exposure process can be performed accurately even when the exposure process is performed in the state in which the liquid immersion area is formed between the projection optical system and the substrate.

BRIEF DESCRIPTION OF THE DRAWINGS

FIGS. 6A and 6B schematically show the behavior of the liquid.

FIG. 8 shows still another embodiment of a liquid supply mechanism and a liquid supply mechanism.

FIG. 9 shows still another embodiment of a liquid supply mechanism and a liquid supply mechanism.

DESCRIPTION OF THE PREFERRED EMBODIMENTS OF THE INVENTION

Figure 1:
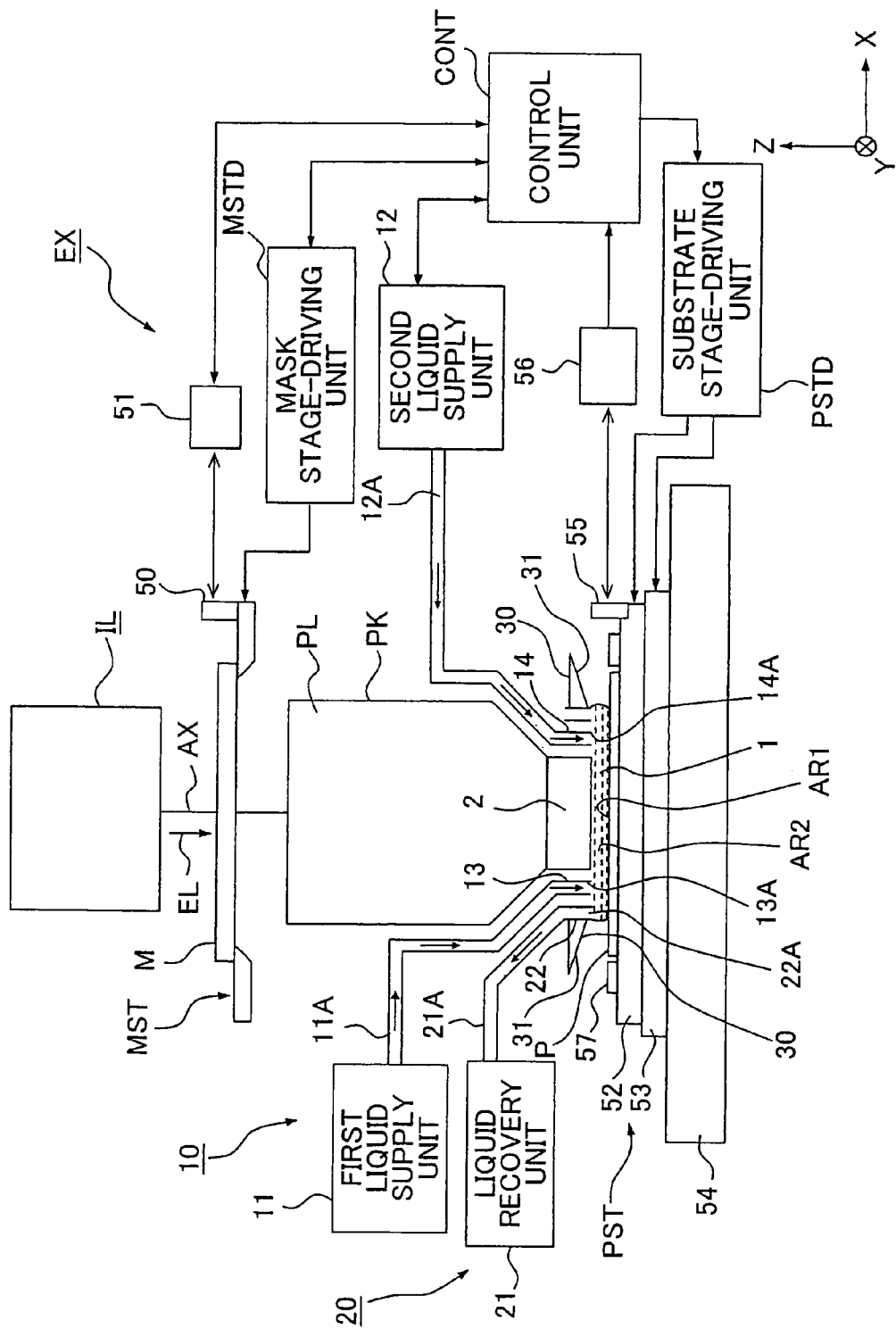
FIG. 1 shows a schematic arrangement illustrating an embodiment of an exposure apparatus of the present invention.

An explanation will be made below about the exposure apparatus according to the present invention with reference to the drawings. FIG. 1 shows a schematic arrangement illustrating an embodiment of the exposure apparatus of the present invention. With reference to FIG. 1, an exposure apparatus EX includes a mask stage MST which supports a mask M, a substrate stage PST which supports a substrate P, an illumination optical system IL which illuminates, with an exposure light beam EL, the mask M supported by the mask stage MST, a projection optical system PL which performs projection exposure for the substrate P supported by the substrate stage PST with an image of a pattern of the mask M illuminated with the exposure light beam EL, and a control unit CONT which collectively controls the overall operation of the exposure apparatus EX.

The exposure apparatus EX of this embodiment is a liquid immersion exposure apparatus to which the liquid immersion method is applied in order that the exposure wavelength is substantially shortened to improve the resolution and the depth of focus is substantially widened. The exposure apparatus EX includes a liquid supply mechanism 10 which supplies the liquid 1 onto the substrate P, and a liquid recovery mechanism 20 which recovers the liquid 1 from the substrate P. The exposure apparatus EX forms a liquid immersion area AR2 on a part of the substrate P including a projection area AR1 of the projection optical system PL by the liquid 1 supplied from the liquid supply mechanism 10 at least during the period in which the pattern image of the mask M is transferred onto the substrate P. Specifically, the exposure apparatus EX is operated as follows. That is, the space between the surface of the substrate P and the optical element 2 disposed at the end portion of the projection optical system PL is filled with the liquid 1. The pattern image of the mask M is projected onto the substrate P to expose the substrate P therewith via the projection optical system PL and through the liquid 1 disposed between the projection optical system PL and the substrate P.

The embodiment of the present invention will now be explained as exemplified by a case of the use of the scanning type exposure apparatus (so-called scanning stepper) as the exposure apparatus EX in which the substrate P is exposed with the pattern formed on the mask M while synchronously moving the mask M and the substrate P in mutually different directions (opposite directions) in the scanning directions. In the following explanation, the Z axis direction is the direction which is coincident with the optical axis AX of the projection optical system PL, the X axis direction is the synchronous movement direction (scanning direction) for the mask M and the substrate P in the plane perpendicular to the Z axis direction, and the Y axis direction is the direction (non-scanning direction) perpendicular to the Z axis direction and the Y axis direction. The directions about the X axis, the Y axis, and the Z axis are designated as θX, θY, and θZ directions respectively. The term "substrate" referred to herein includes substrates obtained by coating a semiconductor wafer surface with a photoresist as a photosensitive material, and the term "mask" includes a reticle formed with a device pattern to be subjected to the reduction projection onto the substrate.

The illumination optical system IL is used so that the mask M, which is supported on the mask stage MST, is illuminated with the exposure light beam EL. The illumination optical system IL includes, for example, an exposure light source, an optical integrator which uniformizes the illuminance of the light flux radiated from the exposure light source, a condenser lens which collects the exposure light beam EL come from the optical integrator, a relay lens system, and a variable field diaphragm which sets the illumination area on the mask M illuminated with the exposure light beam EL to be slit-shaped. The predetermined illumination area on the mask M is illuminated with the exposure light beam EL having a uniform illuminance distribution by the illumination optical system IL. Those usable as the exposure light beam EL radiated from the illumination optical system IL include, for example, emission lines (g-ray, h-ray, i-ray) in the ultraviolet region radiated, for example, from a mercury lamp, far ultraviolet light beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm). In this embodiment, the ArF excimer laser beam is used.

The mask stage MST supports the mask M. The mask stage MST is two-dimensionally movable in the plane perpendicular to the optical axis AX of the projection optical system PL, i.e., in the XY plane, and it is finely rotatable in the θZ direction. The mask stage MST is driven by a mask stage-driving unit MSTD such as a linear motor. The mask stage-driving unit MSTD is controlled by the control unit CONT. A movement mirror 50 is provided on the mask stage MST. A laser interferometer 51 is provided at a position opposed to the movement mirror 50. The position in the two-dimensional direction and the angle of rotation of the mask M on the mask stage MST are measured in real-time by the laser interferometer 51. The result of the measurement is outputted to the control unit CONT. The control unit CONT drives the mask stage-driving unit MSTD on the basis of the result of the measurement obtained by the laser interferometer 51 to thereby position the mask M supported on the mask stage MST.

The projection optical system PL projects the pattern on the mask M onto the substrate P at a predetermined projection magnification β to perform the exposure. The projection optical system PL includes a plurality of optical elements including the optical element (lens) 2 provided at the end portion on the side of the substrate P. The optical elements are supported by a barrel PK. In this embodiment, the projection optical system PL is based on the reduction system having the projection magnification β which is, for example, ¼ or ⅕. The projection optical system PL may be any one of the 1× magnification system and the magnifying system. The optical element 2, which is disposed at the end portion of the projection optical system PL of this embodiment, is provided detachably (exchangeably) with respect to the barrel PK. The liquid 1 in the liquid immersion area AR2 makes contact with the optical element 2.

The optical element 2 is formed of fluorite. Fluorite has a high affinity for water. Therefore, the liquid 1 is successfully allowed to make tight contact with substantially the entire surface of the liquid contact surface 2a of the optical element 2. That is, in this embodiment, the liquid (water) 1, which has the high affinity for the liquid contact surface 2a of the optical element 2, is supplied. Therefore, the highly tight contact is effected between the liquid 1 and the liquid contact surface 2a of the optical element 2. The optical path between the optical element 2 and the substrate P can be reliably filled with the liquid 1. The optical element 2 may be formed of quartz having a high affinity for water. A water-attracting (lyophilic or liquid-attracting) treatment may be applied to the liquid contact surface 2a of the optical element 2 to further enhance the affinity for the liquid 1.

The substrate stage PST supports the substrate P. The substrate stage PST includes a Z stage 52 which holds the substrate P by the aid of a substrate holder, an XY stage 53 which supports the Z stage 52, and a base 54 which supports the XY stage 53. The substrate stage PST is driven by a substrate stage-driving unit PSTD such as a linear motor. The substrate stage-driving unit PSTD is controlled by the control unit CONT. When the Z stage 52 is driven, the substrate P, which is held on the Z stage 52, is subjected to the control of the position (focus position) in the Z axis direction and the positions in the θX and θY directions. When the XY stage 53 is driven, the substrate P is subjected to the control of the position in the XY directions (position in the directions substantially parallel to the image plane of the projection optical system PL). That is, the Z stage 52 controls the focus position and the angle of inclination of the substrate P so that the surface of the substrate P is adjusted to match the image plane of the projection optical system PL in the auto-focus manner and the auto-leveling manner. The XY stage 53 positions the substrate P in the X axis direction and the Y axis direction. It goes without saying that the Z stage and the XY stage may be provided as an integrated body.

A movement mirror 55, which is movable together with the substrate stage PST with respect to the projection optical system PL, is provided on the substrate stage-PST (Z stage 52). A laser interferometer 56 is provided at a position opposed to the movement mirror 55. The angle of rotation and the position in the two-dimensional direction of the substrate P on the substrate stage PST are measured in real-time by the laser interferometer 56. The result of the measurement is outputted to the control unit CONT. The control unit CONT drives the substrate stage-driving unit PSTD on the basis of the result of the measurement of the laser interferometer 56 to thereby position the substrate P supported on the substrate stage PST.

An auxiliary plate 57 is provided on the substrate stage PST (Z stage 52) so that the substrate P is surrounded thereby. The auxiliary plate 57 has a flat surface which has approximately the same height as that of the surface of the substrate P held by the substrate holder. In this arrangement, a gap of about 0.1 to 2 mm is provided between the auxiliary plate 57 and the edge of the substrate P. However, the liquid 1 scarcely flows into the gap owing to the surface tension of the liquid 1. Even when the vicinity of the circumferential edge of the substrate P is subjected to the exposure, the liquid 1 can be retained under the projection optical system PL by the aid of the auxiliary plate 57.

The liquid supply mechanism 10 supplies the predetermined liquid 1 onto the substrate P. The liquid supply mechanism 10 includes a first liquid supply unit 11 and a second liquid supply unit 12 which are capable of supplying the liquid 1, a first supply member 13 which is connected to the first liquid supply unit 11 through a supply tube 11A having a flow passage and which has a supply port 13A for supplying, onto the substrate P, the liquid 1 fed from the first liquid supply unit 11, and a second supply member 14 which is connected to the second liquid supply unit 12 through a supply tube 12A having a flow passage and which has a supply port 14A for supplying, onto the substrate P, the liquid 1 fed from the second liquid supply unit 12. The first and second supply members 13, 14 are arranged closely to the surface of the substrate P, and they are provided at positions which are different from each other in the surface direction of the substrate P. Specifically, the first supply member 13 of the liquid supply mechanism 10 is provided on one side (−X side) in the scanning direction with respect to the projection area AR1, and the second supply member 14 is provided on the other side (+X side).

Each of the first and second liquid supply units 11, 12 includes, for example, a tank for accommodating the liquid 1, a pressurizing pump, and the like. The first and second liquid supply units 11, 12 supply the liquid 1 onto the substrate P through the supply tubes 11A, 12A and the supply members 13, 14 respectively. The operation of the first and second liquid supply units 11, 12 for supplying the liquid is controlled by the control unit CONT. The control unit CONT is capable of controlling the liquid supply amounts per unit time onto the substrate P by the first and second liquid supply units 11, 12 independently respectively.

In this embodiment, pure water is used for the liquid 1. Those capable of being transmitted through pure water include the ArF excimer laser beam as well as the emission line (g-ray, h-ray, i-ray) in the ultraviolet region radiated, for example, from a mercury lamp and the far ultraviolet light beam (DUV light beam) such as the KrF excimer laser beam (wavelength: 248 nm).

The liquid recovery mechanism 20 recovers the liquid 1 from the surface of the substrate P. The liquid recovery mechanism 20 includes a recovery member 22 which has a recovery port 22A arranged closely to the surface of the substrate P, and a liquid recovery unit 21 which is connected to the recovery member 22 through a recovery tube 21A having a flow passage. The liquid recovery unit 21 includes, for example, a sucking unit such as a vacuum pump, a tank for accommodating the recovered liquid 1, and the like. The liquid recovery unit 21 recovers the liquid 1 from the surface of the substrate P via the recovery member 22 and the recovery tube 21A. The operation of the liquid recovery unit 21 for recovering the liquid is controlled by the control unit CONT. The control unit CONT is capable of controlling the liquid recovery amount per unit time by the liquid recovery unit 21.

A trap member 30, which is formed with a liquid trap surface 31 having a predetermined length to capture the liquid 1, is arranged outside the recovery member 22 of the liquid recovery mechanism 20.

Figure 2:
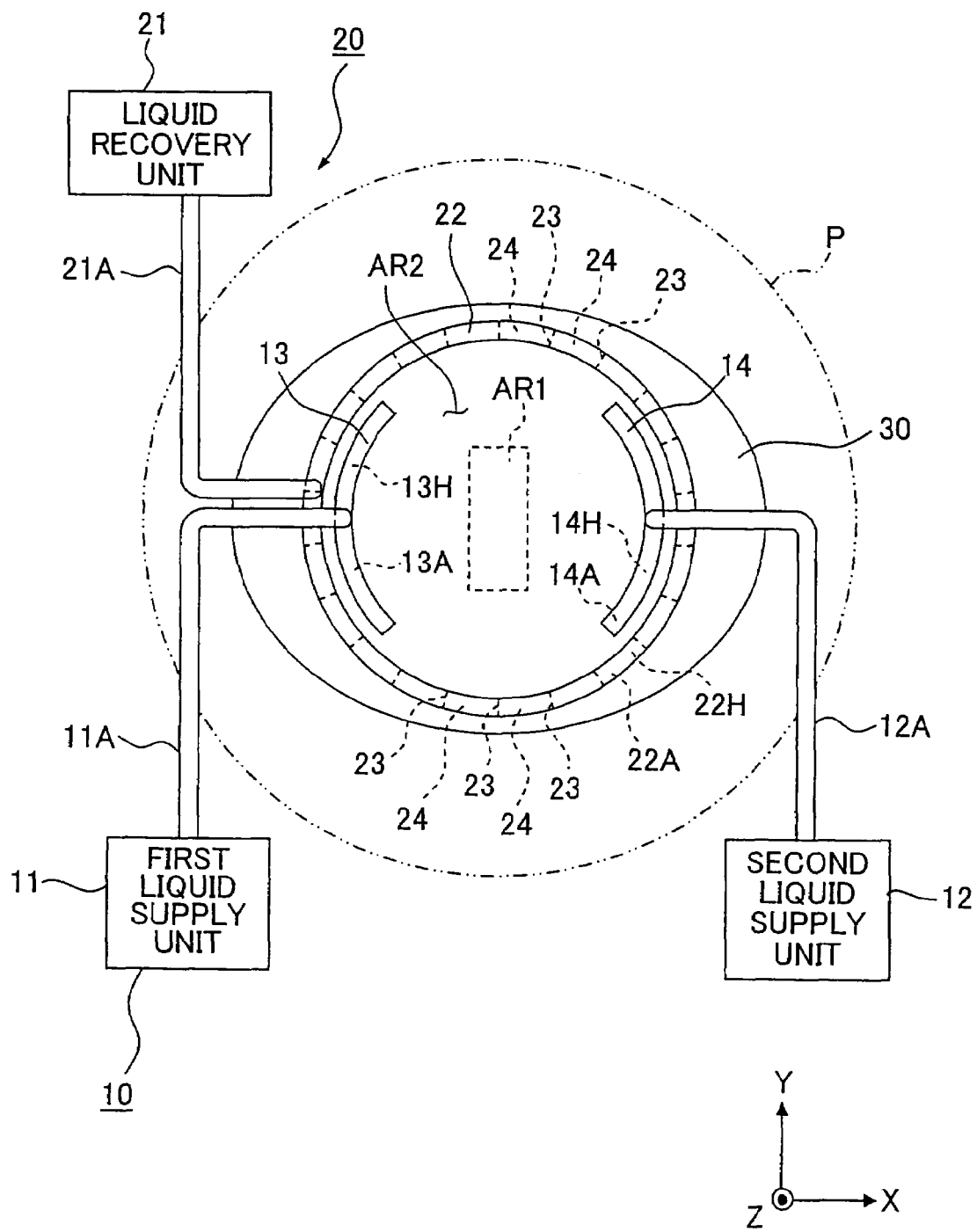
FIG. 2 shows a plan view illustrating a schematic arrangement of a liquid supply mechanism and a liquid recovery mechanism as characteristic features of the present invention.
Figure 3:
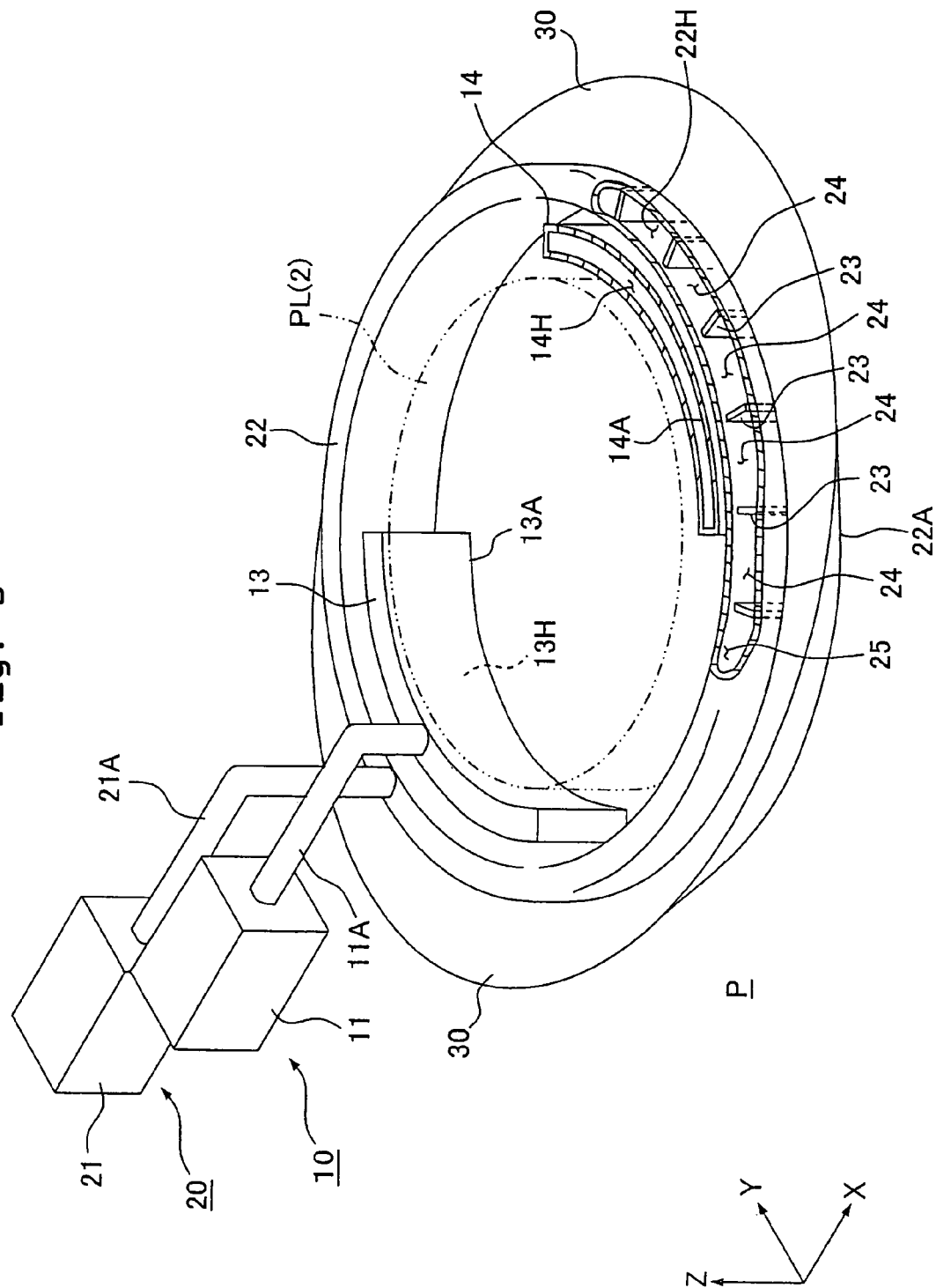
FIG. 3 shows a perspective view illustrating a schematic arrangement of the liquid supply mechanism and the liquid recovery mechanism as the characteristic features of the present invention.

FIG. 2 shows a plan view illustrating a schematic arrangement of the liquid supply mechanism 10 and the liquid recovery mechanism 20, and FIG. 3 shows a perspective view with partially broken illustration. As shown in FIG. 2, the projection area AR1 of the projection optical system PL is designed to have a rectangular shape in which the Y axis direction (non-scanning direction) is the longitudinal direction. The liquid immersion area AR2, which is filled with the liquid 1, is formed on a part of the substrate P so that the projection area AR1 is covered thereby. The first supply member 13 of the liquid supply mechanism 10, which is used to form the liquid immersion area AR2 of the projection area AR1, is provided on one side (−X side) in the scanning direction with respect to the projection area AR1, and the second supply member 14 is provided on the other side (+X side).

As shown in FIGS. 2 and 3, the first and second supply members 13, 14 have internal spaces (internal flow passages) 13H, 14H for allowing the liquid 1 fed from the first and second liquid supply units 11, 12 to flow therethrough, and supply ports 13A, 14A for supplying, onto the substrate P, the liquid 1 having flown through the internal spaces 13H, 14H respectively. Although the second liquid supply unit 12 is not shown in FIG. 3, the structure thereof is the same as that of the first liquid supply unit 11. Each of the supply ports 13A, 14A of the first and second supply members 13, 14 is formed to be substantially circular arc-shaped as viewed in the plan view. The size of the supply port 13A, 14A in the Y axis direction is designed to be larger than at least the size of the projection area AR1 in the Y axis direction. The supply ports 13A, 14A, which are formed to be substantially circular arc-shaped as viewed in the plan view, are arranged to interpose the projection area AR1 in relation to the scanning direction (X direction). The liquid supply mechanism 10 simultaneously supplies the liquid 1 from a plurality of positions which are apart, in a plurality of different directions, from the projection area AR1 through the supply ports 13A, 14A, i.e., on different sides of the rectangular projection area AR1 (from the both sides (from the side in the +X direction and the side in the −X direction) in this embodiment) of the projection area AR1.

The recovery member 22 of the liquid recovery mechanism 20 is a dual-structured annular member having a recovery port 22A which is formed annularly and continuously so that the recovery port 22A is directed to the surface of the substrate P, and an annular internal space (internal flow passage) 22H which allows the liquid 1 recovered through the recovery port 22A to flow therethrough. The recovery member 22 of the liquid recovery mechanism 20 is arranged to surround the projection area AR1 and the supply members 13, 14 of the liquid recovery mechanism 10. Partition members (partitions) 23, which divide the internal space 22H into a plurality of spaces (divided spaces) 24 in the circumferential direction, are provided at predetermined intervals in the recovery member 22. That is, the partition members 23 are provided at the inside of the recovery port 22A which is formed continuously to surround the projection area AR1. The respective divided spaces 24, which are divided by the partition members 23, make penetration in the vertical direction. The lower end of the recovery member 22 having the recovery port 22A is disposed closely to the surface of the substrate P. On the other hand, the upper end is a manifold 25 as a collected space for spatially collecting the plurality of divided spaces 24. One end of the recovery tube 21A is connected to the manifold 25, and the other end is connected to the liquid recovery unit 21. The liquid recovery mechanism 20 recovers the liquid 1 from the substrate P by the aid of the recovery port 22A (recovery member 22) and the recovery tube 21A by driving the liquid recovery unit 21. That is, the position of installation of the recovery port 22A is the recovery position for recovering the liquid 1 from the substrate P. The liquid recovery mechanism 20 recovers the liquid 1 from the substrate P at the recovery position apart from the projection area AR1. In this embodiment, the recovery port 22A of the liquid recovery mechanism 20 is substantially circular and annular as viewed in the plan view, which is constructed to surround the projection area AR1. That is, the recovery port 22A exists on the four sides of the rectangular projection area AR1 (on the side in the +X direction, the side in the −X direction, the side in the +Y direction, and the side in the −Y direction), i.e., at the four positions which are apart in the four directions perpendicular to the projection area AR1. Therefore, the liquid recovery mechanism 20 can simultaneously recover the liquid 1 from the substrate P at the plurality of positions which are apart, in the plurality of different directions, from the projection area AR1 by using the recovery port 22A provided to surround the projection area AR1.

The positions of installation of the respective supply ports 13A, 14A of the first and second supply members 13, 14 of the liquid supply mechanism 10, i.e., the positions to supply the liquid 1 onto the substrate P are disposed between the liquid recovery positions (positions of the recovery port 22A) and the projection area AR1. In other words, the liquid 1 is supplied by the liquid supply mechanism 10 between the projection area AR1 and the liquid recovery positions of the liquid recovery mechanism 20.

Figure 4:
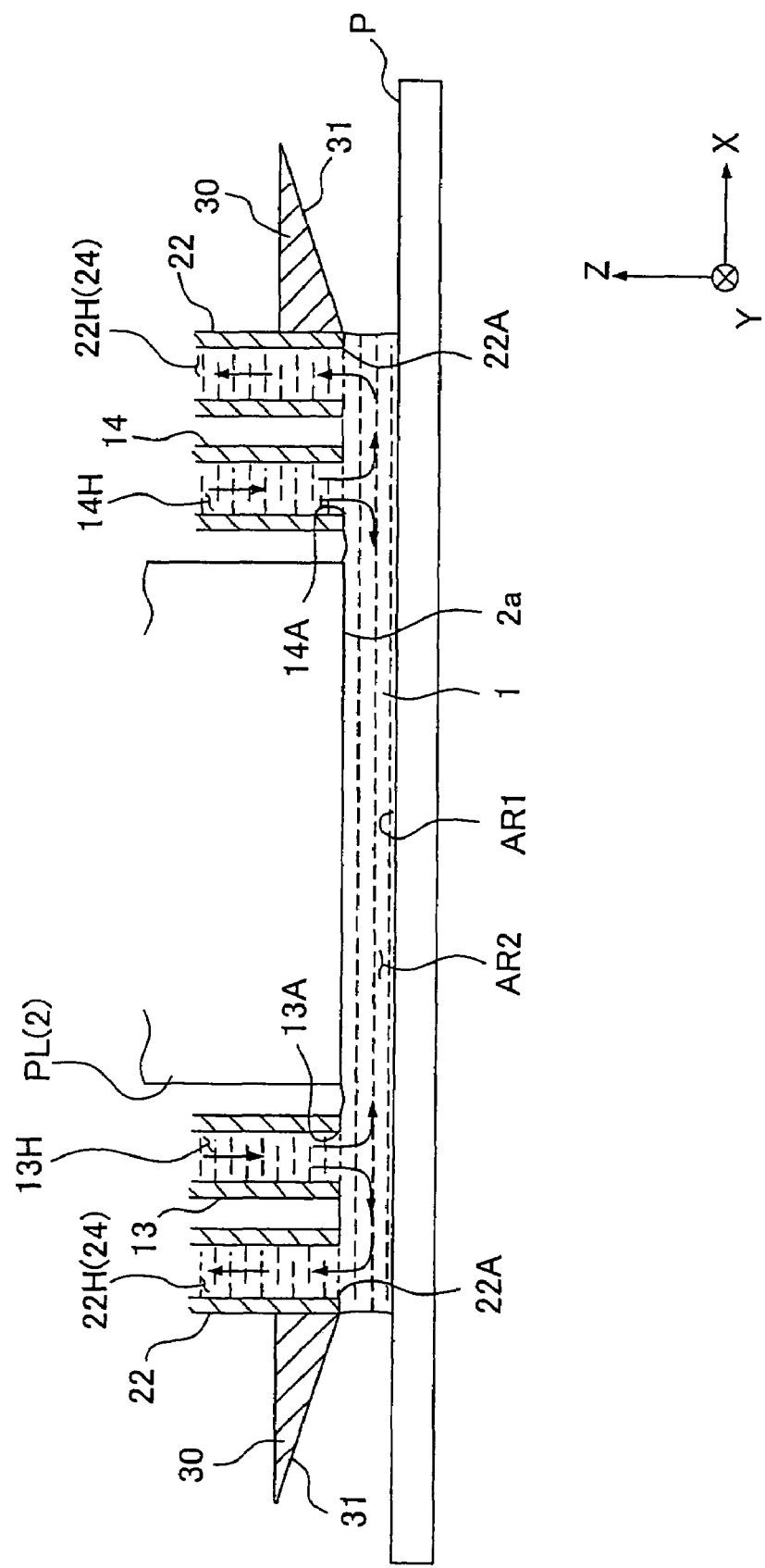
FIG. 4 shows a side sectional view illustrating a schematic arrangement of the liquid supply mechanism and the liquid recovery mechanism as the characteristic features of the present invention.

FIG. 4 shows a magnified side sectional view illustrating major parts to depict the first and second supply members 13, 14 and the recovery member 22 arranged closely to the substrate P. As shown in FIG. 4, the respective internal flow passages 13H, 14H of the first and second supply members 13, 14 of the liquid supply mechanism 10 are provided substantially perpendicularly to the surface of the substrate P. Similarly, the internal flow passage 22H (divided space 24) of the recovery member 22 of the liquid recovery mechanism 20 is also provided substantially perpendicularly to the surface of the substrate P. The supply positions of the liquid 1 supplied by the first and second supply members 13, 14 to the substrate P (positions of installation of the supply ports 13A, 14A) are set between the liquid recovery position of the liquid recovery mechanism 20 (position of installation of the recovery port 22A) and the projection area AR1. The projection optical system PL and the respective first and second supply members 13, 14 are provided while being separated from each other by predetermined distances. The recovery member 22 and the respective first and second supply members 13, 14 are provided while being separated from each other by predetermined distances as well. In this embodiment, the distance between the surface of the substrate P and the supply port 13A, 14A, the distance between the surface of the substrate P and the recovery port 22A, and the distance between the surface of the substrate P and the lower end surface of the projection optical system PL are set to be approximately identical to one another. In other words, the positions (heights) in the Z direction are set to be identical for the supply ports 13A, 14A, the recovery port 22A, and the lower end surface of the projection optical system PL respectively.

The liquid 1, which is supplied from the supply ports 13A, 14A of the first and second supply members 13, 14 to the substrate P in the direction substantially perpendicular to the substrate surface, is fed so that the liquid 1 is spread while causing the wetting between the substrate P and the lower end surface of the end portion (optical element 2) of the projection optical system PL. Further, the liquid 1, which outflows to the outside of the supply members 13, 14 with respect to the projection area AR1, is recovered (sucked) in the direction substantially perpendicular to the substrate surface from the recovery port 22A of the recovery member 22 which is arranged outside the supply members 13, 14 with respect to the projection area AR1.

In this embodiment, at least the members for allowing the liquid 1 to flow therein, which are included in the respective members for constructing the liquid supply mechanism 10 and the liquid recovery mechanism 20, are formed of, for example, synthetic resin such as polytetrafluoroethylene. Accordingly, it is possible to suppress the contamination of the liquid 1 with any impurity.

The trap member 30, which is formed with the liquid trap surface 31 having predetermined lengths to capture the liquid 1 unsuccessfully recovered by the recovery member 22 of the liquid recovery mechanism 20, is provided outside the recovery member 22 of the liquid recovery mechanism 20 in relation to the projection area AR1. The trap member 30 is attached to the outer side surface of the recovery member 22. The trap surface 31 is the surface (i.e., the lower surface) of the trap member 30 directed toward the substrate P. The trap surface 31 is inclined with respect to the horizontal plane as shown in FIG. 4. Specifically, the trap surface 31 is inclined to make separation from the surface of the substrate P (to be directed upwardly) at outer positions with respect to the projection area AR1 (liquid immersion area AR2). The trap member 30 is formed of, for example, metal such as stainless steel.

As shown in FIG. 2, the trap member 30 is an annular member as viewed in the plan view. The trap member 30 is connected to the outer side surface of the recovery member 22 so that the trap member 30 is fitted to the recovery member 22. The trap surface 31 of the trap member 30 is arranged to surround the projection area AR1 (liquid immersion area AR2). In this embodiment, the trap member 30 and the trap surface 31 as the lower surface thereof are substantially elliptical as viewed in the plan view. That is, the trap surface 31 of the trap member 30 is provided such that the length in the radial direction differs depending on the position on the basis of the optical axis AX of the projection optical system PL. In this embodiment, the length of the trap surface 31 in the scanning direction (X axis direction) is longer than that in the non-scanning direction (Y axis direction). More specifically, the length of the trap surface 31 is the longest at the position corresponding to the center of the projection area AR1 in the Y axis direction.

A lyophilic or liquid-attracting treatment (water-attracting treatment) is applied to the trap surface 31 to enhance the affinity for the liquid 1. In this embodiment, the liquid 1 is water. Therefore, the surface treatment, which is in conformity with the affinity for water, is applied to the trap surface 31. The surface of the substrate P is coated with a water-repelling (with a contact angle of about 70 to 80°) photosensitive material (for example, TARF-P6100 produced by TOKYO OHKA KOGYO CO., LTD.) for the ArF excimer laser. The liquid affinity of the trap surface 31 for the liquid 1 is higher than the liquid affinity of the surface of the substrate P for the liquid 1.

The surface treatment for the trap surface 31 is performed depending on the polarity of the liquid 1. In this embodiment, the liquid 1 is water having large polarity. Therefore, as for the liquid-attracting treatment for the trap surface 31, a thin film is formed with a substance such as alcohol having a molecular structure with large polarity. Accordingly, the liquid-attracting property or hydrophilicity is given to the trap surface 31. Alternatively, the water-attracting property or hydrophilicity can be also given to the trap surface 31 by applying an $O_2$ plasma treatment in which the plasma treatment is performed by using, for example, oxygen ($O_2$) gas as the treatment gas. As described above, when water is used as the liquid 1, it is desirable to adopt such a treatment that substance having the molecular structure with the large polarity such as the OH group is arranged on the trap surface 31. In this case, the thin film for the surface treatment is formed of a material which is insoluble in the liquid 1. The treatment condition of the liquid-attracting treatment is appropriately changed depending on the material characteristic of the liquid 1 to be used.

Next, an explanation will be made about a method for exposing the substrate P with the pattern image of the mask M by using the exposure apparatus EX described above.

Figure 5:
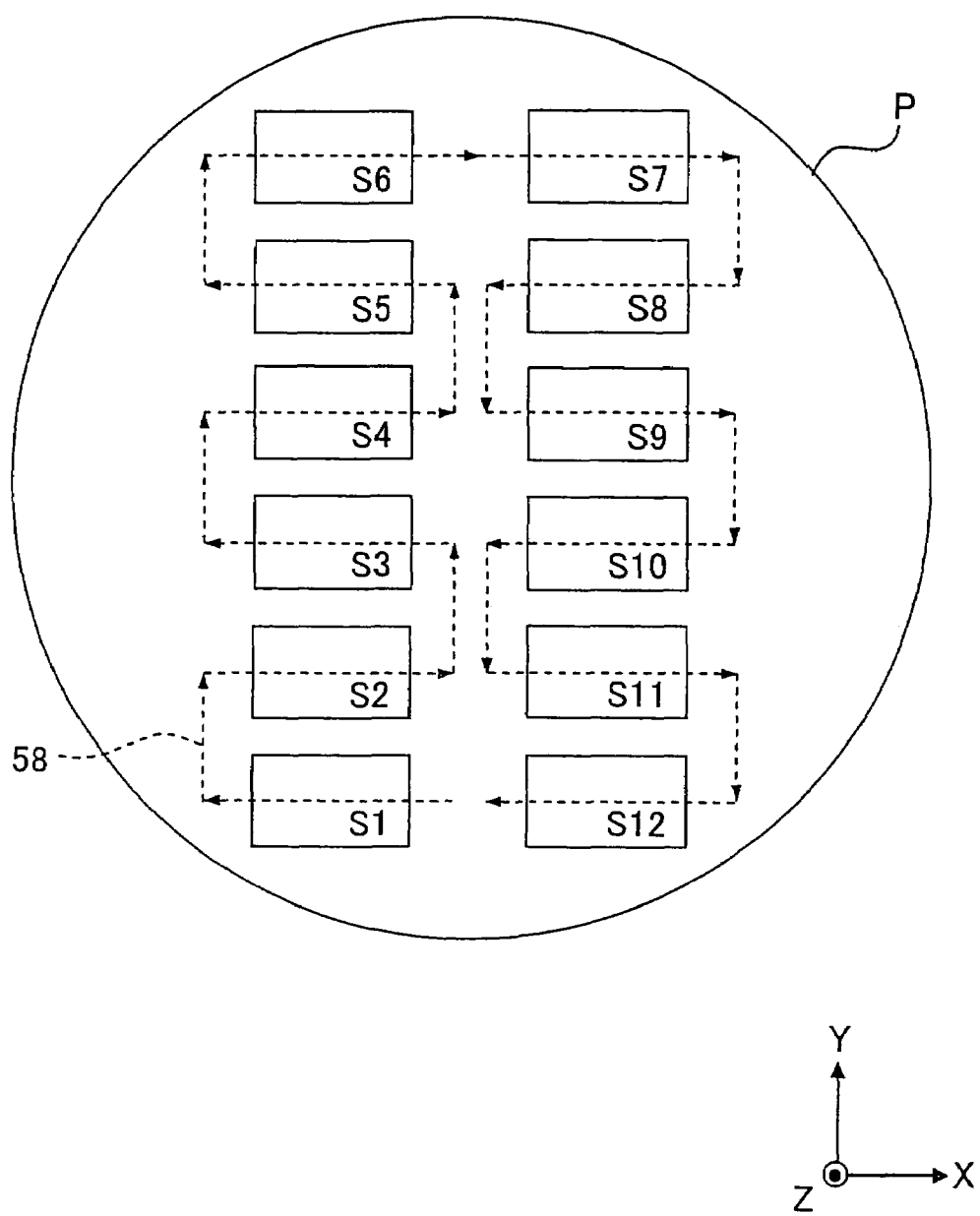
FIG. 5 shows shot areas established on a substrate.

In this embodiment, the exposure apparatus EX performs the projection exposure for the pattern image of the mask M onto the substrate P while moving the mask M and the substrate P in the X axis direction (scanning direction). During the scanning exposure, a part of the pattern image of the mask M is projected onto the rectangular projection area AR1 disposed just under the end portion of the projection optical system PL. The mask M is moved at the velocity V in the −X direction (or in the +X direction) with respect to the projection optical system PL, in synchronization with which the substrate P is moved at the velocity β·V (β represents the projection magnification) in the +X direction (or in the −X direction) by the aid of the XY stage 53. As shown in a plan view of FIG. 5, a plurality of shot areas S1 to S12 are set on the substrate P. After the exposure is completed for one shot area, the next shot area is moved to the scanning start position in accordance with the stepping movement of the substrate P. The scanning exposure process is successively performed thereafter for the respective shot areas while moving the substrate P in the step-and-scan manner. In this embodiment, the control unit CONT moves the XY stage 53 while monitoring the output of the laser interferometer 56 so that the optical axis AX of the projection optical system PL is advanced along broken line arrows 58 as shown in FIG. 5.

At first, the mask M is loaded on the mask stage MST, and the substrate P is loaded on the substrate stage PST (see FIG. 1). Subsequently, when the scanning exposure process is performed, the control unit CONT drives the liquid supply mechanism 10 to start the operation to supply the liquid onto the substrate P. The liquid 1, which is supplied from the first and second liquid supply units 11, 12 of the liquid supply mechanism 10 respectively in order to form the liquid immersion area AR2, flows through the supply tubes 11A, 12A, and then the liquid 1 is supplied onto the substrate P via the first and second supply members 13, 14 to form the liquid immersion area AR2 between the projection optical system PL and the substrate P. In this embodiment, as shown in FIG. 4, the liquid 1, which has flown through the supply tubes 11A, 12A, is spread in the widthwise directions of the internal flow passages 13H, 14H of the supply members 13, 14. The liquid 1 is supplied to wide ranges on the substrate P from the supply ports 13A, 14A. In this arrangement, the supply ports 13A, 14A are arranged on the both sides of the projection area AR1 in the X axis direction (scanning direction). The control unit CONT simultaneously supplies the liquid 1 onto the substrate P from the both sides of the projection area AR1 through the supply ports 13A, 14A of the liquid supply mechanism 10.

The liquid supply mechanism 10 simultaneously supplies the liquid 1 from the supply ports 13A, 14A provided on the both sides of the projection area AR1, i.e., from the plurality of positions which are apart, in the plurality of different directions (+X direction, −X direction), from the projection area AR1. Accordingly, the liquid 1, which is supplied onto the substrate P from the supply ports 13A, 14A, forms the liquid immersion area AR2 in a range which is wider than at least the projection area AR1.

In this embodiment, when the liquid 1 is supplied to the substrate P from the both sides of the projection area AR1 in the scanning direction, the control unit CONT controls the operation of the first and second liquid supply units 11, 12 of the liquid supply mechanism 10 to supply the liquid so that the supply amount per unit time of the liquid supplied from the place in front of the projection area AR1 in relation to the scanning direction is set to be larger than the supply amount of the liquid supplied from the place on the opposite side. For example, when the exposure process is performed while moving the substrate P in the +X direction, the control unit CONT is operated such that the amount of the liquid supplied from the −X side with respect to the projection area AR1 (i.e., from the supply port 13A) is larger than the amount of the liquid supplied from the +X side (i.e., from the supply port 14A). On the other hand, when the exposure process is performed while moving the substrate P in the −X direction, the amount of the liquid supplied from the +X side with respect to the projection area AR1 is larger than the amount of the liquid supplied from the −X side.

The control unit CONT drives the liquid recovery unit 21 of the liquid recovery mechanism 20 to perform the operation to recover the liquid on the substrate P concurrent with the operation to supply the liquid 1 by the liquid supply mechanism 10. Accordingly, as shown in FIG. 4, the liquid 1 on the substrate P, which flows to the outside of the supply ports 13A, 14A with respect to the projection area AR1, is recovered from the recovery port 22A. The liquid 1, which has been recovered from the recovery port 22A, passes through the divided spaces 24 comparted by the partition members 23 respectively, and then the liquid 1 is collected to the manifold 25. The liquid 1, which has been collected to the manifold 25, passes through the recovery tube 21A, and the liquid 1 is recovered by the liquid recovery unit 21. As described above, this embodiment is provided with the structure in which the plurality of divided spaces 24 are connected to the one liquid recovery unit 21. The liquid recovery mechanism 20 simultaneously recovers the liquid 1 from the substrate P through the recovery port 22A provided to surround the projection area AR1 from the plurality of positions which are apart, in the plurality of different directions, from the projection area AR1, i.e., from the four sides of the rectangular projection area AR1 (from the side in the +X direction, the side in the −X direction, the side in the +Y direction, and the side in the −Y direction).

The control unit CONT operates the liquid supply mechanism 10 and the liquid recovery mechanism 20 to recover the liquid 1 from the substrate P concurrently with the supply of the liquid 1 to the surface of the substrate P, while the pattern image of the mask M is projected onto the substrate P to perform the exposure via the projection optical system PL and the liquid 1 disposed between the projection optical system PL and the substrate P, while moving, in the X axis direction (scanning direction), the substrate stage PST which supports the substrate P. During this process, the liquid supply mechanism 10 simultaneously supplies the liquid 1 through the supply ports 13A, 14A from the both sides of the projection area AR1 in relation to the scanning direction. Therefore, the liquid immersion area AR2 is formed uniformly and satisfactorily. Further, the liquid recovery mechanism 20 simultaneously recovers the liquid 1 at the plurality of positions around the projection area AR1 including the both sides of the projection area AR1 in the scanning direction through the recovery port 22A of the recovery member 22 which surrounds the projection area AR1. Therefore, the liquid 1 is prevented from the scattering and the outflow to the surroundings of the substrate P. In this embodiment, pure water, which has the low affinity for the photosensitive material on the surface of the substrate P, is supplied as the liquid 1. Therefore, it is possible to smoothly perform the recovery by the liquid recovery mechanism 20.

FIG. 6A schematically shows the behavior of the liquid 1 when the exposure process is performed for the first shot area (for example, S1, S3, etc. shown in FIG. 5) set on the substrate P while moving the substrate P in the +X direction. With reference to FIG. 6A, the liquid 1 is simultaneously supplied from the supply ports 13A, 14A to the space between the projection optical system PL and the substrate P. Accordingly, the liquid immersion area AR2 is formed to include the projection area AR1. In this procedure, the amount of the liquid 1 supplied per unit time from the supply port 13A provided on the −X side with respect to the projection area AR1 is set to be larger than the amount of the liquid supplied per unit time from the supply port 14A provided on the +X side. Therefore, the liquid 1, which is supplied from the supply port 13A, is smoothly arranged in the space between the projection optical system PL and the substrate P as if the liquid 1 is pulled by the substrate P moving in the +X direction. The liquid 1, which intends to outflow to the outside of the supply ports 13A, 14A, is recovered from the recovery port 22A to suppress the occurrence of any inconvenience which would be otherwise caused such that the liquid 1 outflows to the surroundings of the substrate P.

In such a situation, when the substrate P is moved in the +X direction, then the amount of the liquid moved toward the +X side with respect to the projection area AR is increased, and the recovery port 22A, which has the liquid recovery position disposed on the +X side, cannot recover all of the liquid 1 in some cases. However, as shown in FIG. 6A, the liquid 1, which is unsuccessfully recovered by the recovery port 22A on the +X side, is captured by the trap surface 31 of the trap member 30 provided on the +X side with respect to the liquid recovery position. Therefore, the liquid 1 does not cause the scattering and the outflow, for example, to the surroundings of the substrate P. In this embodiment, the trap surface 31 is subjected to the liquid-attracting treatment for the liquid 1, and the trap surface 31 has the affinity for the liquid higher than that of the surface of the substrate P. Therefore, the liquid 1, which intends to outflow to the outside of the liquid recovery position of the recovery port 22A, is not pulled toward the substrate P but is pulled toward the trap surface 31. Accordingly, the occurrence of any inconvenience is suppressed, which would be otherwise caused for example, such that the liquid 1 remains on the substrate P.

In this embodiment, the trap surface 31 is inclined in the upward direction at the outer positions on the basis of the liquid immersion area AR2 including the projection area AR1. Therefore, it is possible to avoid the outflow of the liquid 1 to the outside more effectively. In other words, owing to the inclination in the upward direction, the second volume of the space between the substrate P and the trap surface 31 is larger than the first volume of the space between the substrate P and the projection optical system PL (volume corresponding to the unit area of the substrate P). Therefore, the liquid 1, which intends to outflow, is smoothly retained by the portion of the second volume. Further, owing to the inclination in the upward direction, the fluid energy, which urges the outflow to the outside, is converted into the potential energy as a result of the movement in the upward direction along the trap surface 31. Accordingly, it is possible to effectively avoid the outflow of the liquid 1 to the outside.

The amount of the liquid supplied from the supply port 14A provided on the +X side is set to be smaller than the amount of the liquid supplied from the supply port 13A provided on the −X side. That is, the amount of the liquid supplied from the supply port 14A disposed at the position nearer to the recovery port 22A on the +X side as compared with the supply port 13A is set to be small. Therefore, even when the liquid 1 is pulled by the substrate P which is moved toward the +X side, the amount of the liquid of the outflow to the outside from the +X side of the substrate P is suppressed.

When the exposure process is completed for the first shot area, the control unit CONT causes the stepping movement of the substrate P in order that the projection area AR1 of the projection optical system PL is arranged on the second shot area which is different from the first shot area. Specifically, the control unit CONT causes the stepping movement in the Y axis direction between the two shot areas S1, S2 on the substrate P, for example, in order to perform the scanning exposure process for the shot area S2 after the completion of the scanning exposure process for the shot area S1. In this procedure, the liquid supply mechanism 10 is operated such that the supply amount of the liquid 1 during the stepping movement between the two shot areas on the substrate P is different from the supply amount during the exposure for the shot area. Specifically, the control unit CONT is operated such that the supply amount of the liquid supplied per unit time from the liquid supply mechanism 10 onto the substrate P during the stepping movement is smaller than the supply amount of the liquid supplied during the scanning exposure for the shot area. Accordingly, it is possible to suppress the supply amount of the liquid supplied to the substrate P during the stepping movement which does not contribute to the exposure process. It is possible to suppress the amount of use of the liquid in the entire exposure process (until the substrate P is unloaded from the substrate stage PST after the substrate P has been loaded on the substrate stage PST and the exposure process has been completed for all of the shot areas S1 to S12). As described above, the control unit CONT changes the liquid supply amount per unit time of each of the first and second liquid supply units 11, 12 depending on the movement operation for the substrate P (stepping movement or scanning movement) which constitutes a part of the executing operation of the exposure process.

In this embodiment, the liquid supply mechanism 10 reduces the supply amount per unit time of the liquid 1 during the stepping movement of the substrate P, but the operation to supply the liquid 1 is maintained (continued). In other words, the liquid supply mechanism 10 maintains (continues) the operation to supply the liquid from the supply ports 13A, 14A even when the scanning direction is changed due to the change of the shot area and even when the stepping movement is performed. As described above, when the plurality of shot areas on the substrate P are successively subjected to the exposure, the liquid-supply mechanism 10 continuously supplies the liquid 1 from the supply ports 13A, 14A provided at the plurality of positions, while the liquid supply position is not changed depending on the scanning direction, and the liquid supply position is not changed during the stepping movement. In other words, the liquid supply mechanism 10 continuously supplies the liquid 1 from the plurality of positions until a series of the exposure process operation is completed in relation to one substrate P (until the substrate P is unloaded from the substrate stage PST after the substrate P has been loaded on the substrate stage PST and the exposure process has been completed for all of the shot areas S1 to S12). Accordingly, it is possible to avoid the occurrence of the vibration of the liquid (water hammer phenomenon) which would be otherwise caused by the supply and the stop of the liquid 1.

FIG. 6B schematically shows the behavior of the liquid 1 when the exposure process is performed for the second shot area (for example, S2, S4, etc. shown in FIG. 5) set on the substrate P while moving the substrate P in the −X direction. With reference to FIG. 6B, the liquid 1 is supplied from the supply ports 13A, 14A to the space between the projection optical system PL and the substrate P. Accordingly, the liquid immersion area AR2 is formed to include the projection area AR1. In this procedure, the amount of the liquid 1 supplied per unit time from the supply port 14A provided on the +X side with respect to the projection area AR1 is set to be larger than the amount of the liquid 1 supplied per unit time from the supply port 13A provided on the −X side. Therefore, the liquid 1, which is supplied from the supply port 14A is smoothly arranged in the space between the projection optical system PL and the substrate P as if the liquid 1 is pulled by the substrate P moving in the −X direction. As described above, the control unit CONT changes the liquid supply amount per unit time of each of the first and second liquid supply units 11, 12 depending on the movement direction (movement operation) for the substrate P which constitutes a part of the executing operation of the exposure process. The liquid 1, which intends to outflow to the outside of the supply ports 13A, 14A, is recovered from the recovery port 22A to suppress the occurrence of any inconvenience which would be otherwise caused such that the liquid 1 outflows to the surroundings of the substrate P.

In such a situation, when the substrate P is moved in the −X direction, then the liquid 1, which is captured by the trap surface 31 on the +X side, is moved downwardly along the trap surface 31, and the liquid 1 is recovered from the recovery port 22A of the liquid recovery mechanism 20. Accordingly, it is possible to reliably avoid the remaining and the outflow of the liquid 1 to the outside. The amount of the liquid moved toward the −X side is increased as the substrate P is moved toward the −X side. Accordingly, even when all of the liquid 1 is unsuccessfully recovered by the recovery port 22A on the −X side, the liquid 1 is captured by the trap surface 31 of the trap member 30 provided on the −X side from the liquid recovery position as shown in FIG. 6B.

In this embodiment, the trap surface 31 is formed so that the trap surface 31 is inclined in the upward direction at the outer positions with respect to the projection area AR1. However, the trap surface 31 may be horizontal (0 degree). On the other hand, if the trap surface 31 is inclined in the downward direction, the fluid energy, which intends to outflow to the outside, is not converted into the potential energy. Further, when the substrate P is moved in the opposite direction as well, the fluid 1 is not moved to the recovery port 22A to make downward movement along the trap surface 31. For this reason, it is impossible to smoothly recover the liquid 1 from the recovery port 22A. Therefore, it is preferable that the trap surface 31 is a horizontal surface (0 degree) or an inclined surface directed in the upward direction.

When the liquid supply amount per unit time to be supplied onto the substrate P is large, and/or when the scanning velocity is high, then the liquid amount to outflow to the outside is increased as well. Therefore, the angle of inclination of the trap surface 31 is designed to be a most appropriate angle depending on the liquid supply amount and the scanning velocity. In other words, when the liquid supply amount is large and/or when the scanning velocity is high, then the angle of inclination of the trap surface 31 is set to be large. On the other hand, if the angle of inclination of the trap surface 31 is too large, the liquid 1 cannot be captured (retained) sufficiently by the trap surface 31 in some cases. In such a situation, the liquid-retaining force of the trap surface 31 is increased by enhancing the liquid-attracting property brought about by the liquid-attracting treatment. Therefore, when the angle of inclination is increased, the treatment condition of the liquid-attracting treatment is changed to give the most appropriate liquid-attracting property to the trap surface 31. Accordingly, even when the angle of inclination is increased, it is possible to retain the liquid 1. Thus, the angle of inclination of the trap surface 31 is set to be the optimum angle on the basis of the respective parameters including, for example, the liquid supply amount, the scanning velocity, and the material characteristic of the liquid (liquid-attracting property of the trap surface).

The recovery member 22 of this embodiment is constructed to possess the recovery port 22A which is formed continuously to have the annular shape, the partition members 23 which are provided in the recovery port 22A, and the plurality of divided spaces 24 which are divided by the partition members 23, wherein the liquid recovery unit 21 is connected via the recovery tube 21A to the manifold 25 to which the plurality of divided spaces 24 are collected. Accordingly, it is enough that one liquid recovery unit 21 is provided, which is constructed while including the vacuum pump and the like. Therefore, the arrangement of the apparatus can be simplified. In some situations, the suction load, which is exerted to recover the liquid 1, may differ among the respective positions of the recovery member 22 in the circumferential direction. In such a state, the suction force of the liquid recovery unit 21 may be lowered, and it is impossible to smoothly perform the recovery operation. However, the provision of the partition members 23 makes it possible to smoothly perform the recovery operation. That is, for example, the following state may be sometimes caused due to the behavior the liquid 1. Only the liquid 1 is recovered (sucked) from the recovery port 22A on the +X side of the recovery member 22, while the liquid 1 with the air (mixed with the air) is sucked from the recovery port 22A on the −X side. In such a situation, the air-mixed area is spread in the recovery port 22A on the −X side, and the following inconvenience may arise. That is, when the liquid 1 is recovered by the liquid recovery unit 21 provided as one line as in this embodiment, the mixed air lowers the suction force of the vacuum pump which constitutes the liquid recovery unit 21. However, the area, in which only the liquid 1 is sucked, can be spatially separated from the air-mixed area by providing the mutually independent divided spaces 24 by providing the partition members 23 at the interior (in the internal space 22H) of the recovery port 22A which is continuously formed. Therefore, it is possible to avoid the occurrence of any inconvenience which would be otherwise caused such that the air-mixed area is spread and/or the suction force of the liquid recovery unit 21 is lowered by the mixed air. Accordingly, the liquid recovery mechanism 20 can smoothly recover the liquid 1 even when the liquid recovery unit 21 is provided as one line.

As explained above, the liquid supply mechanism 10 is provided, which simultaneously supplies the liquid 1 onto the substrate P at the plurality of positions which are apart, in the plurality of different directions, from the projection area AR1 (from the plurality of mutually different sides of the projection area AR1) in order to form the liquid immersion area AR2. Therefore, even when the substrate P is moved in the plurality of directions including the scanning direction (±X directions) and the stepping direction (±Y directions), the liquid immersion area AR2 can be always formed smoothly and satisfactorily between the projection optical system PL and the substrate P. Therefore, the exposure process can be performed at the high resolution and the wide depth of focus.

The liquid 1 is continuously supplied from the plurality of positions by the liquid supply mechanism 10 when the plurality of shot areas on the substrate P are successively subjected to the exposure process respectively. Therefore, it is possible to avoid the occurrence of the liquid vibration (water hammer phenomenon) which would be otherwise caused by the supply and the stop of the liquid 1. Thus, it is possible to avoid the deterioration of the pattern to be transferred.

The liquid supply mechanism 10 supplies the liquid 1 from the both sides of the projection area AR1 in the scanning direction through the supply ports 13A, 14A. Therefore, the supplied liquid 1 is spread while causing the wetting over the projection area AR1 as if the liquid 1 is pulled by the substrate P moving in the scanning direction. Therefore, the liquid immersion area AR2 is smoothly formed to include the projection area AR1. In this embodiment, the liquid supply mechanism 10 is operated such that the amount of the liquid supplied from the position in front of the projection area AR1 in relation to the scanning direction is larger than the amount of the liquid supplied from the position on the opposite side. Therefore, the liquid 1, which is supplied onto the substrate P, flows in the movement direction of the substrate P as if the liquid 1 is pulled by the moving substrate P. The liquid 1 is smoothly arranged as if the liquid 1 is attracted and introduced into the space between the projection optical system PL and the substrate P. Therefore, the liquid 1, which is supplied from the liquid supply mechanism 10, is smoothly arranged between the projection optical system PL and the substrate P even when the supply energy thereof is small. It is possible to form the liquid immersion area AR2 satisfactorily. The direction of the flow of the liquid 1 can be switched by changing the amount of the liquid supplied from the supply ports 13A, 14A respectively depending on the scanning direction. Accordingly, the liquid immersion area AR2 can be smoothly formed between the projection optical system PL and the substrate P even when the substrate P is subjected to the scanning in any one of the directions of the +X direction and the −X direction. Thus, it is possible to obtain the high resolution and the wide depth of focus.

The recovery member 22 of the liquid recovery mechanism 20 is formed circularly and annularly to surround the projection area AR1 and the supply members 13, 14. The liquid 1 is simultaneously recovered from the surface of the substrate P at the plurality of positions (from the plurality of different sides of the projection area AR1) which are apart, in the plurality of different directions, from the projection area AR1. Therefore, it is possible to reliably avoid the occurrence of the inconvenience including, for example, the scattering and the outflow of the liquid 1 to the outside of the substrate P. That is, the liquid recovery mechanism 20 continuously performs the recovery operation from the recovery port 22A arranged to surround the projection area AR1 until a series of the exposure process operation is completed for one substrate P (until the liquid 1, which has formed the liquid immersion area AR2, is completely recovered after the exposure process has been completed for all of the shot areas S1 to S12 on the substrate P). Therefore, even when the liquid 1 is spread while causing the wetting in any direction during the operation of the series of the exposure process for the substrate P, the liquid 1 can be recovered in a well-suited manner. Further, it is unnecessary to stop the suction of the liquid through the recovery port 22 during the operation of the series of the exposure process in relation to the substrate P. Therefore, it is possible to suppress the vibration caused by the stop of the suction of the liquid.

The apparatus is provided with the trap member 30 for capturing the liquid 1 unsuccessfully recovered by the liquid recovery mechanism 20. Accordingly, it is possible to avoid the occurrence of the inconvenience including, for example, the scattering and the outflow of the liquid 1 to the outside of the substrate P. In this embodiment, the trap surface 31 is formed to have the elliptical shape as viewed in the plan view, in which the longitudinal direction extends in the scanning direction (X axis direction) in which the liquid 1 is most likely to outflow to the outside of the substrate P. Therefore, it is possible to reliably avoid the outflow of the liquid 1 to the outside. The liquid-attracting treatment is applied to the trap surface 31 to enhance the affinity for the liquid 1. Therefore, it is possible to satisfactorily capture the liquid 1 which intends to outflow. Further, the surface treatment is applied so that the affinity of the trap surface 31 for the liquid is higher than the affinity of the surface of the substrate P for the liquid. Therefore, the liquid 1, which intends to outflow to the outside, is captured by the trap surface 31 without being adhered to the substrate P. Accordingly, it is possible to avoid the occurrence of any inconvenience which would be otherwise caused such that the liquid 1 remains on the surface of the substrate P. The trap surface 31 is inclined in the upward direction at the outer positions with respect to the projection area AR1. Therefore, the liquid 1, which intends to outflow to the outside, can be captured satisfactorily. Further, when the scanning direction for the substrate P is reversed to the opposite direction, then the captured liquid 1 is moved in the downward direction along the trap surface 31, and hence the liquid 1 is satisfactorily recovered by the recovery port 22A which is connected to the trap surface 31.

The liquid (water) 1, which has the affinity for the liquid contact surface 2a disposed at the end of the projection optical system PL that is higher than the affinity for the photosensitive material coated on the surface of the substrate P, is supplied from the liquid supply mechanism 10 to perform the liquid immersion exposure. Therefore, the optical path between the projection optical system PL and the substrate P can be reliably filled with the liquid 1. Further, the liquid (1), which is supplied onto the substrate (P), is smoothly recovered. Thus, it is possible to avoid the inconvenience including, for example, the scattering and the outflow of the liquid 1.

In this embodiment, when the liquid 1 is supplied from the both sides of the projection area AR1 in the scanning direction, the amount of the liquid supplied from the front position in relation to the scanning direction is larger than the amount of the liquid supplied on the side opposite thereto. However, the same amounts of the liquid 1 may be supplied from the both sides of the projection area AR1. Also in this case, the supply amount of the liquid 1 is not varied even when the scanning direction is switched. Therefore, it is possible to more reliably avoid the occurrence of the water hammer phenomenon. On the other hand, when the amounts of the liquid supplied from the both sides of the projection area AR1 in the scanning direction are changed depending on the scanning direction while continuously supplying the liquid 1, it is possible to suppress the amount of use of the liquid 1 while suppressing the occurrence of the water hammer phenomenon.

The embodiment of the present invention is constructed such that the liquid 1 is continuously supplied from the supply ports 13A, 14A during the operation of the exposure process for one piece of the substrate P. However, the supply may be stopped during the operation. For example, the following procedure may be also available. That is, when the substrate P is subjected to the scanning movement toward the +X side, then the liquid supply from the supply port 14A is stopped, and the liquid 1 is supplied from only the supply port 13A. When the substrate P is subjected to the scanning movement toward the −X side, then the liquid supply from the supply port 13A is stopped, and the liquid 1 is supplied from only the supply port 14A. Further, it is also available that the liquid supply mechanism 10 stops the supply of the liquid 1 to the substrate P during the stepping movement of the substrate P. In this procedure, the scanning exposure may be started as follows. That is, the liquid 1 is supplied for a predetermined period of time, and the scanning exposure is performed after waiting for the convergence of the vibration of the liquid. When the procedure or the arrangement as described above is adopted, it is possible to suppress the amount of use of the liquid 1. On the other hand, when the liquid 1 is continuously supplied, it is possible to improve the throughput, because it is unnecessary to set any waiting time for the convergence of the vibration of the liquid.

This embodiment is constructed such that the supply ports 13A, 14A of the liquid supply mechanism 10 are provided on the both sides in the scanning direction with respect to the projection area AR1. However, for example, supply ports (supply members) may be also provided to surround all of the circumference of the projection area AR1, i.e., also on the both sides of the projection area AR1 in the non-scanning direction. The liquid 1 may be supplied onto the substrate P from the respective supply ports provided to surround the projection area AR1. In this arrangement, when the supply ports are provided on the both sides of the projection area AR1 in the scanning direction respectively and on the both sides in the non-scanning direction respectively, i.e., when the mutually independent four supply ports are provided to surround the projection area AR1, then the liquid 1 may be supplied from all of the four supply ports, or the liquid 1 may be supplied from only the supply ports provided on the both sides in the scanning direction while the liquid supply may be stopped (or a small amount of the liquid may be supplied) from the supply ports provided on the both sides in the non-scanning direction, when the exposure process is performed while moving the substrate P in the scanning direction. The liquid may be supplied from the supply ports provided on the both sides in the non-scanning direction, when the substrate P is moved in the non-scanning direction. Alternatively, the following arrangement is also available. That is, an annular supply member is provided to surround the projection area AR1, and the liquid 1 is supplied onto the substrate P by the aid of the supply member. In this arrangement, it is enough that one liquid supply unit is provided to feed the liquid 1 to the supply member. Therefore, it is possible to simplify the arrangement of the apparatus. On the other hand, when the supply ports 13A, 14A are provided on the both sides in the scanning direction with respect to the projection area AR1 as in the embodiment described above, the liquid immersion area AR2 can be sufficiently formed for the projection area AR1. Thus, it is possible to suppress the amount of use of the liquid 1.

This embodiment is constructed such that the supply ports 13A, 14A of the liquid supply mechanism 10 are provided on the both sides in the scanning direction with respect to the projection area AR1. However, when the space between the projection optical system PL and the substrate P is sufficiently filled with the liquid 1, the liquid may be supplied from one supply port arranged near to the projection area AR1. Also in this case, it is possible to suppress the amount of use of the liquid 1 while suppressing the occurrence of the water hammer phenomenon by continuously supplying the liquid from the one supply port until the exposure is completed for all of the shot areas on one substrate P.

In the embodiment described above, the first and second supply members 13, 14 and the recovery member 22 are separated from each other. However, the first and second supply members 13, 14 and the recovery member 22 may be connected to one another. Alternatively, connecting members may be provided between the first and second supply members 13, 14 and the recovery member 22 to connect them. The embodiment described above has been explained such that the internal flow passages 13H, 14H of the supply members 13, 14 and the internal flow passage 22H of the recovery member 22 are perpendicular to the surface of the substrate P. However, they may be inclined. For example, the internal flow passages 13H, 14H (or the supply ports 13A, 14A) of the supply members 13, 14 may be provided to be directed to the projection area AR1. Further, the distance (height) of the supply port 13A, 14A from the surface of the substrate P may be different from that of the recovery port 22A of the recovery member 22.

It is preferable that the liquid supply mechanism 10 including the supply members 13, 14 and the liquid recovery mechanism 20 including the recovery member 22 are respectively supported by a support member other than the projection optical system PL and a support member for supporting the projection optical system PL. Accordingly, it is possible to avoid the transmission, to the projection optical system PL, of the vibration generated in the liquid recovery mechanism 10 and/or the liquid recovery mechanism 20. On the contrary, when the projection optical system PL is allowed to make contact with the supply members 13, 14 without any gap, it is also possible to expect an effect to prevent the liquid 1 from mixing with the atmospheric air.

Another embodiment of the present invention will be explained below. In the following description, the same or equivalent constitutive parts as those of the embodiment described above are designated by the same reference numerals, any explanation of which will be simplified or omitted.

The liquid recovery mechanism 20 according to the embodiment described above is provided with the one liquid recovery unit 21, and the recovery member 22 which is connected to the liquid recovery unit 21 via the recovery tube 21A and which has the recovery port 22A formed continuously to have the annular shape. However, it is also allowable that a plurality of liquid recovery units are provided. Accordingly, it is possible to suppress the dispersion of the recovery force at each of the recovery positions of the recovery port 22A. Further, the control unit CONT may vary the respective recovery forces of the plurality of liquid recovery units depending on the liquid recovery positions. This arrangement will be explained with reference to FIG. 7.

Figure 7:
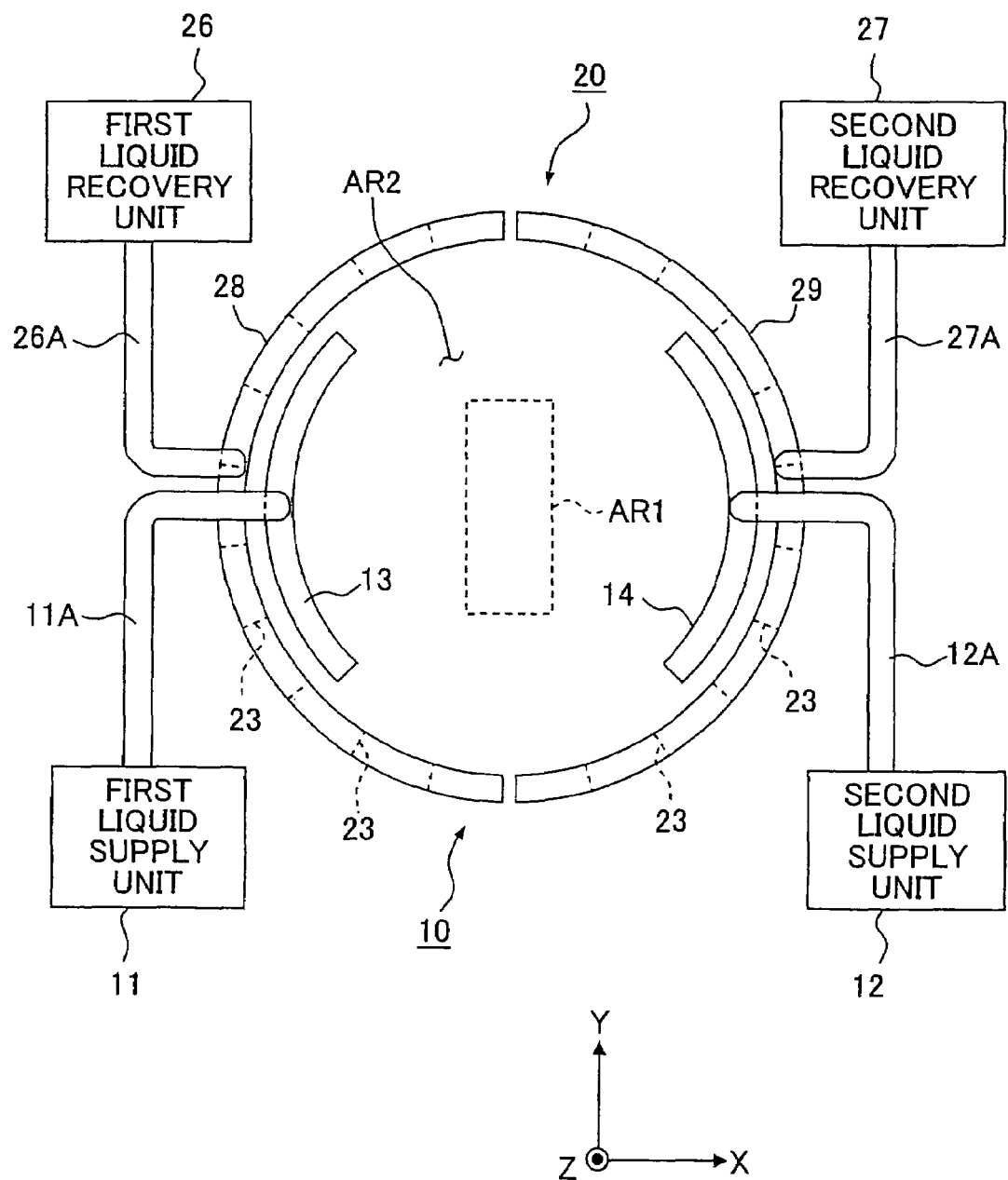
FIG. 7 shows another embodiment of a liquid supply mechanism and a liquid supply mechanism.

FIG. 7 shows another embodiment of the present invention, which schematically depicts a plan view illustrating another example of the liquid recovery mechanism 20. With reference to FIG. 7, the liquid recovery mechanism 20 includes a first liquid recovery unit 26, a second liquid recovery unit 27, a first recovery member 28 which is connected to the first liquid recovery unit 26 via a recovery tube 26A, and a second recovery member 29 which is connected to the second liquid recovery unit 27 via a recovery tube 27A. Each of the first and second recovery members 28, 29 is formed to be circular arc-shaped as viewed in the plan view. The first recovery member 28 is arranged on the −X side of the projection area AR1, while the second recovery member 29 is arranged on the +X side of the projection area AR1. Each of the first and second recovery members 28, 29 is provided with a recovery port which is directed toward the substrate P, and partition members which are provided therein, in the same manner as in the embodiment described above. The recovery operations of the first and second liquid recovery units 26, 27 are performed independently by the control unit CONT respectively.

When the shot area on the substrate P is subjected to the scanning exposure, then the control unit CONT supplies the liquid 1 from the liquid supply mechanism 10 onto the substrate P, and the control unit CONT drives the first and second liquid recovery units 26, 27 of the liquid recovery mechanism 20 respectively to recover the liquid 1 from the surface of the substrate P. In this embodiment, the control unit CONT controls the liquid recovery force of the liquid recovery mechanism 20 so that the liquid recovery force is varied depending on the liquid recovery position. Specifically, the control unit CONT makes the setting in relation to the scanning direction such that the recovery amount (recovery force) of the liquid recovered per unit time at the position in front of the projection area AR1 is smaller than the recovery amount of the liquid recovered on the side opposite thereto. That is, the liquid recovery force is increased on the front side (downstream side of the flow of the liquid 1) in the scanning direction. Specifically, when the substrate P is moved in the +X direction, the recovery force, which is exerted by the second recovery member 29 (second liquid recovery unit 27) provided on the +X side with respect to the projection area AR1, is larger than the recovery force which is exerted by the first recovery member 28 (first liquid recovery unit 26) provided on the −X side. Accordingly, it is possible to smoothly perform the operation to recover the liquid on the substrate P while avoiding the outflow of the liquid 1 to the outside.

The embodiment described above is constructed such that the operations to recover the liquid by the first and second liquid recovery units 26, 27 are performed simultaneously. However, the operations may be performed separately. For example, the following process is also available. That is, when the substrate P is moved in the +X direction, then the operation to recover the liquid is performed by using only the second recovery member 29 (second liquid recovery unit 27) provided on the +X side with respect to the projection area AR1, and the operation to recover the liquid, which is to be performed by using the first recovery member 28 (first liquid recovery unit 26), is stopped. In this case, the liquid 1 principally flows toward the +X side. Therefore, the liquid 1 can be recovered by only the recovery operation performed by the second liquid recovery unit 27.

In the respective embodiments described above, the recovery member of the liquid recovery mechanism 20 is arranged to surround the entire projection area AR1. However, the recovery members may be provided on only the both sides of the projection area AR1 in the scanning direction.

In the respective embodiments described above, the recovery member of the liquid recovery mechanism 20 is formed continuously to surround the projection area AR1. However, as shown in FIG. 8, a plurality of recovery members 22D may be arranged discontinuously or intermittently. Similarly, a plurality of supply members 13D, 14D may be arranged discontinuously or intermittently in relation to the liquid supply mechanism 10 as well. Also in this arrangement, the recovery operation is continuously performed with the recovery ports arranged to surround the projection area AR1. Therefore, the liquid 1 can be recovered satisfactorily even when the liquid 1 is spread while causing the wetting in any direction.

When a plurality of recovery members of the liquid recovery mechanism 20 are provided, for example, the liquid recovery force (liquid recovery amount per unit time) at the position apart from the projection area AR1 in the scanning direction may be increased by the liquid recovery mechanism 20 to be larger than the liquid recovery force at any different position, specifically at any position apart in the non-scanning direction. Accordingly, the liquid 1 on the substrate P can be smoothly recovered when the scanning exposure is performed.

Alternatively, a plurality of liquid recovery units each having a vacuum pump or the like may be connected through recovery tubes to the respective divided spaces 24 divided by the partition members 23 respectively to individually control the recovery operations of the plurality of liquid recovery units so that the recovery force may be varied depending on the liquid recovery position thereof. Alternatively, the recovery force may be varied depending on the liquid recovery position such that the liquid recovery units are not connected to the respective divided spaces 24 individually, one liquid recovery unit is connected to the plurality of divided spaces 24 through a plurality of recovery tubes respectively, and valves are provided for the recovery tubes respectively to adjust the valve opening degrees of the valves. Further, the recovery force can be varied for each of the divided spaces 24 by the pressure loss by changing the lengths of the plurality of recovery tubes as described above.

In the respective embodiments described above, the supply member of the liquid supply mechanism 10 has the substantially circular arc-shaped form as viewed in the plan view. However, as shown in FIG. 9, the supply member may have a linear or straight form. In this embodiment, the supply members 13, 14, which are linear as viewed in the plan view as shown in FIG. 9, are provided on the both sides of the projection area AR1 in the scanning direction respectively. Similarly, the recovery member 22 of the liquid recovery mechanism 20 is not limited to have the annular form. As shown in FIG. 9, the recovery member 22 may be rectangular.

Figure 10A:
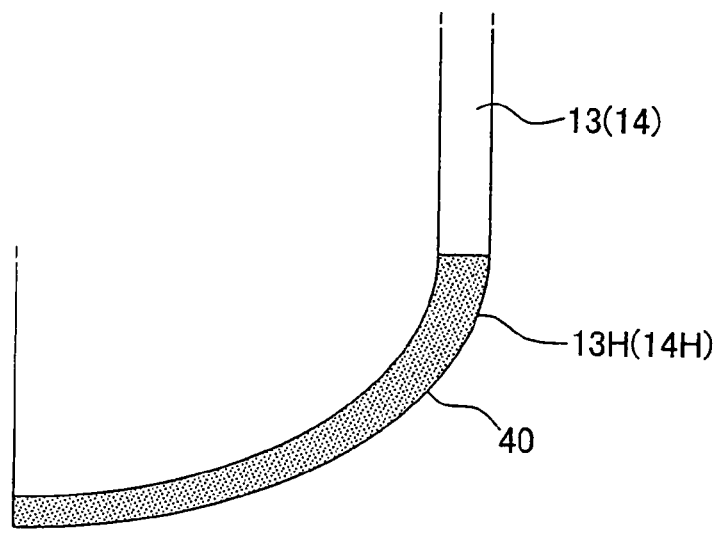
FIGS. 10A and 10B show still another embodiment of a liquid supply mechanism.
Figure 10B:
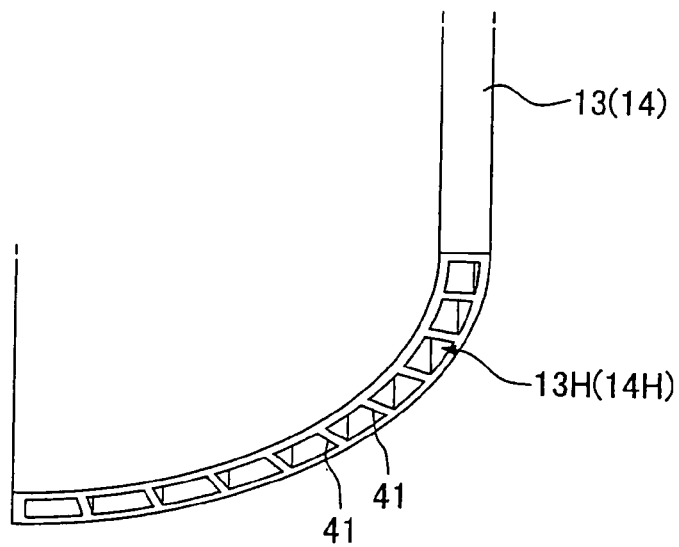

As shown in FIG. 10A, a porous member 40 may be provided for the internal flow passage 13H (14H) of the supply member 13 (14) of the liquid supply mechanism 10. Alternatively, as shown in FIG. 10B, partition members 41 may be provided to form slit-shaped flow passages. By doing so, the liquid 1, which is supplied from the supply member 13 (14) onto the substrate P, can be rectified. It is possible to suppress the occurrence of any inconvenience which would be otherwise caused such that any turbulence appears on the substrate P and the liquid is vibrated.

The respective embodiments described above have been explained such that the trap member 30 (trap surface 31) is elliptical as viewed in the plan view. However, the trap member 30 (trap surface 31) may be perfect circular or rectangular. On the other hand, the liquid 1 tends to outflow on the both sides of the projection area AR1 in the scanning direction. Therefore, when the trap member 30 has the elliptical shape as in the embodiment described above, the liquid 1, which intends to outflow, can be captured satisfactorily. The embodiment described above is constructed such that the trap member 30 (trap surface 31) has the elliptical shape, and the trap member 30 (trap surface 31) is provided at the entire portion outside the liquid recovery positions of the recovery member 22 to surround the recovery member 22. However, it is also allowable that the trap member 30 (trap surface 31) is provided on only the both sides of the projection area AR1 in the scanning direction, and the trap member 30 (trap surface 31) is not provided at any position apart from the projection area AR1 in the non-scanning direction. The liquid 1, which intends to outflow, can be captured satisfactorily by merely providing the trap member 30 on the both sides of the projection area AR1 in the scanning direction, because the liquid 1 tends to outflow on the both sides in the scanning direction. The angle of inclination of the trap surface 31 may be designed so that the angle of inclination differs depending on the position. For example, the angle of inclination of the trap surface 31 may be increased at positions in the vicinity of the both sides of the projection area AR1 in the scanning direction as compared with those at the other positions. It is not necessarily indispensable that the trap surface 31 is the flat surface. It is also allowable to use, for example, a shape obtained by combining a plurality of flat surfaces.

Figure 11:
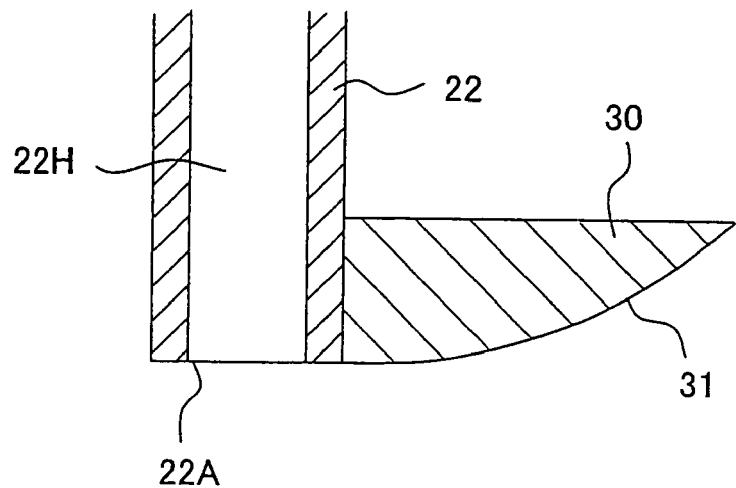
FIG. 11 shows a side sectional view illustrating another embodiment of a trap member.

FIG. 11 shows another embodiment of the trap surface 31 of the trap member 30. As shown in FIG. 11, the trap surface 31 may be a curved surface. Specifically, as shown in FIG. 11, the trap surface 31 may be a quadric curve or a circular arc as viewed in a cross section. In this embodiment, it is preferable that the trap surface 31 is a curved surface which is expanded toward the substrate P. Even in the case of such a shape, it is possible to capture the liquid 1 satisfactorily.

Figure 12:
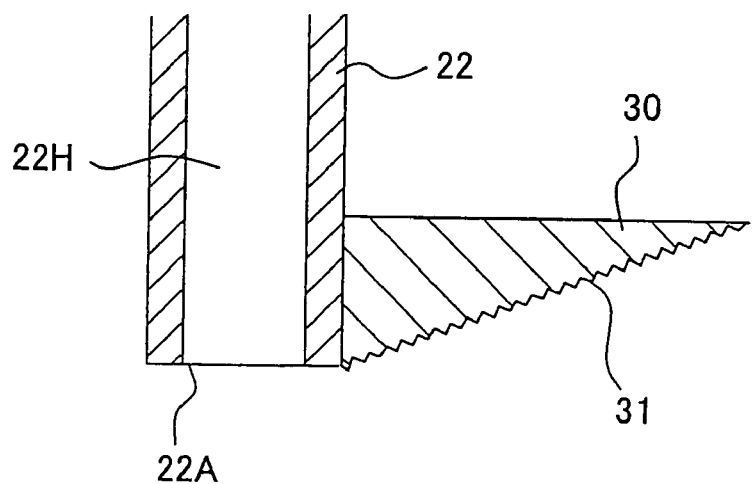
FIG. 12 shows a side sectional view illustrating still another embodiment of a trap member.

Alternatively, as shown in FIG. 12, it is also allowable to apply, to the trap surface 31, a treatment to enlarge the surface area, specifically, a rough surface-forming treatment. When the rough surface-forming treatment is applied, then the surface area of the trap surface 31 is enlarged, and the liquid 1 can be captured more satisfactorily. It is not necessarily indispensable that the rough surface-forming treatment is applied to the entire surface of the trap surface 31. The rough surface-forming treatment may be applied, for example, to only a part of area disposed in the scanning direction.

Figure 13:
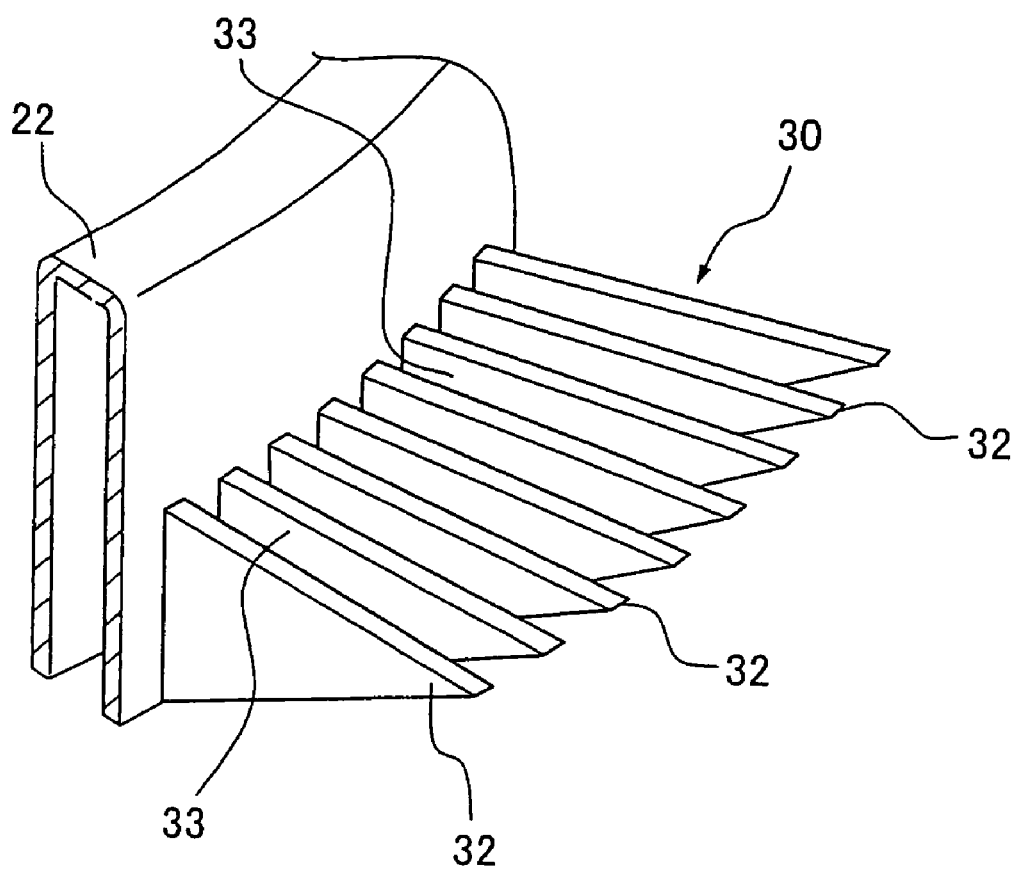
FIG. 13 shows a side sectional view illustrating still another embodiment of a trap member.

As shown in FIG. 13, the trap member 30 may be composed of a plurality of fin members 32. With reference to FIG. 13, the fin member 32 is substantially triangular as viewed in a side view. The side (lower side), which is opposed to the substrate P, is inclined in the upward direction at outer positions with respect to the projection area AR1. The plurality of fin members 32 are attached radially to the outer side surface of the recovery member 22 so that the longitudinal direction thereof is directed outwardly. In this embodiment, the plurality of fin members 32 are separated from each other. Space sections 33 are formed between the respective fin members 32. The liquid 1, which is unsuccessfully recovered by the recovery member 22, is captured by the surface tension by the space sections 33 between the fin members 32. Accordingly, the liquid 1 is prevented from the outflow to the outside of the substrate P.

The plurality of fin members 32 may be provided at equal intervals, or they may be provided at unequal intervals. For example, the intervals between the fin members 32 provided at positions in the scanning direction may be set to be smaller than the intervals between the fin members 32 provided at positions in the non-scanning direction. The plurality of fin members 32 may have an identical length (size in the radial direction) respectively. Alternatively, the fin member 32, which is provided at the position in the scanning direction, may have a length that is longer than the length of the fin member 32 which is provided at the position other than the above. A part of the area for the trap member 30 may be composed of the fin members, and the remaining area may be composed of the trap surface. The fin members 32 may be attached to the trap surface 31 as explained, for example, with reference to FIG. 4. It is preferable that the liquid-attracting treatment is also applied to the surface of the fin member 32 in order to enhance the affinity for the liquid 1.

In the respective embodiments described above, when the liquid-attracting treatment is applied to the trap surface 31 (or the fin members 32), the liquid-attracting property of the trap surface 31 may be allowed to posses a distribution. In other words, the surface treatment can be performed so that the contact angles of the liquid are mutually different values for a plurality of areas on the surface to be subjected to the surface treatment. For example, the liquid-attracting property may be lowered in a part of the area of the trap surface 31 disposed outside the projection area AR1 as compared with the area disposed inside. Further, it is not necessarily indispensable that all of the trap surface 31 is subjected to the liquid-attracting treatment. For example, only a part of the area disposed in the scanning direction may be subjected to the liquid-attracting treatment.

The embodiment described above has been explained such that the liquid-attracting treatment is applied to the trap surface 31. However, the liquid-attracting treatment can be also applied to the surface of the flow passage through which the liquid 1 flows, included in the liquid supply mechanism 10 and/or the liquid recovery mechanism 20. In particular, when the liquid-attracting treatment is applied to the recovery member 22 of the liquid recovery mechanism 20, the liquid can be recovered smoothly. Alternatively, the liquid-attracting treatment can be also applied to the end portion of the projection optical system PL including the barrel PK with which the liquid 1 makes contact. When a thin film is formed on the optical element 2, then the thin film is formed of a material having a transmittance with respect to the exposure light beam EL, and the film thickness thereof is designed to such an extent that the exposure light beam EL can be transmitted therethrough, because the thin film is arranged on the optical path for the exposure light beam EL.

The thin film for the surface treatment may be either a single layer film or a film composed of a plurality of layers. As for the material for forming the thin film, it is possible to use arbitrary materials provided that the material can exhibit the desired performance, including, for example, metals, metal compounds, and organic matters.

The surface treatment may be also applied to the surface of the substrate P in conformity with the affinity for the liquid 1. As described above, it is preferable that the affinity of the trap surface 31 for the liquid is higher than the affinity of the surface of the substrate P for the liquid.

Next, an explanation will be made with reference to FIG. 14 about still another embodiment of a liquid supply mechanism 10 and a liquid recovery mechanism 20 according to the present invention.

Figure 14:
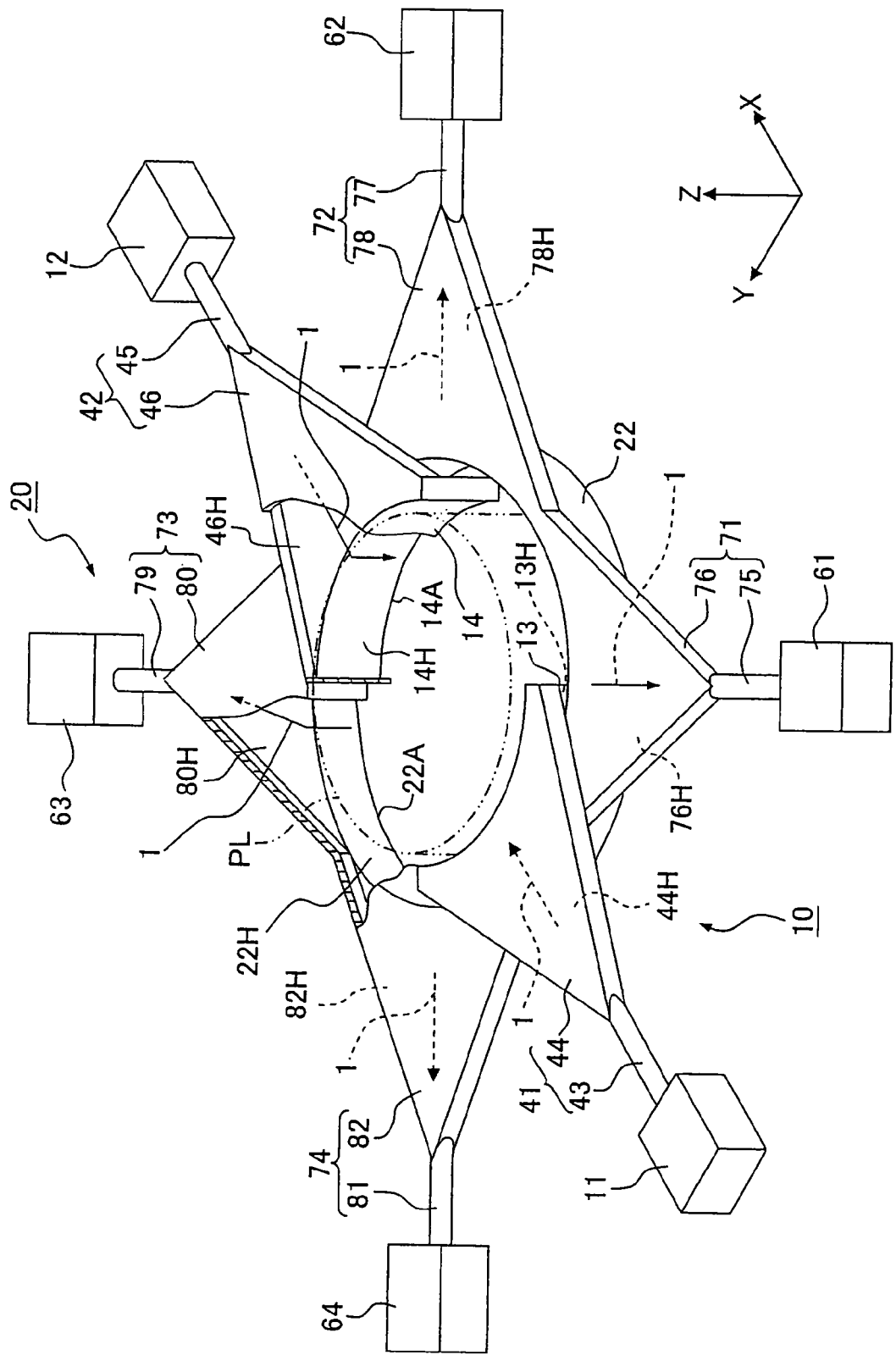
FIG. 14 shows a schematic perspective view illustrating still another embodiment of a liquid supply mechanism and a liquid recovery mechanism according to the present invention.

With reference to FIG. 14, the liquid supply mechanism 10 includes a first liquid supply unit 11, a second liquid supply unit 12, a first supply member 13 which is provided on one side (−X side) in the scanning direction with respect to the projection area AR1, a second supply member 14 which is provided on the other side (+X side), a first supply tube 41 which connects the first liquid supply unit 11 and the first supply member 13 with each other, and a second supply tube 42 which connects the second liquid supply unit 12 and the second supply member 14 with each other. The first and second supply members 13, 14 include internal flow passages 13H, 14H and supply ports 13A, 14A formed at their lower ends respectively, which are formed to be substantially circular arc-shaped as viewed in a plan view, in the same manner as in the embodiment described with reference to FIGS. 2 and 3.

The first supply tube 41, which connects the first liquid supply unit 11 and the first supply member 13, has a straight tube section 43 and a slit tube section 44. One end of the straight tube section 43 is connected to the first liquid supply unit 11, and the other end of the straight tube section 43 is connected to one end of the slit tube section 44. The other end of the slit tube section 44 is connected to the upper end of the internal flow passage 13H of the first supply member 13. One end of the slit tube section 44 is formed to have approximately the same size as that of the straight tube section 43, and the other end thereof is formed to have approximately the same size as that of the upper end of the first supply member 13. The slit tube section 44 is formed to be substantially triangular as viewed in a plan view so that the slit tube section 44 is gradually widened in the horizontal direction from one end to the other end. A slit-shaped internal flow passage 44H, which is formed in the slit tube section 44, is formed so that the internal flow passage 44H is gradually widened in the horizontal direction from one end to the other end.

Similarly, the second supply tube 42, which connects the second liquid supply unit 12 and the second supply member 14, has a straight tube section 45 and a slit tube section 46. One end of the straight tube section 45 is connected to the second liquid supply unit 12, and the other end of the straight tube section 45 is connected to one end of the slit tube section 46. The other end of the slit tube section 46 is connected to the upper end of the internal flow passage 14H of the second supply member 14. One end of the slit tube section 46 is formed to have approximately the same size as that of the straight tube section 45, and the other end thereof is formed to have approximately the same size as that of the upper end of the second supply member 14. The slit tube section 46 is formed to be substantially triangular as viewed in a plan view so that the slit tube section 46 is gradually widened in the horizontal direction from one end to the other end. A slit-shaped internal flow passage 46H, which is formed in the slit tube section 46, is formed so that the internal flow passage 46H is gradually widened in the horizontal direction from one end to the other end.

The liquid recovery mechanism 20 includes a recovery member 22 which is formed to be annular as viewed in a plan view, a plurality of liquid recovery units 61 to 64, and a plurality of recovery tubes 71 to 74 which connect the recovery member 22 and the respective liquid recovery units 61 to 64 to one another. In this embodiment, the liquid recovery units include four of the first to fourth liquid recovery units 61 to 64, and the recovery tubes include four of the first to fourth recovery tubes 71 to 74 corresponding thereto. The recovery member 22 includes an annular internal flow passage 22H, and a recovery port 22A formed at the lower end thereof, in the same manner as in the embodiment explained with reference to FIGS. 2 and 3. No partition member (23) is provided for the internal flow passage 22H of the embodiment shown in FIG. 14. The recovery members 22 of the liquid recovery mechanism 20 are arranged outside the first and second supply members 13, 14 of the liquid supply mechanism 10.

The first recovery tube 71, which connects the first liquid recovery unit 61 included in the plurality of liquid recovery units and the recovery member 22, has a straight tube section 75 and a slit tube section 76. One end of the straight tube section 75 is connected to the first liquid recovery unit 61, and the other end of the straight tube section 75 is connected to one end of the slit tube section 76. The other end of the slit tube section 76 is connected to the upper end of the internal flow passage 22H of the recovery member 22. In this embodiment, one end of the slit tube section 76 is formed to have approximately the same size as that of the straight tube section 75, while the other end of the slit tube section 76 is formed to have a size which is approximately ¼ of the upper end of the annular recovery member 22. The slit tube section 76 is formed to be substantially triangular as viewed in a plan view so that the slit tube section 76 is gradually widened in the horizontal direction from one end to the other end. A slit-shaped internal flow passage 76H, which is formed in the slit tube section 76, is formed so that the internal flow passage 76H is gradually widened in the horizontal direction from one end to the other end.

Similarly, the second recovery tube 72, which connects the second liquid recovery unit 62 and the recovery member 22, has a straight tube section 77 and a slit tube section 78. One end of the slit tube section 78 is formed to have approximately the same size as that of the straight tube section 77, while the other end of the slit tube section 78 is formed to have a size which is approximately ¼ of the upper end of the annular recovery member 22. The slit tube section 78 is formed to be substantially triangular as viewed in a plan view. A slit-shaped internal flow passage 78H, which is formed in the slit tube section 78, is formed so that the internal flow passage 78H is gradually widened in the horizontal direction from one end to the other end. Further, the third recovery tube 73, which connects the third liquid recovery unit 63 and the recovery member 22, has a straight tube section 79 and a slit tube section 80. The fourth recovery tube 74, which connects the fourth liquid recovery unit 64 and the recovery member 22, has a straight tube section 81 and a slit tube section 82. Each of the other ends of the slit tube sections 80, 82 is formed to have a size which is approximately ¼ of the upper end of the annular recovery member 22. Each of the slit tube sections 80, 82 is formed to be substantially triangular as viewed in a plan view. Slit-shaped internal flow passages 80H, 82H, which are formed in the slit tube sections 80, 82 respectively, are formed so that each of the internal flow passages 80H, 82H is gradually widened in the horizontal direction from one end to the other end.

The members for allowing the liquid to flow therethrough, specifically the supply tubes 41, 42 and the recovery tubes 71 to 74, which are included in the members for constructing the liquid supply mechanism 10 and the liquid recovery mechanism 20, may be made of synthetic resin such as polytetrafluoroethylene as described above. Alternatively, for example, they may be made of metal such as stainless steel and aluminum. In this embodiment, the members, through which the fluid flows, are made of metal. In particular, when the members for constructing the flow passages for the liquid, which are included in the liquid supply mechanism 10 and the liquid recovery mechanism 20, are made of aluminum, it is possible to allow the liquid to flow smoothly, because aluminum has the small contact angle with respect to the liquid (water). Although not shown in FIG. 14, the trap member 30 is provided around the recovery member of the liquid recovery mechanism 20 in the same manner as in the embodiment described above.

Next, an explanation will be made about the operation of the liquid supply mechanism 10 and the liquid recovery mechanism 20. In order to form the liquid immersion area (AR2), the control unit CONT drives the first and second liquid supply units 11, 12 of the liquid supply mechanism 10 respectively. The liquid 1, which is fed from the first and second liquid supply units 11, 12 respectively, flows through the first and second supply tubes 41, 42 respectively, and the liquid 1 is supplied onto the substrate P via the first and second supply members 13, 14. In this embodiment, the liquid 1, which is fed from the first liquid supply unit 11, flows through the straight tube section 43 of the first supply tube 41, and then the liquid 1 flows through the slit tube section 44. Accordingly, the liquid 1 is spread in the horizontal direction (lateral direction). The liquid 1 is spread at the other end of the slit tube section 44 to a size approximately equal to the size of the internal flow passage 13H (supply port 13A) of the first supply member 13 in the Y axis direction. After that, the liquid 1 is supplied onto the substrate P via the internal flow passage 13H of the first supply member 13. Accordingly, the liquid 1 is supplied onto the substrate P at approximately uniform liquid supply amounts at the respective positions of the substantially circular arc-shaped supply port 13A in which the longitudinal direction extends in the Y axis direction. Similarly, the liquid 1, which is fed from the second liquid supply unit 12, also flows through the straight tube section 45 of the second supply tube 42, and then the liquid 1 is spread in the horizontal direction (lateral direction) via the slit tube section 46. After that, the liquid 1 is supplied to the second supply member 14. Therefore, the liquid 1 is supplied onto the substrate P at approximately uniform liquid supply amounts at the respective positions of the supply port 14A.

That is, in the embodiment described with reference to FIGS. 2 and 3, the entire supply tube 11A is constructed by the straight tube. Therefore, when the liquid is directly supplied from the supply tube 11A as the straight tube to the first supply member 13 in which the longitudinal direction extends in the Y axis direction, the difference in the flow passage area causes the difference between the liquid supply amount at the central portion in the longitudinal direction of the supply port 13A of the first supply member 13, i.e., at the position disposed just under the supply tube 11A and the liquid supply amount at the end of the supply port 13A in the longitudinal direction, i.e., at the position separated from the supply tube 11A. As a result, the liquid supply amount is sometimes nonuniform at the respective positions of the supply port 13A. Specifically, the liquid supply amount at the central portion of the supply port 13A in the longitudinal direction (position disposed just under the supply tube 11A) is larger than the liquid supply amount at the end of the supply port 13A in the longitudinal direction (position separated from the supply tube 11A). It is impossible to supply the liquid uniformly, and there is such a possibility that the liquid immersion area AR2 may be nonuniform. However, when the liquid 1 is supplied from the first liquid supply unit 11 to the first liquid supply member 13 (supply port 13A) in which the longitudinal direction extends in the Y axis direction, the size of the flow passage of at least a part of the supply tube 41 is set depending on the size of the first supply member 13. As in this embodiment, a part of the supply tube 41 is provided as the slit tube section 44 having the tapered internal flow passage 44H which is gradually widened in the horizontal direction toward the first supply member 13. Accordingly, the liquid 1 can be supplied onto the substrate P at the approximately uniform liquid supply amounts at the respective positions of the supply port 13A of the first supply member 13 in which the longitudinal direction extends in the Y axis direction. Similarly, the liquid 1, which is fed from the second liquid supply unit 12, is also supplied onto the substrate P uniformly through the second supply tube 42 and the second supply member 14.

The control unit CONT drives the first to fourth liquid recovery units 61 to 64 of the liquid recovery mechanism 20 respectively to recover the liquid 1 from the surface of the substrate P by the aid of the recovery member 22 and the first to fourth recovery tubes 71 to 74 respectively. The first to fourth liquid recovery units 61 to 64 recover the liquid 1 by sucking the liquid 1 from the surface of the substrate P through the first to fourth recovery tubes 71 to 74 respectively. The liquid 1 is recovered from the substrate P at approximately uniform recovery amounts (recovery forces) at the respective positions of the recovery port 22A of the annular recovery member 22.

That is, when the recovery tube as the straight tube is directly connected to the recovery member 22 in the same manner as described above, then the difference in the flow passage area causes the difference in the liquid recovery amount (recovery force) at each of the positions of the recovery port 22A, and the liquid recovery amount may be nonuniform at each of the positions of the recovery port 22A in some cases. For example, the liquid recovery amount at the position disposed just under the recovery tube is larger than the liquid recovery amount at the positions other than the above. There is such a possibility that the liquid cannot be recovered uniformly and the liquid immersion area AR2 may be nonuniform. However, when parts of the recovery tubes are the slit tube sections 76, 78, 80, 82 each of which has the tapered internal flow passage that is gradually widened in the horizontal direction toward the recovery member 22 as in this embodiment, the liquid can be recovered from the substrate P at the approximately uniform liquid recovery amounts at the respective positions of the recovery port 22A of the annular recovery member 22.

As described above, the liquid can be supplied uniformly at the respective positions of the supply ports 13A, 14A respectively, and the liquid can be recovered uniformly at the respective positions of the recovery port 22A. Therefore, it is possible to form the uniform liquid immersion area AR2.

Figure 15:
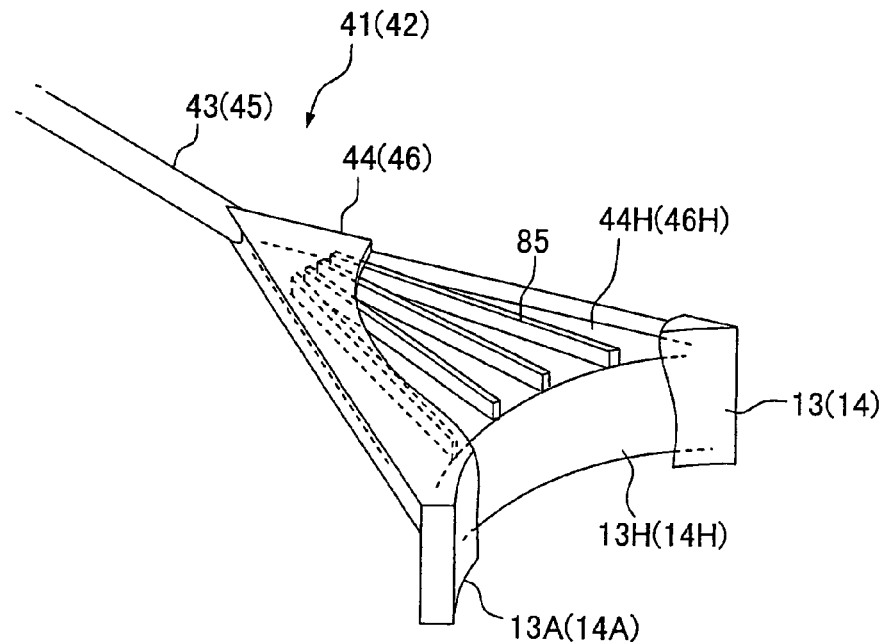
FIG. 15 shows another embodiment of a slit tube section as illustrated in FIG. 14.

In the embodiment described with reference to FIG. 14, the internal flow passage 44H (46H) of the slit tube section 44 (46) is hollow. However, as shown in FIG. 15, a plurality of fin members 85 may be provided in the flow direction of the liquid 1 (from one end to the other end of the slit tube section) for the internal flow passage 44H (46H) of the slit tube section 44 (46) which constitutes a part of the supply tube 41 (42) of the liquid supply mechanism 10. Accordingly, the liquid 1 can be supplied onto the substrate P by the aid of the supply member 13 (14) after rectifying the liquid 1. The fin members 85 may be elongated to extend over the internal flow passage 13H (14H) of the supply member 13 (14). Such fin members 85 may be provided for the internal flow passages 76H, 78H, 80H, 82H of the slit tube sections 76, 78, 80, 82 which construct the recovery tubes of the liquid recovery mechanism 20 respectively.

For example, when the substrate P is subjected to the scanning movement at a high velocity, the following situation may be conceived. That is, the liquid 1 cannot be recovered sufficiently from the substrate P even in the case of the embodiment shown in FIG. 14, and the liquid 1 on the substrate P may outflow to the outside of the recovery member 22. In such a situation, the lower surfaces of the slit tube sections 44, 46 each having the substantially triangular shape as viewed in a plan view provided at the positions in the scanning direction (X axis direction) of the substrate P can be used as trap surfaces in place of the trap member 30.

This embodiment is constructed such that the plurality of recovery tubes 71 to 74 are connected to one recovery member 22. However, a plurality of recovery members (recovery ports) may be provided closely to the substrate P so that the plurality of recovery members (recovery ports) correspond to the plurality of recovery tubes 71 to 74.

Next, an explanation will be made about still another embodiment of a liquid supply mechanism 10 and a liquid recovery mechanism 20 according to the present invention with reference to FIGS. 16 to 19.

Figure 16:
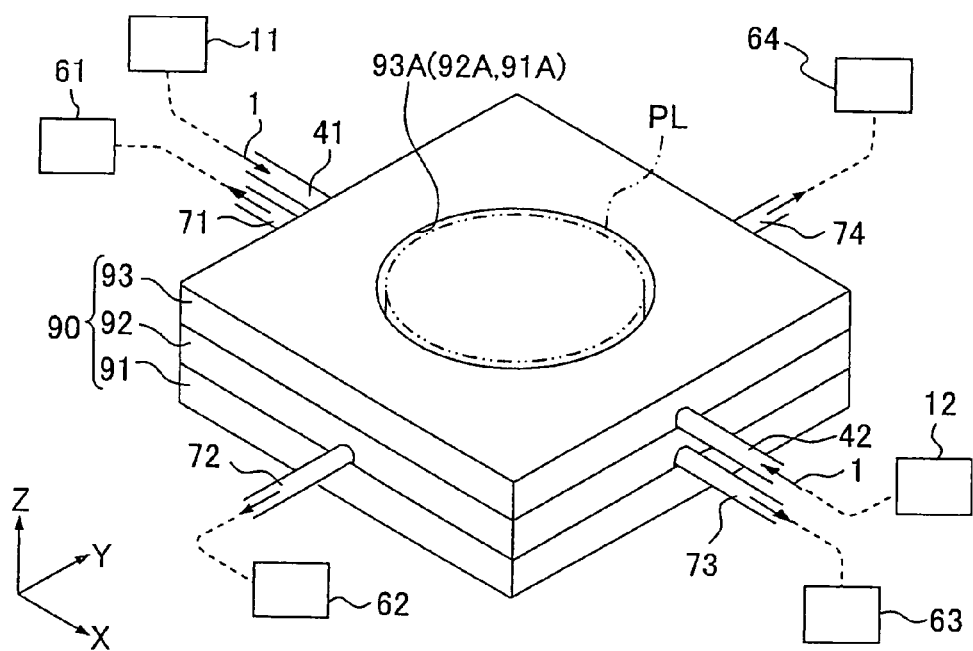
FIG. 16 shows a schematic perspective view illustrating still another embodiment of a liquid supply mechanism and a liquid recovery mechanism according to the present invention.

FIG. 16 shows a schematic perspective view illustrating the liquid supply mechanism (10) and the liquid recovery mechanism (20) according to this embodiment. With reference to FIG. 16, the liquid supply mechanism (10) includes first and second liquid supply units 11, 12, and first and second supply tubes 41, 42 which are connected to the first and second liquid supply units 11, 12 respectively. The liquid recovery mechanism (20) includes first to fourth liquid recovery units 61 to 64, and first to fourth recovery tubes 71 to 74 which are connected to the first to fourth liquid recovery units 61 to 64 respectively. One end of each of the first and second recovery tubes 41, 42 is connected to each of the first and second liquid supply units 11, 12. The other end is connected to each of supply passages formed by a flow passage-forming member 90 as described later on. One end of each of the first to fourth recovery tubes 71 to 74 is connected to each of the first to fourth liquid recovery units 61 to 64. The other end is connected to each of recovery passages formed by the flow passage-forming member 90 as described later on.

The flow passage-forming member 90 includes a first member 90, a second member 92 which is arranged on the first member 91, and a third member 93 which is arranged on the second member 92. The flow passage-forming member 90 is arranged to surround the projection optical system PL. The first to third members 91 to 93, which constitute the flow passage-forming member 90, are rectangular plate members having an identical outer size respectively, and they have holes 91A to 93A disposed at central portions thereof so that the projection optical system PL may be arranged therein. The holes 91A to 93A are formed so that they are communicated with each other. The first and second supply tubes 41, 42 are connected to the third member 93 disposed at the uppermost stage of the first to third members. The first to fourth recovery tubes 71 to 74 are connected to the second member 92 disposed at the middle stage.

Figure 17:
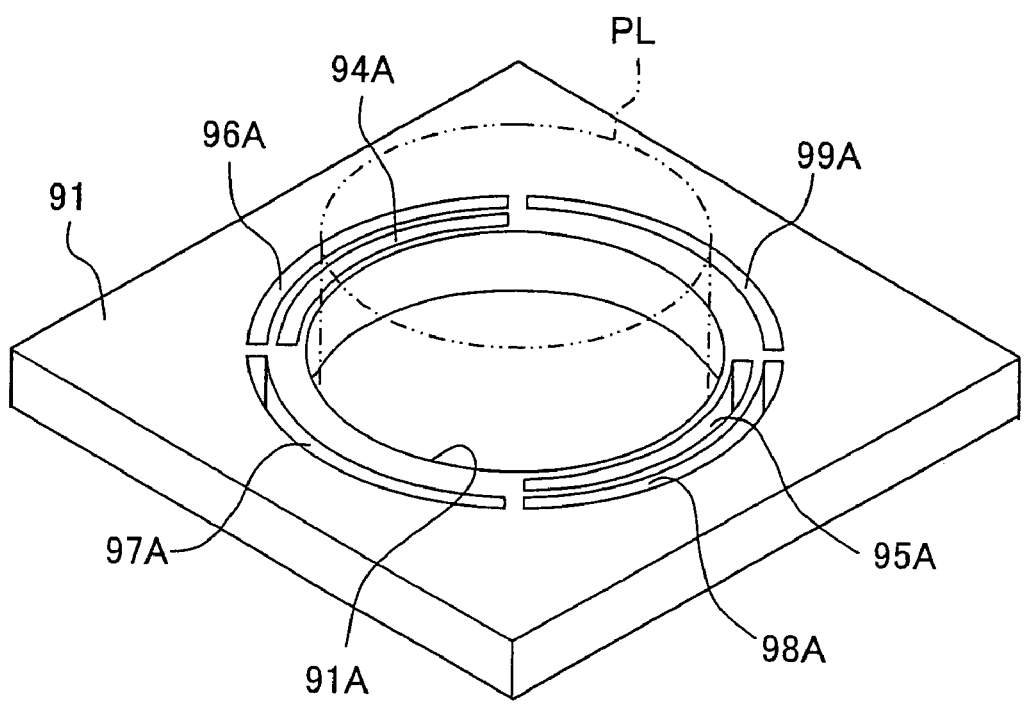
FIG. 17 shows a perspective view illustrating a first member of a flow passage-forming member.

FIG. 17 shows a perspective view illustrating the first member 91 which is arranged at the lowermost stage of the first to third members. The first member 91 includes a first supply hole 94A which is formed on the −X side of the projection optical system PL and which forms a supply port for supplying the liquid 1 to the substrate P, and a second supply hole 95A which is formed on the +X side of the projection optical system PL and which forms a supply port for supplying the liquid to the substrate P. Each of the first supply hole 94A and the second supply hole 95A is formed to be substantially circular arc-shaped as viewed in a plan view. The first member 91 further includes a first recovery hole 96A which is formed on the −X side of the projection optical system PL and which forms a recovery port for recovering the liquid on the substrate P, a second recovery hole 97A which is formed on the −Y side of the projection optical system PL and which forms a recovery port for recovering the liquid on the substrate P, a third recovery hole 98A which is formed on the +X side of the projection optical system PL and which forms a recovery port for recovering the liquid on the substrate P, and a fourth recovery hole 99A which is formed on the +Y side of the projection optical system PL and which forms a recovery port for recovering the liquid on the substrate P. Each of the first to fourth recovery holes 96A to 99A is formed to be substantially circular arc-shaped as viewed in a plan view. The first to fourth recovery holes 96A to 99A are provided at substantially equal intervals along the circumference of the projection optical system PL. The recovery holes 96A to 99A are provided on the outer side with respect to the projection optical system PL as compared with the supply holes 94A, 95B respectively.

Figure 18A:
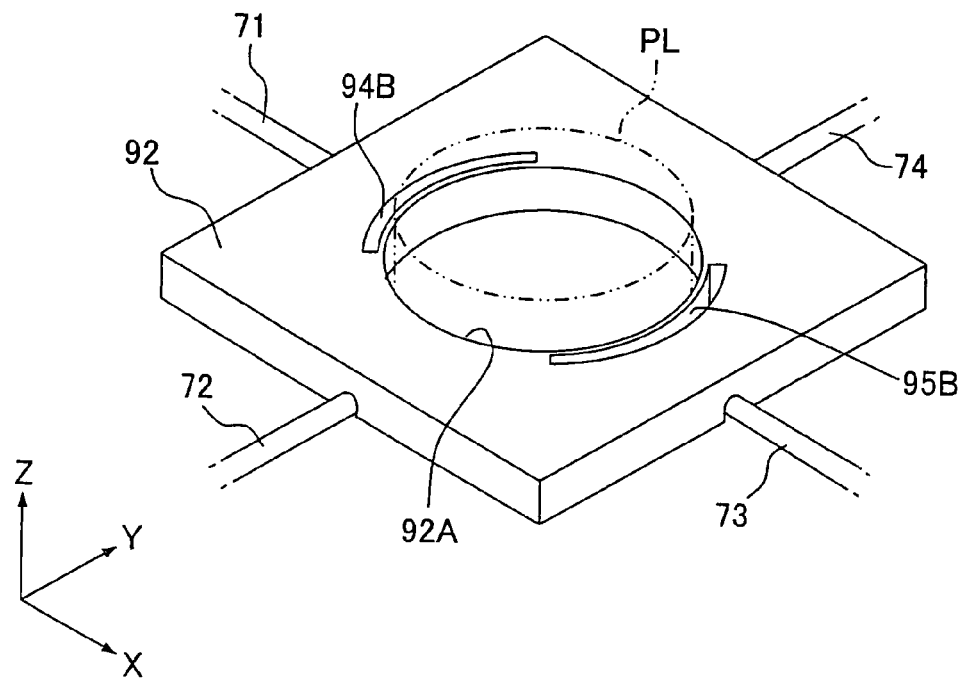
FIGS. 18A and 18B show perspective views illustrating a second member of the flow passage-forming member.
Figure 18B:
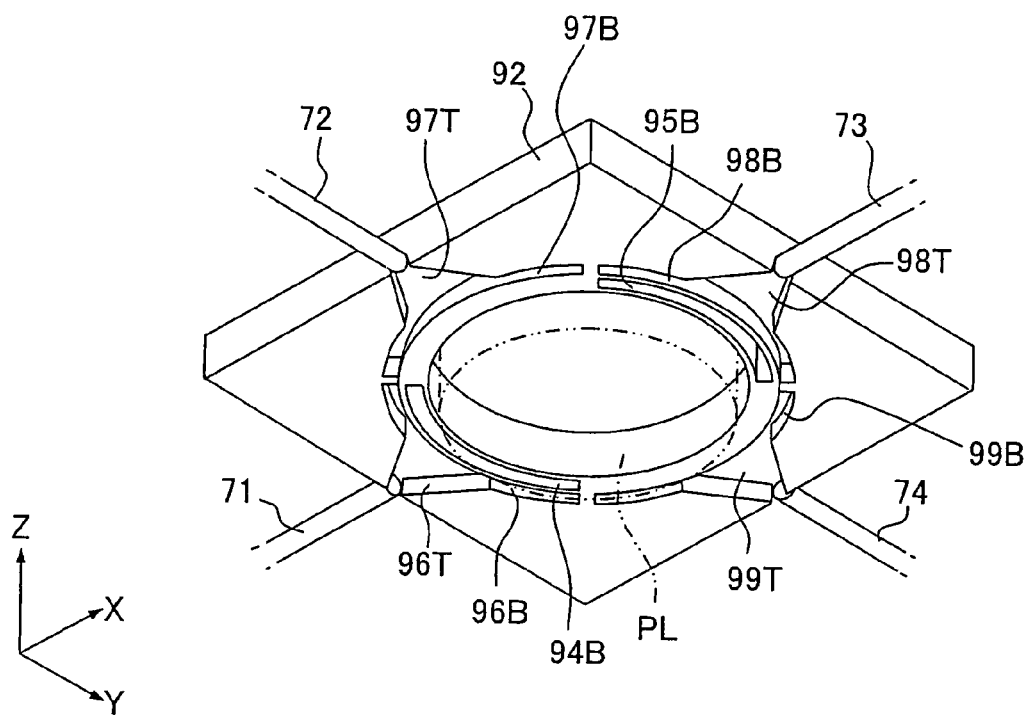

FIG. 18 shows perspective views illustrating the second member 92 arranged at the middle stage of the first to third members. FIG. 18A shows a perspective view as viewed from an upper position, and FIG. 18B shows a perspective view as viewed upwardly from a lower position. The second member 92 includes a third supply hole 94B which is formed on the −X side of the projection optical system PL and which is to be connected to the first supply hole 94A of the first member 91, and a fourth supply hole 95B which is formed on the +X side of the projection optical system PL and which is to be connected to the second supply hole 95A of the first member 91. The respective shapes and the sizes of the third and fourth supply holes 94B, 95B correspond to those of the first and second supply holes 94A, 95A.

The second member 92 further includes, on the lower surface, a first recovery groove 96B which is formed on the −X side of the projection optical system PL and which is to be connected to the first recovery hole 96A of the first member 91, a second recovery groove 97B which is formed on the −Y side of the projection optical system PL and which is to be connected to the second recovery hole 97A of the first member 91, a third recovery groove 98B which is formed on the +X side of the projection optical system PL and which is to be connected to the third recovery hole 98A of the first member 91, and a fourth recovery groove 99B which is formed on the +Y side of the projection optical system PL and which is to be connected to the fourth recovery hole 99A of the first member 91. The first to fourth recovery grooves 96B to 99B are formed to be substantially circular arc-shaped as viewed in a plan view respectively so as to correspond to the shapes and the sizes of the first to fourth recovery holes 96A to 99A. The first to fourth recovery grooves 96B to 99B are provided at substantially equal intervals along the circumference of the projection optical system PL. The first recovery tube 71 is connected to the first recovery groove 96B via a tapered groove 96T. The tapered groove 96T is formed so that the tapered groove 96T is gradually widened in the horizontal direction from the connecting portion with respect to the first recovery tube 71 toward the first recovery groove 96B. Similarly, the second recovery tube 72 is connected to the second recovery groove 97B via a tapered groove 97T, the third recovery tube 73 is connected to the third recovery groove 98B via a tapered groove 98T, and the fourth recovery tube 74 is connected to the fourth recovery groove 99B via a tapered groove 99T.

Figure 19A:
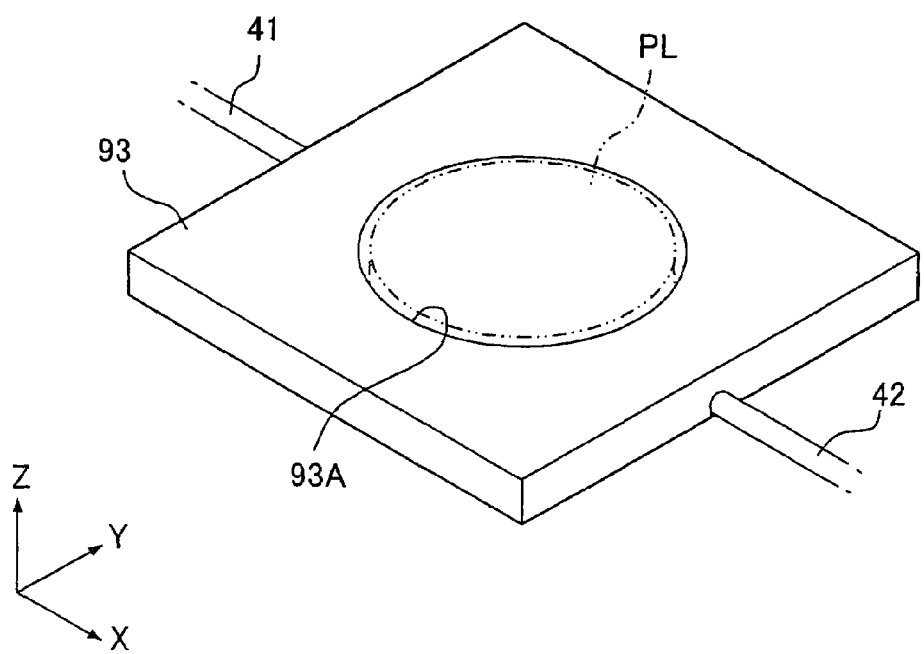
FIGS. 19A and 19B show perspective views illustrating a third member of the flow passage-forming member.
Figure 19B:
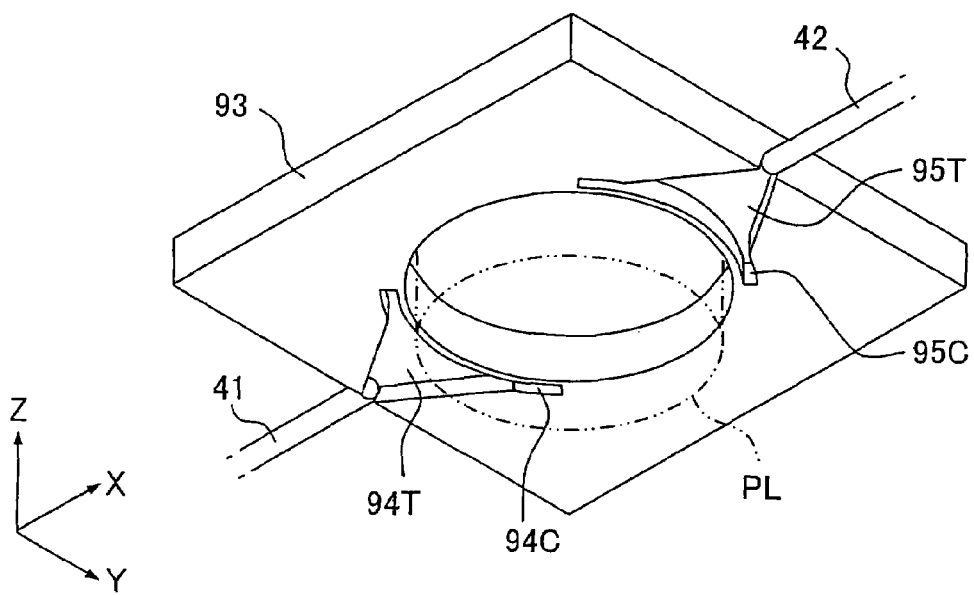

FIG. 19 shows perspective views illustrating the third member 93 arranged at the uppermost stage of the first to third members. FIG. 19A shows a perspective view as viewed from an upper position, and FIG. 19B shows a perspective view as viewed upwardly from a lower position. The third member 93 includes, on the lower surface, a first supply groove 94C which is formed on the −X side of the projection optical system PL and which is to be connected to the third supply hole 94B of the second member 92, and a second supply groove 95C which is formed on the +X side of the projection optical system PL and which is to be connected to the fourth supply hole 95B of the second member 92. The shapes and the sizes of the first and second supply grooves 94C, 95 are formed to be substantially circular arc-shaped as viewed in a plan view respectively so as to correspond to those of the third and fourth supply holes 94B, 95B (as well as those of the first and second supply holes 94A, 95A). The first supply tube 41 is connected to the first supply groove 94C via a tapered groove 94T. The tapered groove 94T is formed so that the tapered groove 94T is gradually widened in the horizontal direction from the connecting portion with respect to the first supply tube 41 toward the first supply groove 94C. Similarly, the second supply tube 42 is connected to the second supply groove 95C via a tapered groove 95T.

The first to third members 91 to 93 are formed of metal including, for example, stainless steel, titanium, aluminum, and alloy containing the above. The holes and the grooves of the respective members 91 to 93 are formed, for example, by the electric discharge machining. The flow passage-forming member 90 is formed by joining the respective members 91 to 93 by using, for example, an adhesive or a thermocompression bonding method after processing the respective members 91 to 93 by the electric discharge machining. The tapered groove 94T, the first supply groove 94C, the third supply hole 94B, and the first supply hole 94A are connected to one another (communicated with each other) by stacking and joining the respective members 91 to 93. Thus, the supply flow passage, which is connected to (communicated with) the first supply tube 41, is formed. Similarly, the tapered groove 95T, the second supply groove 95C, the fourth supply hole 95B, and the second supply hole 95A are connected to one another (communicated with each other), and thus the supply flow passage, which is connected to (communicated with) the second supply tube 42, is formed. The liquid 1, which is fed from the first and second liquid supply units 11, 12 respectively, is supplied onto the substrate P through the first and second supply tubes 41, 42 and the supply passages described above. That is, the liquid supply flow passages are formed by stacking the plate members 91 to 93.

The recovery flow passage, which is connected to (communicated with) the first recovery tube 71, is formed by connecting (communicating) the tapered groove 96T, the first recovery groove 96B, and the first recovery hole 96A respectively. Similarly, the recovery flow passage, which is connected to (communicated with) the second recovery tube 72, is formed by connecting (communicating) the tapered groove 97T, the second recovery groove 97B, and the second recovery hole 97A respectively. The recovery flow passage, which is connected to (communicated with) the third recovery tube 73, is formed by connecting (communicating) the tapered groove 98T, the third recovery groove 98B, and the third recovery hole 98A respectively. The recovery flow passage, which is connected to (communicated with) the fourth recovery tube 74, is formed by connecting (communicating) the tapered groove 99T, the fourth recovery groove 99B, and the fourth recovery hole 99A respectively. That is, the liquid recovery flow passages are formed by stacking the plate members 91 to 93. The liquid on the substrate P is recovered through the recovery flow passages and the first to third recovery tubes 71 to 74 respectively.

In this arrangement, the tapered grooves 94T, 95T are connected to the first and second supply tubes 41, 42 respectively. Therefore, the liquid can be supplied uniformly at respective positions of the supply ports in which the longitudinal direction extends in the Y axis direction, in the same manner as in the embodiment described with reference to FIG. 14. Similarly, the tapered grooves are connected to the recovery tubes 71 to 74 respectively. Therefore, the liquid can be recovered with the uniform recovery force.

Owing to the construction that the flow passage-forming member 90 is formed by the first to third members 91 to 93 as the plate members respectively, for example, the flow passage-forming member 90 can be used to absorb the vibration generated when the liquid is sucked while being mixed with the air upon the recovery of the liquid. Further, the machining such as the electric discharge machining is applied to each of the plurality of plate members 91 to 93 to form parts of the flow passages, and the flow passages for the liquid are formed by combining them. Therefore, the supply flow passages and the recovery flow passages can be formed with ease respectively.

Surfaces, which are inclined with respect to the XY plane, may be provided around the first to fourth recovery holes 96A to 99A disposed on the lower surface of the first member 91 arranged at the lowermost stage of the plurality of members 91 to 93 for forming the flow passage-forming member 90, and the surfaces may be subjected to the liquid-attracting treatment. Accordingly, the surfaces may be used as trap surfaces to capture the liquid unsuccessfully recovered by the liquid recovery mechanism. The members 91 to 93 for forming the flow passage-forming member 90 are the rectangular or square plate members. However, it is also allowable to use circular plate members, and it is also allowable to use elliptical plate members which are long in the X direction.

Both of the supply flow passages and the recovery flow passages are formed in the flow passage-forming member 90 described above. However, only any one of the flow passages may be provided in the flow passage-forming member 90. Alternatively, flow passage-forming members, each of which is formed by stacking a plurality of members, may be divided into a flow passage-forming member for the supply flow passages and a flow passage-forming member for the recovery flow passages, and they may be provided separately.

Next, still another embodiment of the present invention will be explained. As described above, it is preferable to support each of the liquid supply mechanism 10 including the supply members 13, 14 and the liquid recovery mechanism 20 including the recovery member 22 by using a support member other than the projection optical system PL and any support member for supporting the projection optical system PL. An explanation will be made below about a support structure for supporting each of the liquid supply mechanism 10 and the liquid recovery mechanism 20 with reference to FIG. 20.

Figure 20:
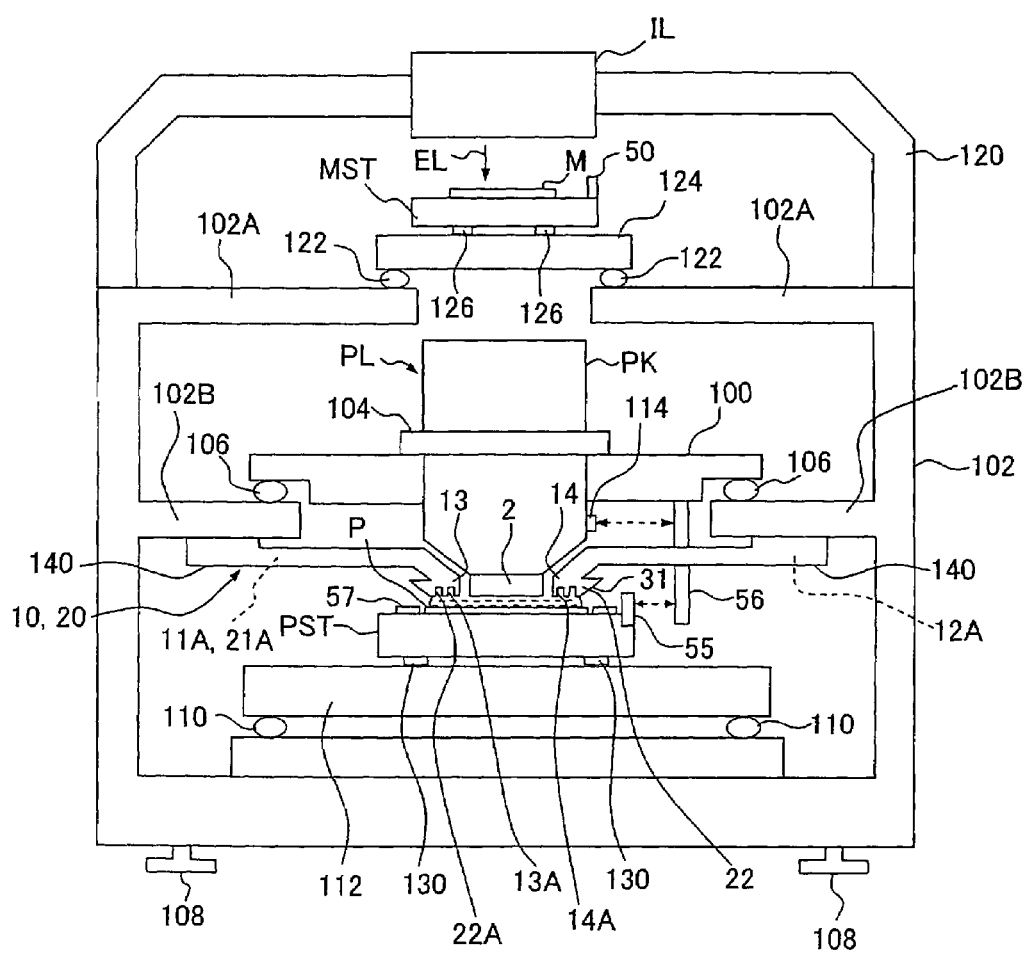
FIG. 20 shows a schematic arrangement illustrating another embodiment of an exposure apparatus according to the present invention.

FIG. 20 schematically shows the support structure for the liquid supply mechanism 10 and the liquid recovery mechanism 20. With reference to FIG. 20, the exposure apparatus EX includes a barrel base plate (first support member) 100 which supports the projection optical system PL, and a main frame (second support member) 102 which supports the barrel base plate 100, the mask stage MST, and the substrate stage PST. In FIG. 20, the Z stage and the XY stage are shown as an integrated unit. The main frame 102 is installed substantially horizontally by the aid of legs 108 on the floor surface in a clean room or the like. The main frame 102 is formed with an upper stage 102A and a lower stage 102B which protrude inwardly.

The illumination optical system IL is supported by a support frame 120 which is fixed to the upper portion of the main frame 102. A mask base plate 124 is supported on the upper stage 102A of the main frame 102 by the aid of an anti-vibration apparatus 122. Openings are formed through central portions of the mask stage MST and the mask base plate 124 for allowing the pattern image of the mask M to pass therethrough. A plurality of air bearings 126, which are non-contact bearings, are provided on the lower surface of the mask stage MST. The mask stage MST is supported in a non-contact manner by the air bearings 126 with respect to the upper surface (guide surface) of the mask base plate 124. The mask stage MST is movable two-dimensionally in the XY plane and finely rotatable in the θz direction by the aid of the mask stage-driving unit.

A flange 104 is provided on the outer circumference of the barrel PK for holding the projection optical system PL. The projection optical system PL is supported by the barrel base plate 100 by the aid of the flange 104. An anti-vibration apparatus 106 including an air mount or the like is arranged between the barrel base plate 100 and the lower stage 102B of the main frame 102. The barrel base plate 100, which supports the projection optical system PL, is supported by the lower stage 102B of the main frame 102 by the aid of the anti-vibration apparatus 106. The barrel base plate 100 is isolated from the main frame 102 in terms of the vibration (in relation to the vibration) by the anti-vibration apparatus 106 so that the vibration of the main frame 102 is not transmitted to the barrel base plate 100 which supports the projection optical system PL.

A plurality of air bearings 130, which are non-contact bearings, are provided on the lower surface of the substrate stage PST. A stage base 112 is supported on the main frame 102 by the aid of an anti-vibration apparatus 110 including an air mount or the like. The substrate stage PST is supported in a non-contact manner by the air bearing 130 with respect to the upper surface (guide surface) of the stage base 112. The substrate stage PST is movable two-dimensionally in the XY plane and finely rotatable in the θZ direction by the aid of the substrate stage-driving unit. Further, the substrate stage PST is also movable in the Z axis direction, the θX direction, and the θY direction. The stage base 112 is isolated from the main frame 102 in terms of the vibration by the anti-vibration apparatus 110 so that the vibration of the main frame 102 is not transmitted to the stage base 112 which supports the substrate stage PST in the non-contact manner.

A movement mirror 55 is provided at a predetermined position on the +X side on the substrate stage PST, and a reference mirror (fixed mirror) 114 is provided at a predetermined position on the +X side on the barrel PK. A laser interferometer 56 is provided at a position opposed to the movement mirror 55 and the reference mirror 114. The laser interferometer 56 is attached to the barrel base plate 100. Therefore, the laser interferometer 56 is isolated from the liquid supply mechanism 10 and the liquid recovery mechanism 20 in terms of the vibration. The laser interferometer 56 radiates the length-measuring beam (measuring light beam) onto the movement mirror 55, and it radiates the reference beam (reference light beam) onto the reference mirror 114. Reflected light beams, which come from the movement mirror 55 and the reference mirror 114 respectively on the basis of the radiated length-measuring beam and the reference beam, are received by a light-receiving unit of the laser interferometer 56. The laser interferometer 56 causes the interference with the light beams to measure the amount of change of the optical path length of the length-measuring beam on the basis of the optical path length of the reference beam, and consequently the position information about the movement mirror 55 on the basis of the reference mirror 114, i.e., the position information about the substrate stage PST. Similarly, although not shown, a movement mirror and a reference mirror are also provided on the +Y side on the substrate stage PST and the barrel PK, and a laser interferometer is provided at a position opposed thereto.

Those supported by the barrel base plate 100 also include unillustrated measuring systems such as the autofocus detecting system for measuring the focus position (Z position) and the inclination of the substrate P and the alignment system for detecting the alignment mark on the substrate P. The measuring systems as described above are also isolated from the main frame 102, the liquid supply mechanism 10, and the liquid recovery mechanism 20 in terms of the vibration.

The liquid supply mechanism 10 and the liquid recovery mechanism 20 are supported by the lower stage 102B of the main frame 102. This embodiment is constructed such that the first and second supply members 13, 14 and the supply tubes 11A, 12A for constructing the liquid supply mechanism 10, the recovery member 22 and the recovery tube 21A for constructing the liquid recovery mechanism 20 and other components are supported by the support member 140, and the support member 140 is connected to the lower stage 102B of the main frame 102. FIG. 20 is illustrated while simplifying, for example, the supply members 13, 14, the recovery member 22, the supply tubes 11A, 12A, and the recovery tube 21A.

As described above, the liquid supply mechanism 10 and the liquid recovery mechanism 20 are supported by the main frame 102 which is isolated in terms of the vibration from the barrel base plate 100 which supports the projection optical system PL. Accordingly, the liquid supply mechanism 10 and the liquid recovery mechanism 20 are isolated from the projection optical system PL in terms of the vibration. Therefore, the vibration, which is generated when the liquid is supplied and/or when the liquid is recovered, is not transmitted via the barrel base plate 100 to the projection optical system PL, the laser interferometer 56, and the measuring systems such as the autofocus detecting system and the alignment system. Therefore, it is possible to avoid the occurrence of any inconvenience which would be otherwise caused such that the pattern image is deteriorated by the vibration of the projection optical system. Further, it is possible to accurately perform the position control of the substrate stage (substrate P). Therefore, it is possible to accurately project the pattern image onto the substrate. The liquid supply mechanism 10 and the liquid recovery mechanism 20 are supported by the main frame 102 which is isolated in terms of the vibration from the stage base 112 which supports the substrate stage PST. Accordingly, the liquid supply mechanism 10 and the liquid recovery mechanism 20 are isolated from the stage base 112 in terms of the vibration. Therefore, the vibration, which is generated when the liquid is supplied and/or when the liquid is recovered, is not transmitted to the stage base 112 as well. It is possible to avoid the occurrence of any inconvenience which would be otherwise caused such that the positioning accuracy and/or the movement accuracy of the substrate stage PST is lowered.

In this embodiment, the liquid supply mechanism 10 and the liquid recovery mechanism 20 are integrally supported by the main frame 102. However, the liquid supply mechanism 10 and the liquid recovery mechanism 20 may be separately attached to the main frame 102. Further, a support member, which is distinct from the main frame 102, may be arranged on the floor in the clean room or the like, and the liquid supply mechanism and the liquid recovery mechanism may be supported by the support member.

As described above, pure water is used as the liquid 1 in the embodiments of the present invention. Pure water is advantageous in that pure water is available in a large amount with ease, for example, in the semiconductor production factory, and pure water exerts no harmful influence, for example, on the optical element (lens) and the photoresist on the substrate P. Further, pure water exerts no harmful influence on the environment, and the content of impurity is extremely low. Therefore, it is also expected to obtain the function to wash the surface of the substrate P and the surface of the optical element provided at the end surface of the projection optical system PL. It is approved that the refractive index n of pure water (water) with respect to the exposure light beam EL having a wavelength of about 193 nm is approximately in an extent of 1.44. When the ArF excimer laser beam (wavelength: 193 nm) is used as the light source of the exposure light beam EL, then the wavelength is shortened on the substrate P by 1/n, i.e., to about 134 nm, and a high resolution is obtained. Further, the depth of focus is magnified about n times, i.e., about 1.44 times as compared with the value obtained in the air. Therefore, when it is enough to secure an approximately equivalent depth of focus as compared with the case of the use in the air, it is possible to further increase the numerical aperture of the projection optical system PL. Also in this viewpoint, the resolution is improved.

When the liquid immersion method as described above is used, the numerical aperture NA of the projection optical system is 0.9 to 1.3 in some cases. When the numerical aperture NA of the projection optical system is increased as described above, the image formation performance is sometimes deteriorated by the polarization effect with the random polarized light beam having been hitherto used as the exposure light beam. Therefore, it is desirable to use the polarized illumination. In this case, the following procedure is preferred. That is, the linear polarized illumination is effected, which is adjusted to the longitudinal direction of the line pattern of the line-and-space pattern of the mask (reticle) so that a large amount of diffracted light of the S-polarized component (component in the polarization direction along the longitudinal direction of the line pattern) is allowed to outgo from the pattern of the mask (reticle). When the space between the projection optical system PL and the resist coated on the surface of the substrate P is filled with the liquid, the diffracted light of the S-polarized component, which contributes to the improvement in the contrast, has the transmittance through the resist-surface that is raised to be high as compared with a case in which the space between the projection optical system PL and the resist coated on the surface of the substrate P is filled with the air (gas). Therefore, even when the numerical aperture NA of the projection optical system exceeds 1.0, it is possible to obtain the high image formation performance. It is more effective to make appropriate combination, for example, with the phase shift mask and/or the oblique incidence illumination method (especially the dipole illumination method) adjusted to the longitudinal direction of the line pattern. The oblique incidence illumination adjusted to the longitudinal direction of the line pattern is disclosed, for example, in Japanese Patent Application Laid-open No. 6-188169, content of which is incorporated herein by reference within a range of permission of the domestic laws and ordinances of the state designated or selected in this international application.

In this embodiment, the lens is attached as the optical element 2 to the end of the projection optical system PL. The lens can be used to adjust the optical characteristics of the projection optical system PL, for example, the aberration (for example, spherical aberration and comatic aberration). The optical element 2 may be an optical plate to adjust the optical characteristic. On the other hand, the optical element 2, which makes contact with the liquid 1, may be a plane parallel plate which is cheaper than the lens. When the optical element 2 is the plane parallel plate, it is enough that the plane parallel plate is merely exchanged immediately before supplying the liquid 1 even when any substance (for example, any silicon-based organic matter), which deteriorates the transmittance of the projection optical system PL, the illuminance of the exposure light beam EL on the substrate P, and the uniformity of the illuminance distribution, is adhered to the plane parallel plate, for example, during the transport, the assembling, and/or the adjustment of the exposure apparatus EX. An advantage is obtained such that the exchange cost is lowered as compared with the case in which the optical element to make contact with the liquid 1 is the lens. That is, the surface of the optical element to make contact with the liquid 1 is dirtied, for example, due to the adhesion of scattered particles generated from the resist by being irradiated with the exposure light beam EL or any impurity contained in the liquid 1. Therefore, it is necessary to periodically exchange the optical element. However, when the optical element is the cheap plane parallel plate, then the cost of the exchange part is low as compared with the lens, and it is possible to shorten the time required for the exchange. Thus, it is possible to suppress the increase in the maintenance cost (running cost) and the decrease in the throughput.

When the pressure, which is generated by the flow of the liquid 1, is large between the substrate P and the optical element disposed at the end of the projection optical system PL, it is also allowable that the optical element is tightly fixed so that the optical element is not moved by the pressure, rather than allowing the optical element to be exchangeable.

The liquid 1 is water in this embodiment. However, the liquid 1 may be any liquid other than water. For example, when the light source of the exposure light beam EL is the $F_2$ laser, the $F_2$ laser beam is not transmitted through water. Therefore, in this case, liquids preferably usable as the liquid 1 may include, for example, a fluorine-based fluid such as fluorine-based oil and perfluoropolyether (PFPE) through which the $F_2$ laser beam is transmissive. In this case, the portion to make contact with the liquid 1 represented by the trap surface 31 is subjected to the liquid-attracting treatment by forming the thin film, for example, with a substance having a molecular structure of small polarity including fluorine. Alternatively, other than the above, it is also possible to use, as the liquid 1, liquids (for example, cedar oil) which have the transmittance with respect to the exposure light beam EL, which have the refractive index as high as possible, and which are stable against the photoresist coated on the surface of the substrate P and the projection optical system PL. Also in this case, the surface treatment is performed depending on the polarity of the liquid 1 to be used.

The projection optical system PL described above is constructed (designed) such that the image formation performance is optimized in the liquid immersion state in which the space on the side of the image plane is filled with the liquid 1 (pure water). However, the projection optical system PL may be constructed (designed) such that the desired image formation performance is obtained even in the non-liquid immersion state in which the liquid is absent on the side of the image plane and in the liquid immersion state in which the space on the side of the image plane is filled with another liquid, by exchanging a part of the optical element (optical element disposed closely to the substrate P) of the projection optical system PL. When the projection optical system PL is constructed as described above, then the exposure apparatus EX can be used in the liquid immersion state, for example, when the large depth of focus DOF is required, and the exposure apparatus EX can be used in the non-liquid immersion state by exchanging a part of the optical element when the high throughput is required. In such cases, it is desirable that a spatial image sensor or a wavefront aberration-measuring sensor is arranged on the substrate stage PST in order to measure the image formation performance after the exchange of the part of the optical element. Alternatively, a wavefront aberration-measuring mask may be used. A part of the optical element may be moved, and/or the wavelength of the exposure light beam EL may be finely adjusted in order to obtain the desired image formation performance in each state on the basis of the result of the measurement of the image formation performance. Details of the spatial image sensor are disclosed, for example, in Japanese Patent Application Laid-open No. 2002-14005 (corresponding to United State Patent Publication No. 2002 0041377), contents of which are incorporated herein by reference within a range of permission of the domestic laws and ordinances of the state designated or selected in this international application. Details of the wavefront aberration-measuring sensor are disclosed, for example, in International Publication No. 02/63664, content of which is incorporated herein by reference within a range of permission of the domestic laws and ordinances of the state designated or selected in this international application.

It is desirable that a part of the optical element is exchanged while allowing the exposure apparatus EX to carry the projection optical system PL. However, the exchange may be performed in a state in which the projection optical system PL is detached from the exposure apparatus EX.

The substrate P, which is usable in the respective embodiments described above, is not limited to the semiconductor wafer for producing the semiconductor device. The applicable substrates include, for example, the glass substrate for the display device, the ceramic wafer for the thin film magnetic head, and the master plate (synthetic quartz, silicon wafer) for the mask or the reticle to be used for the exposure apparatus.

As for the exposure apparatus EX, the present invention is also applicable to the scanning type exposure apparatus (scanning stepper) based on the step-and-scan system for performing the scanning exposure for the pattern of the mask M by synchronously moving the mask M and the substrate P as well as the projection exposure apparatus (stepper) based on the step-and-repeat system for performing the full field exposure for the pattern of the mask M in a state in which the mask M and the substrate P are allowed to stand still, while successively step-moving the substrate P. The present invention is also applicable to the exposure apparatus based on the step-and-stitch system in which at least two patterns are partially overlaid and transferred on the substrate P.

The present invention is also applicable to a twin-stage type exposure apparatus. The structure and the exposure operation of the twin-stage type exposure apparatus are disclosed, for example, in Japanese Patent Application Laid-open Nos. 10-163099 and 10-214783 (corresponding to U.S. Pat. Nos. 6,341,007, 6,400,441, 6,549,269, and 6,590,634), Published Japanese Translation of PCT International Publication for Patent Application No. 2000-505958 (corresponding to U.S. Pat. No. 5,969,441), and U.S. Pat. No. 6,208,407, contents of which are incorporated herein by reference within a range of permission of the domestic laws and ordinances of the state designated or selected in this international application.

As for the type of the exposure apparatus EX, the present invention is not limited to the exposure apparatus for the semiconductor device production apparatus for exposing the substrate P with the semiconductor device pattern. The present invention is also widely applicable, for example, to the exposure apparatus for producing the liquid crystal display device or for producing the display as well as the exposure apparatus for producing, for example, the thin film magnetic head, the image pickup device (CCD), the reticle, or the mask.

When the linear motor is used for the substrate stage PST and/or the mask stage MST, it is allowable to use any one of those of the air floating type based on the use of the air bearing and those of the magnetic floating type based on the use of the Lorentz's force or the reactance force. Each of the stages PST, MST may be either of the type in which the movement is effected along the guide or of the guideless type in which no guide is provide. An example of the use of the linear motor for the stage is disclosed in U.S. Pat. Nos. 5,623,853 and 5,528,118, contents of which are incorporated herein by reference respectively within a range of permission of the domestic laws and ordinances of the state designated or selected in this international application.

As for the driving mechanism for each of the stages PST, MST, it is also allowable to use a plane motor in which a magnet unit provided with two-dimensionally arranged magnets and an armature unit provided with two-dimensionally arranged coils are opposed to one another, and each of the stages PST, MST is driven by the electromagnetic force. In this arrangement, any one of the magnet unit and the armature unit is connected to the stage PST, MST, and the other of the magnet unit and the armature unit is provided on the side of the movable surface of the stage PST, MST.

The reaction force, which is generated in accordance with the movement of the substrate stage PST, may be mechanically released to the floor (ground) by using a frame member so that the reaction force is not transmitted to the projection optical system PL. The method for handling the reaction force is disclosed in detail, for example, in U.S. Pat. No. 5,528,118 (Japanese Patent Application Laid-open No. 8-166475), contents of which are incorporated herein by reference within a range of permission of the domestic laws and ordinances of the state designated or selected in this international application.

The reaction force, which is generated in accordance with the movement of the mask stage MST, may be mechanically released to the floor (ground) by using a frame member so that the reaction force is not transmitted to the projection optical system PL. The method for handling the reaction force is disclosed in detail, for example, in U.S. Pat. No. 5,874,820 (Japanese Patent Application Laid-open No. 8-330224), contents of which are incorporated herein by reference within a range of permission of the domestic laws and ordinances of the state designated or selected in this international application.

As described above, the exposure apparatus EX according to the embodiment of the present invention is produced by assembling the various subsystems including the respective constitutive elements as defined in claims so that the predetermined mechanical accuracy, the electric accuracy, and the optical accuracy are maintained. In order to secure the various accuracies, adjustments performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which, for example, the temperature and the cleanness are managed.

Figure 21:
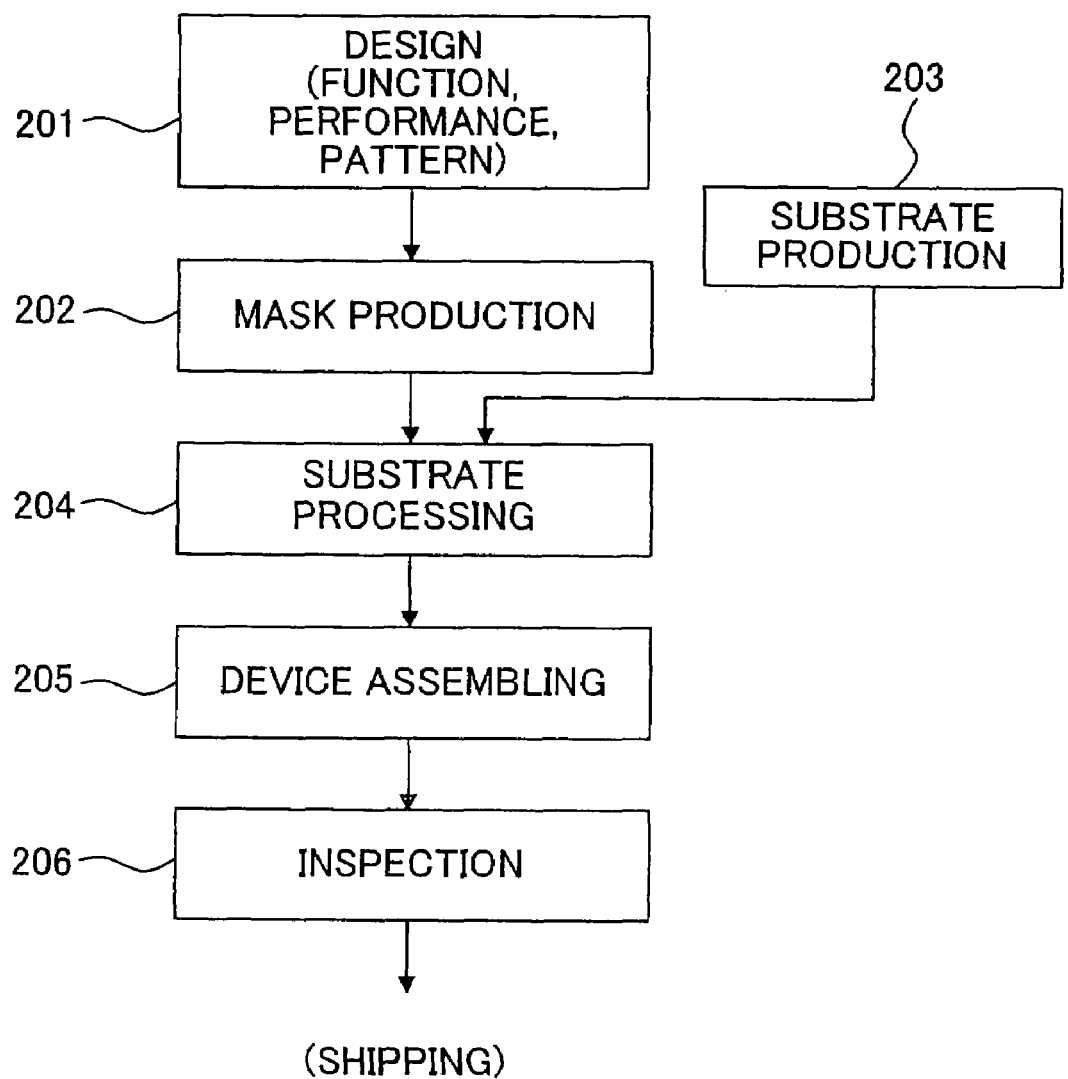
FIG. 21 shows a flow chart illustrating exemplary steps of producing a semiconductor device.

As shown in FIG. 21, the microdevice such as the semiconductor device is produced by performing, for example, a step 201 of designing the function and the performance of the microdevice, a step 202 of manufacturing a mask (reticle) based on the designing step, a step 203 of producing a substrate as a base material for the device, an exposure process step 204 of exposing the substrate with a pattern of the mask by using the exposure apparatus EX of the embodiment described above, a step 205 of assembling the device (including a dicing step, a bonding step, and a packaging step), and an inspection step 206.

According to the present invention, when the exposure process is performed in the state in which the liquid immersion area is formed between the projection optical system and the substrate, then it is possible to stably form the liquid immersion area, it is possible to satisfactorily recover the liquid, and it is possible to avoid, for example, the outflow of the liquid to the surroundings. Accordingly, the exposure process can be performed accurately. Therefore, the exposure apparatus of the present invention is extremely useful for the high resolution exposure based on the use of the short wavelength light source such as the ArF excimer laser.

What is claimed is:

1. An exposure apparatus which exposes a substrate by projecting an image of a predetermined pattern through a liquid onto the substrate, the exposure apparatus comprising:
   a projection optical system which projects the image of the pattern onto the substrate;
   a liquid supply system which supplies the liquid onto the substrate to form a liquid immersion area on a part of the substrate including a projection area of the projection optical system; and
   a liquid recovery system which recovers the liquid on the substrate simultaneously at a plurality of positions, wherein:
   the liquid recovery system simultaneously recovers the liquid from a first position of the plurality of positions and from a second position of the plurality of positions, with a first non-zero recovery force at the first position and with a second non-zero recovery force, which is different from the first non-zero recovery force, at the second position.

2. The exposure apparatus according to claim 1, wherein shot areas on the substrate are respectively exposed while being moved in a predetermined scanning direction, and the liquid recovery system is operated such that a liquid recovery force, which is exerted at a predetermined position apart from the projection area in the scanning direction, is larger than a liquid recovery force which is exerted at a position different from the predetermined position.

3. The exposure apparatus according to claim 1, further comprising a trap member which is arranged outside the positions for recovering the liquid by the liquid recovery system with respect to the projection area and which is formed with a liquid trap surface having a predetermined length to capture a liquid unsuccessfully recovered by the liquid recovery system.

4. The exposure apparatus according to claim 3, wherein a treatment is applied to the trap surface to enhance an affinity for the liquid.

5. The exposure apparatus according to claim 4, wherein the affinity of the trap surface for the liquid is higher than an affinity of a substrate surface for the liquid.

6. The exposure apparatus according to claim 3, wherein the trap surface is inclined with respect to a horizontal plane.

7. The exposure apparatus according to claim 3, wherein the trap surface is arranged to surround the projection area, and the trap surface has different lengths depending on positions in the trap surface.

8. The exposure apparatus according to claim 3, wherein the liquid, which is captured by the trap surface, is recovered by the liquid recovery system.

9. The exposure apparatus according to claim 1, wherein the liquid supply system supplies the liquid between the projection area and the position for recovering the liquid by the liquid recovery system.

10. The exposure apparatus according to claim 9, wherein the liquid supply system changes a supply amount of the liquid depending on an operation to be executed.

11. The exposure apparatus according to claim 10, wherein shot areas on the substrate are respectively subjected to scanning exposure while moving the substrate, and the liquid supply system is operated such that the supply amount of the liquid is different between a period in which stepping movement is performed between two of the shot areas on the substrate and a period in which each of the shot areas is exposed.

12. The exposure apparatus according to claim 1, wherein the liquid supply system supplies the liquid with which an affinity for a liquid contact surface disposed at an end of the projection optical system is higher than an affinity for a surface of the substrate.

13. The exposure apparatus according to claim 12, wherein the liquid is water, a water-attracting treatment is applied to the liquid contact surface disposed at the end of the projection optical system, and the surface of the substrate is coated with a water-repellent photosensitive material.

14. A method for producing a device, comprising:
transferring an image of a pattern onto a substrate with the exposure apparatus as defined in claim 1; and
processing the exposed substrate.

15. An exposure apparatus which exposes a substrate by projecting an image of a predetermined pattern through a liquid onto the substrate, the exposure apparatus comprising:
a projection optical system which projects the image of the pattern onto the substrate;
a liquid supply system which supplies the liquid onto the substrate to form a liquid immersion area on a part of the substrate including a projection area of the projection optical system; and
a liquid recovery system which recovers the liquid on the substrate simultaneously at a plurality of positions via a plurality of recovery ports, wherein:
the liquid recovery system simultaneously recovers the liquid from a first recovery port of the plurality of recovery ports and from a second recovery port of the plurality of recovery ports, with a first non-zero recovery force at the first recovery port and with a second non-zero recovery force, which is different from the first non-zero recovery force, at the second recovery port.

16. The exposure apparatus according to claim 15, wherein shot areas on the substrate are respectively exposed while being moved in a predetermined scanning direction, and the liquid recovery system is operated such that a liquid recovery force, which is exerted at a predetermined recovery port apart from the projection area in the scanning direction, is larger than a liquid recovery force which is exerted at a recovery port different from the predetermined position.

17. The exposure apparatus according to claim 15, further comprising a trap member which is arranged outside the positions for recovering the liquid by the liquid recovery system with respect to the projection area and which is formed with a liquid trap surface having a predetermined length to capture a liquid unsuccessfully recovered by the liquid recovery system.

18. The exposure apparatus according to claim 17, wherein a treatment is applied to the trap surface to enhance an affinity for the liquid.

19. The exposure apparatus according to claim 18, wherein the affinity of the trap surface for the liquid is higher than an affinity of a substrate surface for the liquid.

20. The exposure apparatus according to claim 17, wherein the trap surface is inclined with respect to a horizontal plane.

21. The exposure apparatus according to claim 17, wherein the trap surface is arranged to surround the projection area, and the trap surface has different lengths depending on positions in the trap surface.

22. The exposure apparatus according to claim 17, wherein the liquid, which is captured by the trap surface, is recovered by the liquid recovery system.

23. The exposure apparatus according to claim 15, wherein the liquid supply system supplies the liquid between the projection area and the position for recovering the liquid by the liquid recovery system.

24. The exposure apparatus according to claim 23, wherein the liquid supply system changes a supply amount of the liquid depending on an operation to be executed.

25. The exposure apparatus according to claim 24, wherein shot areas on the substrate are respectively subjected to scanning exposure while moving the substrate, and the liquid supply system is operated such that the supply amount of the liquid is different between a period in which stepping movement is performed between two of the shot areas on the substrate and a period in which each of the shot areas is exposed.

26. The exposure apparatus according to claim 15, wherein the liquid supply system supplies the liquid with which an affinity for a liquid contact surface disposed at an end of the projection optical system is higher than an affinity for a surface of the substrate.

27. The exposure apparatus according to claim 26, wherein the liquid is water, a water-attracting treatment is applied to the liquid contact surface disposed at the end of the projection optical system, and the surface of the substrate is coated with a water-repellent photosensitive material.

28. A method for producing a device, comprising:
transferring an image of a pattern onto a substrate with the exposure apparatus as defined in claim 15; and
processing the exposed substrate.

29. An exposure method in which a substrate is exposed by projecting an image of a predetermined pattern through a liquid onto the substrate, the method comprising:
projecting the image of the pattern through a projection optical system and the liquid onto the substrate, the liquid being supplied onto the substrate to form a liquid immersion area on a part of the substrate including a projection area of the projection optical system; and
recovering the liquid on the substrate simultaneously at a plurality of positions, wherein:
the liquid is simultaneously recovered from a first position of the plurality of positions and from a second position of the plurality of positions, with a first non-zero recovery force at the first position and with a second non-zero recovery force, which is different from the first non-zero recovery force, at the second position.

30. The method according to claim 29, wherein shot areas on the substrate are respectively exposed while being moved in a predetermined scanning direction, and a liquid recovery force, which is exerted at a predetermined position apart from the projection area in the scanning direction, is larger than a liquid recovery force which is exerted at a position different from the predetermined position.

31. The method according to claim 29, further comprising capturing a liquid unsuccessfully recovered with a trap member which is arranged outside the positions for recovering the liquid with respect to the projection area and which is formed with a liquid trap surface having a predetermined length.

32. The method according to claim 31, wherein a treatment is applied to the trap surface to enhance an affinity for the liquid.

33. The method according to claim 32, wherein the affinity of the trap surface for the liquid is higher than an affinity of a substrate surface for the liquid.

34. The method according to claim 31, wherein the trap surface is inclined with respect to a horizontal plane.

35. The method according to claim 31, wherein the trap surface is arranged to surround the projection area, and the trap surface has different lengths depending on positions in the trap surface.

36. The method according to claim 31, further comprising recovering the liquid, which is captured by the trap surface.

37. The method according to claim 29, wherein the liquid is supplied between the projection area and the position for recovering the liquid.

38. The method according to claim 37, further comprising changing a supply amount of the liquid depending on an operation to be executed.

39. The method according to claim 38, wherein shot areas on the substrate are respectively subjected to scanning exposure while moving the substrate, and the supply amount of the liquid is different between a period in which stepping movement is performed between two of the shot areas on the substrate and a period in which each of the shot areas is exposed.

40. The method according to claim 29, wherein an affinity of the liquid for a liquid contact surface disposed at an end of the projection optical system is higher than an affinity of the liquid for a surface of the substrate.

41. The method according to claim 40, wherein the liquid is water, a water-attracting treatment is applied to the liquid contact surface disposed at the end of the projection optical system, and the surface of the substrate is coated with a water-repellent photosensitive material.

42. A method for producing a device, comprising:
    transferring an image of a pattern onto a substrate with the exposure method as defined in claim 29; and
    processing the exposed substrate.

43. An exposure method in which a substrate is exposed by projecting an image of a predetermined pattern through a liquid onto the substrate, the method comprising:
    projecting the image of the pattern through a projection optical system and the liquid onto the substrate, the liquid being supplied onto the substrate to form a liquid immersion area on a part of the substrate including a projection area of the projection optical system; and
    recovering the liquid on the substrate simultaneously at a plurality of positions via a plurality of recovery ports, wherein:
    the liquid is simultaneously recovered from a first recovery port of the plurality of recovery ports and from a second recovery port of the plurality of recovery ports, with a first non-zero recovery force at the first recovery port and with a second non-zero recovery force, which is different from the first non-zero recovery force, at the second recovery port.

44. The method according to claim 43, wherein shot areas on the substrate are respectively exposed while being moved in a predetermined scanning direction, and a liquid recovery force, which is exerted at a predetermined recovery port apart from the projection area in the scanning direction, is larger than a liquid recovery force which is exerted at a recovery port different from the predetermined position.

45. The method according to claim 43, further comprising capturing a liquid unsuccessfully recovered by the recovery ports with a trap member which is arranged outside the recovery ports for recovering the liquid with respect to the projection area and which is formed with a liquid trap surface having a predetermined length.

46. The method according to claim 45, wherein a treatment is applied to the trap surface to enhance an affinity for the liquid.

47. The method according to claim 46, wherein the affinity of the trap surface for the liquid is higher than an affinity of a substrate surface for the liquid.

48. The method according to claim 45, wherein the trap surface is inclined with respect to a horizontal plane.

49. The method according to claim 45, wherein the trap surface is arranged to surround the projection area, and the trap surface has different lengths depending on positions in the trap surface.

50. The method according to claim 45, further comprising recovering the liquid, which is captured by the trap surface.

51. The method according to claim 43, wherein the liquid is supplied between the projection area and the recovery ports.

52. The method according to claim 51, further comprising changing a supply amount of the liquid depending on an operation to be executed.

53. The method according to claim 52, wherein shot areas on the substrate are respectively subjected to scanning exposure while moving the substrate, and the supply amount of the liquid is different between a period in which stepping movement is performed between two of the shot areas on the substrate and a period in which each of the shot areas is exposed.

54. The method according to claim 43, wherein an affinity of the liquid for a liquid contact surface disposed at an end of the projection optical system is higher than an affinity of the liquid for a surface of the substrate.

55. The method according to claim 54, wherein the liquid is water, a water-attracting treatment is applied to the liquid contact surface disposed at the end of the projection optical system, and the surface of the substrate is coated with a water-repellent photosensitive material.

56. A method for producing a device, comprising:
    transferring an image of a pattern onto a substrate with the exposure method as defined in claim 43; and
    processing the exposed substrate.

57. The exposure apparatus according to claim 1, wherein the liquid supply system includes a member having an inlet opening from which the liquid is supplied to form the liquid immersion area, the member of the liquid supply system being vibrationally isolated from the projection optical system.

58. The exposure apparatus according to claim 1, wherein the liquid recovery system includes a member having an outlet opening from which the liquid on the substrate is recovered, the member of the liquid recovery system being vibrationally isolated from the projection optical system.

59. The exposure apparatus according to claim 1, wherein the liquid supply system has a supply flow passage through which the liquid is supplied and the liquid recovery system has a recovery flow passage through which the supplied liquid is recovered, and wherein at least one of the supply flow passage and the recovery flow passage is formed in a stacked member in which a plurality of members are stacked.

* * * * *